United States Patent
Scheuerlein

(10) Patent No.: US 9,646,688 B2
(45) Date of Patent: May 9, 2017

(54) THREE DIMENSIONAL NON-VOLATILE STORAGE WITH CONNECTED WORD LINES

(71) Applicant: SanDisk 3D LLC, Milpitas, CA (US)

(72) Inventor: Roy E. Scheuerlein, Cupertino, CA (US)

(73) Assignee: SanDiskTechnologies LLC, Plano, TX (US)

( * ) Notice: Subject to any disclaimer, the term of this patent is extended or adjusted under 35 U.S.C. 154(b) by 0 days.

(21) Appl. No.: 14/746,003

(22) Filed: Jun. 22, 2015

(65) Prior Publication Data

US 2015/0325292 A1    Nov. 12, 2015

Related U.S. Application Data

(62) Division of application No. 13/323,695, filed on Dec. 12, 2011, now Pat. No. 9,065,044.

(Continued)

(51) Int. Cl.
*G11C 13/00* (2006.01)
*H01L 27/115* (2017.01)
(Continued)

(52) U.S. Cl.
CPC .......... *G11C 13/0033* (2013.01); *G11C 5/025* (2013.01); *G11C 8/08* (2013.01); *G11C 13/0002* (2013.01); *G11C 13/0026* (2013.01); *G11C 13/0028* (2013.01); *G11C 13/0069* (2013.01); *H01L 27/0688* (2013.01); *H01L 27/115* (2013.01); *H01L 27/249* (2013.01); *H01L 27/2454* (2013.01); *H01L 27/2463* (2013.01); *H01L 27/2481* (2013.01);
(Continued)

(58) Field of Classification Search
CPC ............ G11C 13/0002; G11C 13/0026; G11C 13/0028; G11C 5/025; G11C 8/08
See application file for complete search history.

(56) References Cited

U.S. PATENT DOCUMENTS

| 4,068,217 A | 1/1978 | Arnett et al. |
| 4,370,661 A | 1/1983 | Berkowitz |

(Continued)

FOREIGN PATENT DOCUMENTS

| WO | 2010/117912 | 10/2010 |
| WO | 2012/082770 | 6/2012 |
| WO | 2012/082775 | 6/2012 |

OTHER PUBLICATIONS

PCT Declaration of Non-Establishment of International Search Report dated Mar. 13, 2012, PCT Application No. PCT/US2011/064493.

(Continued)

*Primary Examiner* — Khamdan Alrobaie
(74) *Attorney, Agent, or Firm* — Vierra Magen Marcus LLP

(57) ABSTRACT

A three-dimensional array adapted for memory elements that reversibly change a level of electrical conductance in response to a voltage difference being applied across them. Memory elements are formed across a plurality of planes positioned different distances above a semiconductor substrate. Bit lines to which the memory elements of all planes are connected are oriented vertically from the substrate and through the plurality of planes.

14 Claims, 56 Drawing Sheets

Related U.S. Application Data

(60) Provisional application No. 61/526,764, filed on Aug. 24, 2011, provisional application No. 61/423,007, filed on Dec. 14, 2010.

(51) Int. Cl.
    *H01L 27/06*     (2006.01)
    *H01L 27/24*     (2006.01)
    *H01L 45/00*     (2006.01)
    *G11C 8/08*     (2006.01)
    *G11C 5/02*     (2006.01)

(52) U.S. Cl.
    CPC ........ *H01L 45/1233* (2013.01); *H01L 45/165* (2013.01); *H01L 45/1683* (2013.01); *H01L 45/08* (2013.01); *H01L 45/1226* (2013.01); *H01L 45/146* (2013.01)

(56) References Cited

U.S. PATENT DOCUMENTS

| | | | |
|---|---|---|---|
| 5,313,432 A | 5/1994 | Liu | |
| 5,915,167 A | 6/1999 | Leedy | |
| 5,936,896 A | 8/1999 | Cho | |
| 6,049,106 A | 4/2000 | Forbes | |
| 6,141,236 A | 10/2000 | Kengeri | |
| 6,222,762 B1 | 4/2001 | Guterman | |
| 6,310,793 B1 | 10/2001 | Brox | |
| 6,388,927 B1 | 5/2002 | Churchill | |
| 6,399,447 B1 | 6/2002 | Clevenger | |
| 6,459,123 B1 | 10/2002 | Enders | |
| 6,480,417 B2 | 11/2002 | Elmhurst | |
| 6,492,212 B1 | 12/2002 | Ieong | |
| 6,538,922 B1 | 3/2003 | Khalid | |
| 6,542,431 B2 | 4/2003 | Nakagawa | |
| 6,569,715 B1 | 5/2003 | Forbes | |
| 6,610,576 B2 | 8/2003 | Nowak | |
| 6,617,180 B1 | 9/2003 | Wang | |
| 6,678,192 B2 | 1/2004 | Gongwer | |
| 6,750,487 B2 | 6/2004 | Fried | |
| 6,841,834 B2 | 1/2005 | Nowak | |
| 6,879,505 B2* | 4/2005 | Scheuerlein | H01L 27/115 257/E27.103 |
| 6,930,324 B2 | 8/2005 | Kowalski | |
| 7,019,342 B2 | 3/2006 | Hackler, Sr. | |
| 7,101,741 B2 | 9/2006 | Fried | |
| 7,130,239 B2 | 10/2006 | Lakhani | |
| 7,184,302 B2 | 2/2007 | Yang | |
| 7,233,024 B2 | 6/2007 | Scheuerlein | |
| 7,237,074 B2 | 6/2007 | Guterman | |
| 7,249,225 B1 | 7/2007 | Seidl | |
| 7,256,458 B2 | 8/2007 | Nowak | |
| 7,324,393 B2 | 1/2008 | Chan | |
| 7,468,906 B2 | 12/2008 | Kuo | |
| 7,486,587 B2 | 2/2009 | Scheuerlein | |
| 7,489,002 B2 | 2/2009 | Forbes | |
| 7,613,868 B2 | 11/2009 | Yang | |
| 7,634,744 B2 | 12/2009 | Sumimoto | |
| 7,645,650 B2 | 1/2010 | Bryant | |
| 7,830,713 B2 | 11/2010 | Lee | |
| 7,869,258 B2 | 1/2011 | Scheuerlein | |
| 7,952,163 B2 | 5/2011 | Baek et al. | |
| 7,983,065 B2 | 7/2011 | Samachisa | |
| 8,003,457 B2 | 8/2011 | Chen | |
| 8,027,209 B2 | 9/2011 | Yan | |
| 2003/0003611 A1 | 1/2003 | Weiner | |
| 2003/0206481 A1 | 11/2003 | Hsu | |
| 2004/0151024 A1 | 8/2004 | Fricke | |
| 2004/0159868 A1 | 8/2004 | Rimerson | |
| 2004/0160847 A1 | 8/2004 | Rinerson et al. | |
| 2005/0022264 A1 | 1/2005 | Fanger | |
| 2006/0197115 A1 | 9/2006 | Toda | |
| 2006/0197153 A1 | 9/2006 | Huang | |
| 2006/0221752 A1* | 10/2006 | Fasoli | G11C 5/02 365/230.03 |
| 2006/0250837 A1 | 11/2006 | Herner | |
| 2006/0273370 A1 | 12/2006 | Forbes | |
| 2007/0083679 A1 | 4/2007 | Kikuchi | |
| 2007/0133268 A1 | 6/2007 | Choi | |
| 2007/0159878 A1 | 7/2007 | Choi et al. | |
| 2007/0252201 A1* | 11/2007 | Kito | H01L 21/8221 257/331 |
| 2008/0002461 A1 | 1/2008 | Rinerson | |
| 2008/0089127 A1 | 4/2008 | Mokhlesi | |
| 2008/0112209 A1* | 5/2008 | Cho | G11C 11/16 365/148 |
| 2008/0175032 A1 | 7/2008 | Tanaka | |
| 2009/0001344 A1 | 1/2009 | Schricker | |
| 2009/0141547 A1 | 6/2009 | Jin | |
| 2009/0168503 A1 | 7/2009 | Fackenthal | |
| 2009/0168523 A1 | 7/2009 | Shirakawa | |
| 2009/0273054 A1 | 11/2009 | Kim | |
| 2010/0027316 A1 | 2/2010 | Yoon | |
| 2010/0046267 A1 | 2/2010 | Yan | |
| 2010/0085098 A1 | 4/2010 | Ferguson | |
| 2010/0178729 A1 | 7/2010 | Yoon et al. | |
| 2010/0259960 A1* | 10/2010 | Samachisa | B82Y 10/00 365/51 |
| 2010/0259961 A1* | 10/2010 | Fasoli | B82Y 10/00 365/51 |
| 2010/0259962 A1 | 10/2010 | Yan | |
| 2011/0147806 A1 | 6/2011 | Wilson | |
| 2012/0127779 A1 | 5/2012 | Scheuerlein et al. | |
| 2012/0147644 A1 | 6/2012 | Scheuerlein | |
| 2012/0147645 A1 | 6/2012 | Scheuerlein | |
| 2012/0147647 A1 | 6/2012 | Scheuerlein | |
| 2012/0147648 A1 | 6/2012 | Scheuerlein | |
| 2012/0147649 A1 | 6/2012 | Samachisa | |
| 2012/0147650 A1 | 6/2012 | Samachisa | |
| 2012/0147651 A1 | 6/2012 | Scheuerlein | |
| 2012/0147652 A1 | 6/2012 | Scheuerlein | |
| 2012/0147689 A1 | 6/2012 | Scheuerlein | |
| 2013/0130495 A1 | 5/2013 | Higashitani et al. | |

OTHER PUBLICATIONS

PCT Written Opinion of the International Searching Authority dated Mar. 13, 2012, PCT Application No. PCT/US2011/064493.
PCT International Search Report dated Mar. 9, 2012, PCT Application No. PCT/US2011/064695.
PCT Written Opinion of the International Searching Authority dated Mar. 9, 2012, PCT Application No. PCT/US2011/064695.
PCT International Search Report dated Mar. 9, 2012, PCT Application No. PCT/US2011/064700.
PCT Written Opinion of the International Searching Authority dated Mar. 9, 2012, PCT Application No. PCT/US2011/064700.
Response to Election/Restriction filed in U.S. Appl. No. 13/323,695 mailed May 2, 2014.
Requirement for Restriction/Election filed in U.S. Appl. No. 13/323,695 mailed Mar. 13, 2014.
Notice of Allowance and Fees Due filed in U.S. Appl. No. 13/323,695 mailed May 12, 2015.
Notice of Allowance and Fees Due filed in U.S. Appl. No. 13/323,695 mailed Apr. 20, 2015.
Non-Final Rejection filed in U.S. Appl. No. 13/323,695 mailed Jun. 26, 2014.
Final Rejection filed in U.S. Appl. No. 13/323,695 mailed Jan. 2, 2015.
Amendment filed in U.S. Appl. No. 13/323,695 mailed Apr. 1, 2015.
Amendment filed in U.S. Appl. No. 13/323,695 mailed Dec. 9, 2014.

* cited by examiner

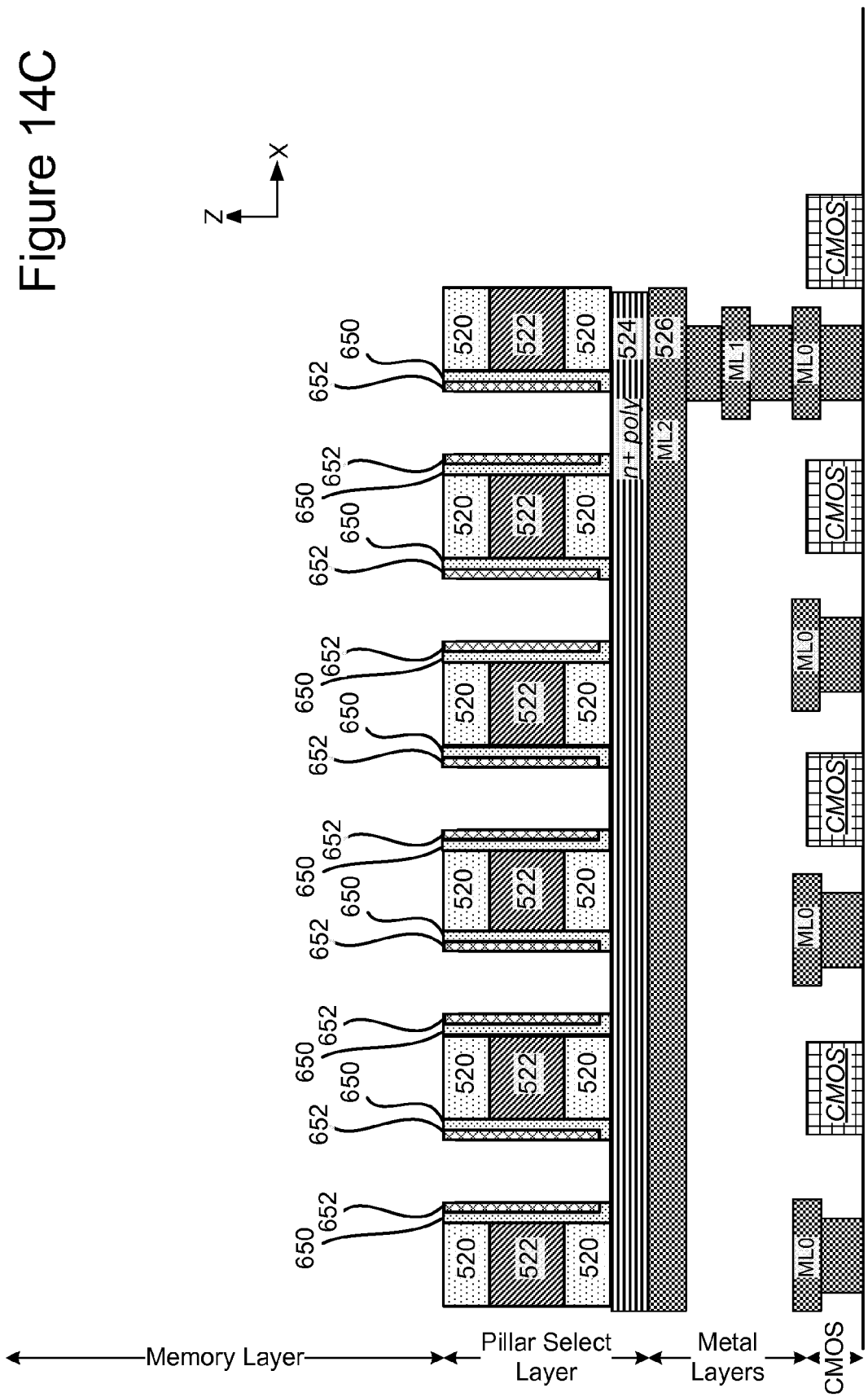

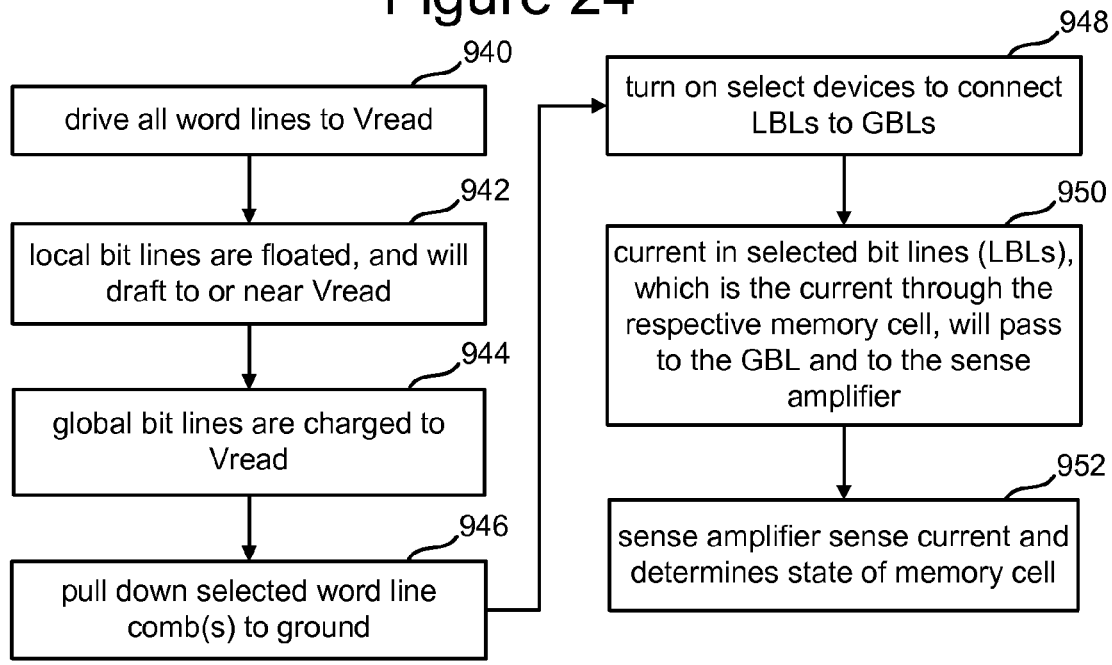
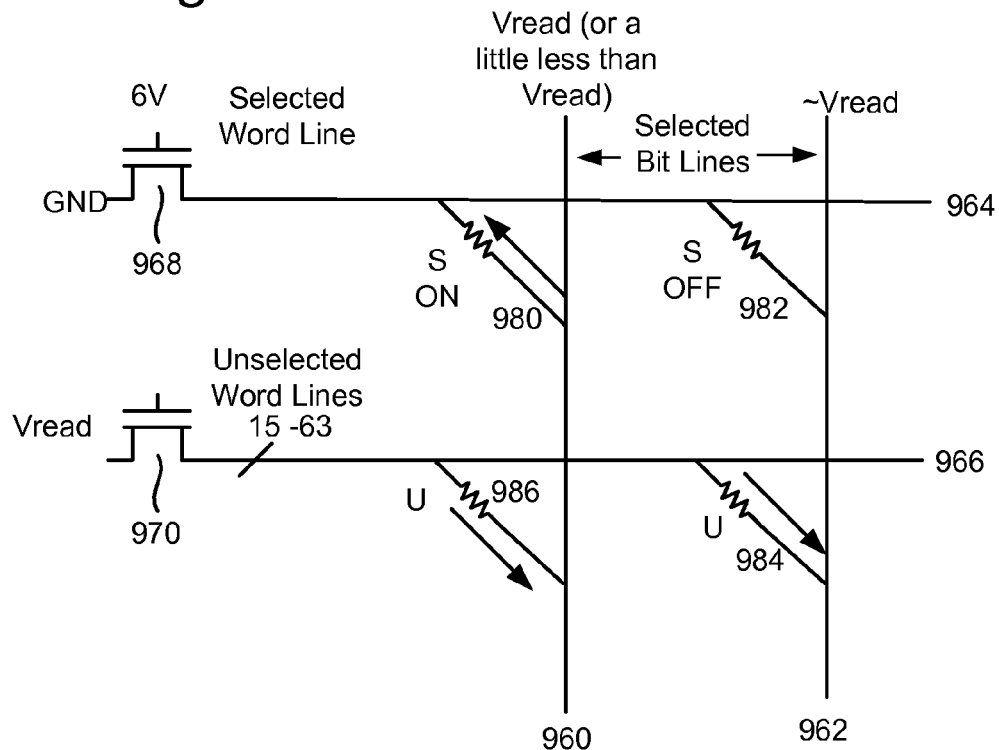

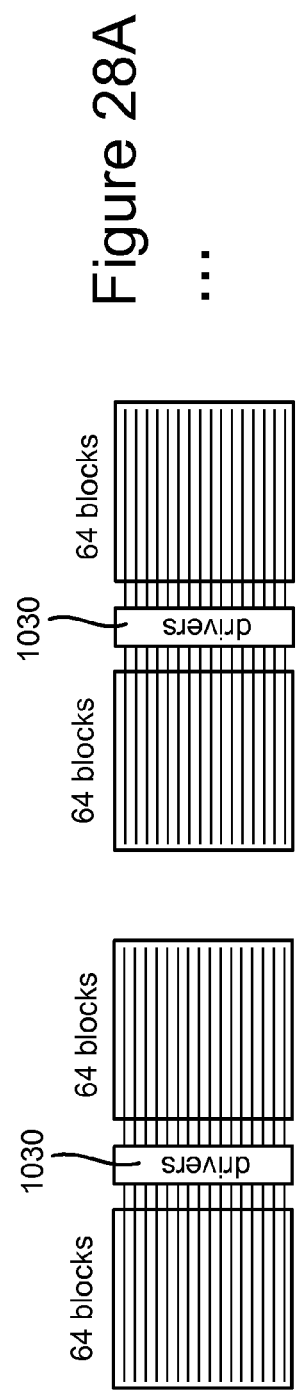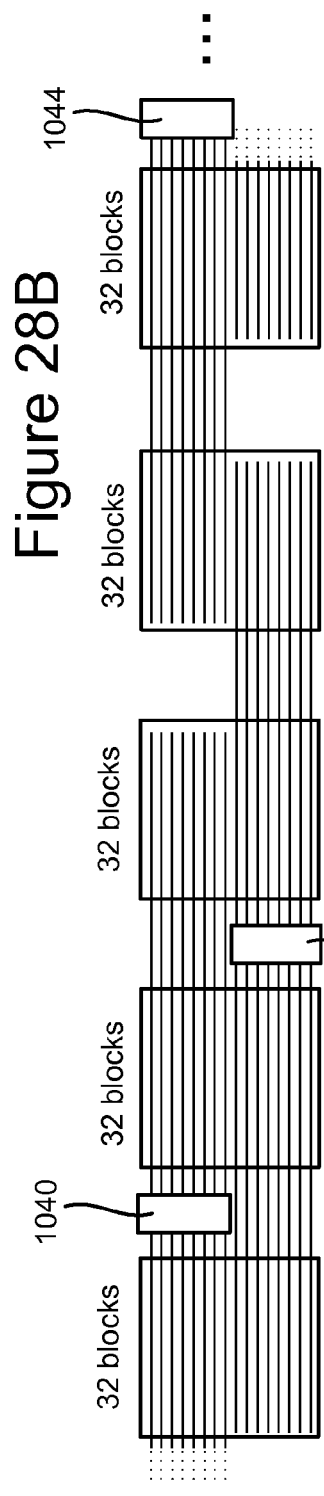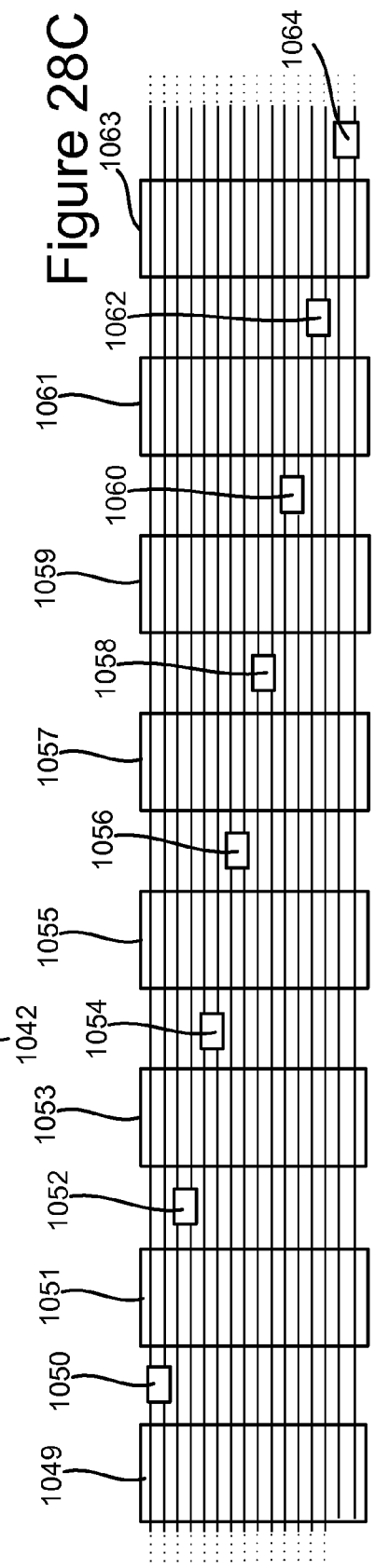

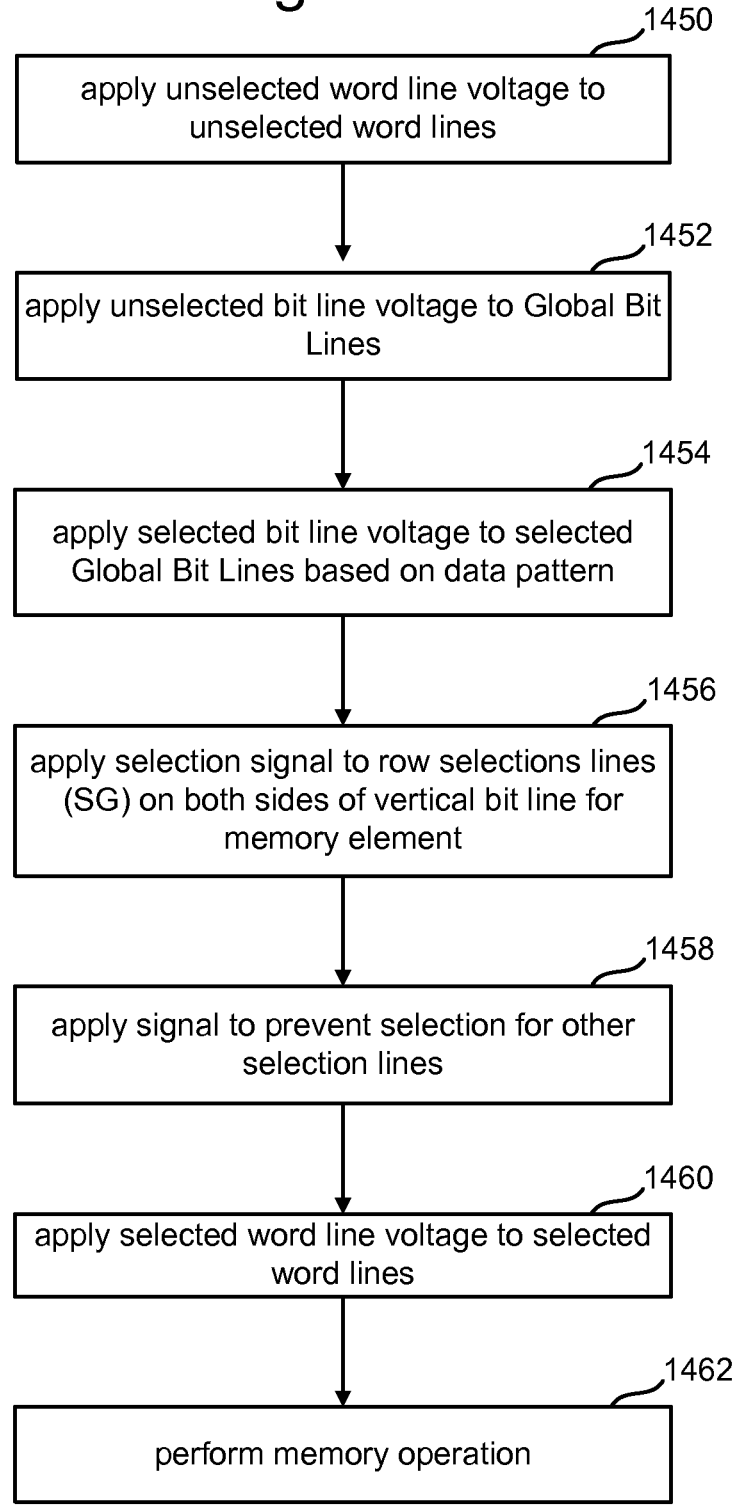

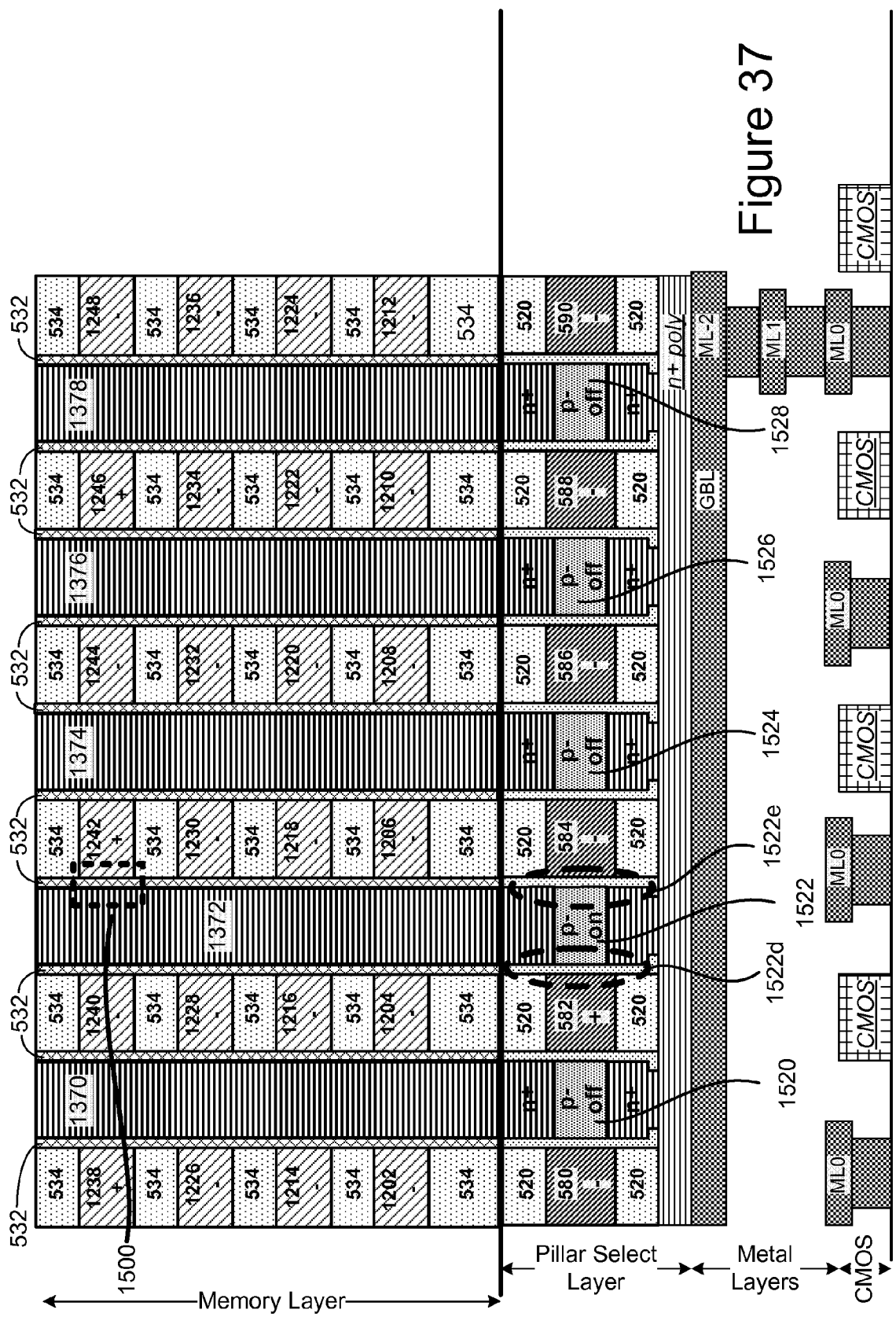

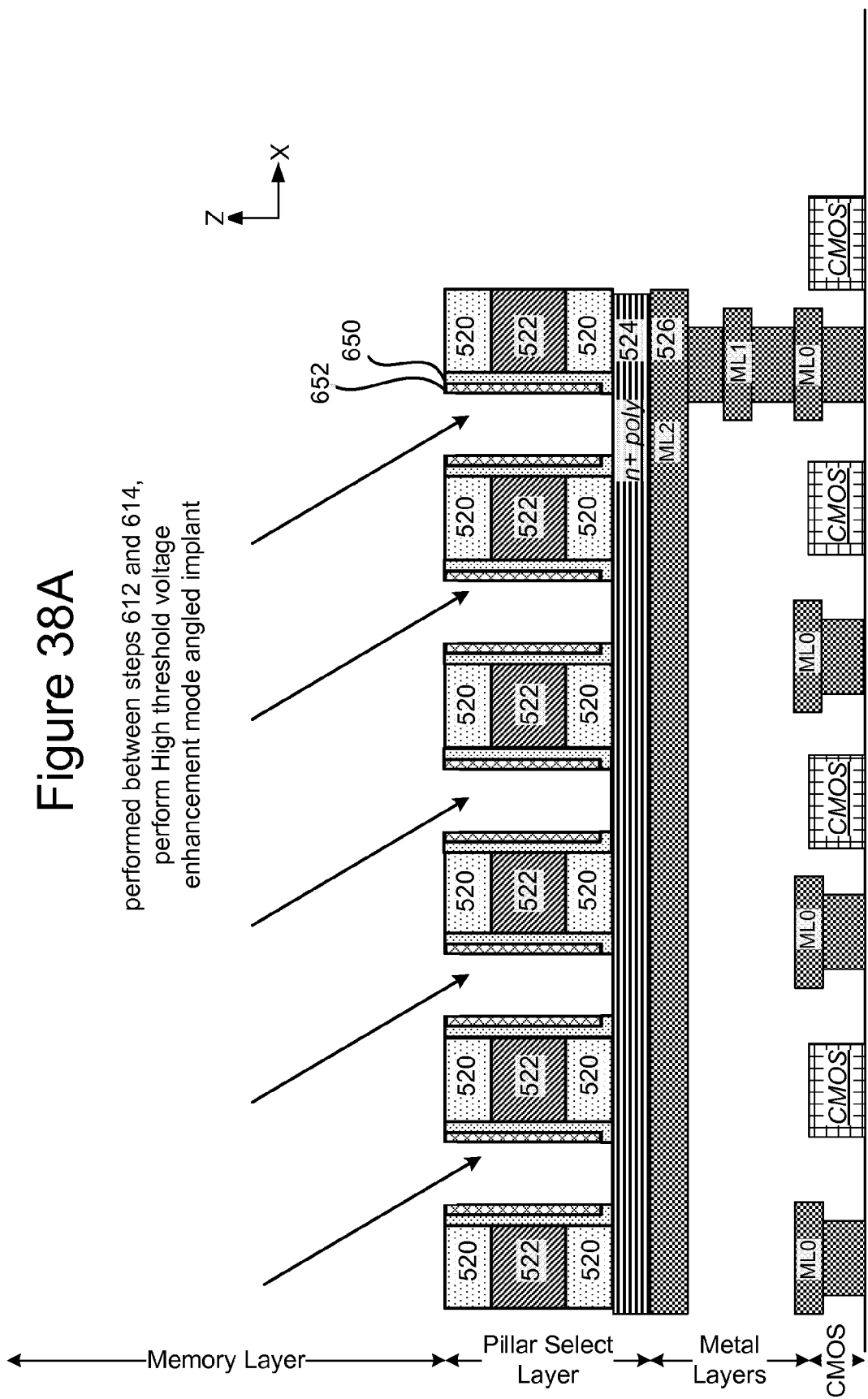

THREE DIMENSIONAL NON-VOLATILE STORAGE WITH CONNECTED WORD LINES

This application is a divisional of and claims benefit of U.S. patent application Ser. No. 13/323,695, "Three Dimensional Non-Volatile Storage With Connected Word Lines," filed Dec. 12, 2011, to be issued as U.S. Pat. No. 9,065,044, which application claims the benefit of U.S. Provisional Application 61/526,764, "Optimizing Architecture for Three Dimensional Non-Volatile Storage Device With Vertical Bit Lines," filed on Aug. 24, 2011 and U.S. Provisional Application 61/423,007, "Non-Volatile Memory Having 3D Array of Read/Write Elements With Vertical Bit Lines and Laterally Aligned Active Elements and Methods Thereof," filed on Dec. 14, 2010, all of which said applications are incorporated herein by reference in their entirety.

BACKGROUND OF THE INVENTION

Field of the Invention

The present invention relates to technology for non-volatile storage.

Description of the Related Art

One example of non-volatile memory uses variable resistance memory elements that may be set to either low or high resistance states, and can remain in that state until subsequently re-set to the initial condition. The variable resistance memory elements are individually connected between two orthogonally extending conductors (typically bit and word lines) where they cross each other in a two-dimensional array. The state of such a memory element is typically changed by proper voltages being placed on the intersecting conductors. Since these voltages are necessarily also applied to a large number of other unselected memory elements because they are connected along the same conductors as the selected memory elements being programmed or read, diodes are commonly connected in series with the variable resistive elements in order to reduce leakage currents that can flow through them. The desire to perform data reading and programming operations with a large number of memory elements in parallel results in reading or programming voltages being applied to a very large number of other memory elements. An example of an array of variable resistive elements and associated diodes is given in U.S. Patent Application Publication No. US 2009/0001344.

BRIEF DESCRIPTION OF THE DRAWINGS

FIGS. 14A-F depict the structure of FIG. 10 during the process of FIG. 13.

FIG. 24 is a flow chart describing one embodiment for reading the memory system.

FIG. 25 is a schematic of a portion of the memory system, depicting the programming operation.

FIGS. 28A-C are block diagrams that depict multiple arrangements for positioning row select line drivers.

FIG. 36 is a flow chart describing one embodiment of a process for operating the structure of FIGS. 33-35.

FIG. 37 depicts the structure of FIG. 10, with asymmetrical vertically oriented select devices.

DETAILED DESCRIPTION

Figure 1:
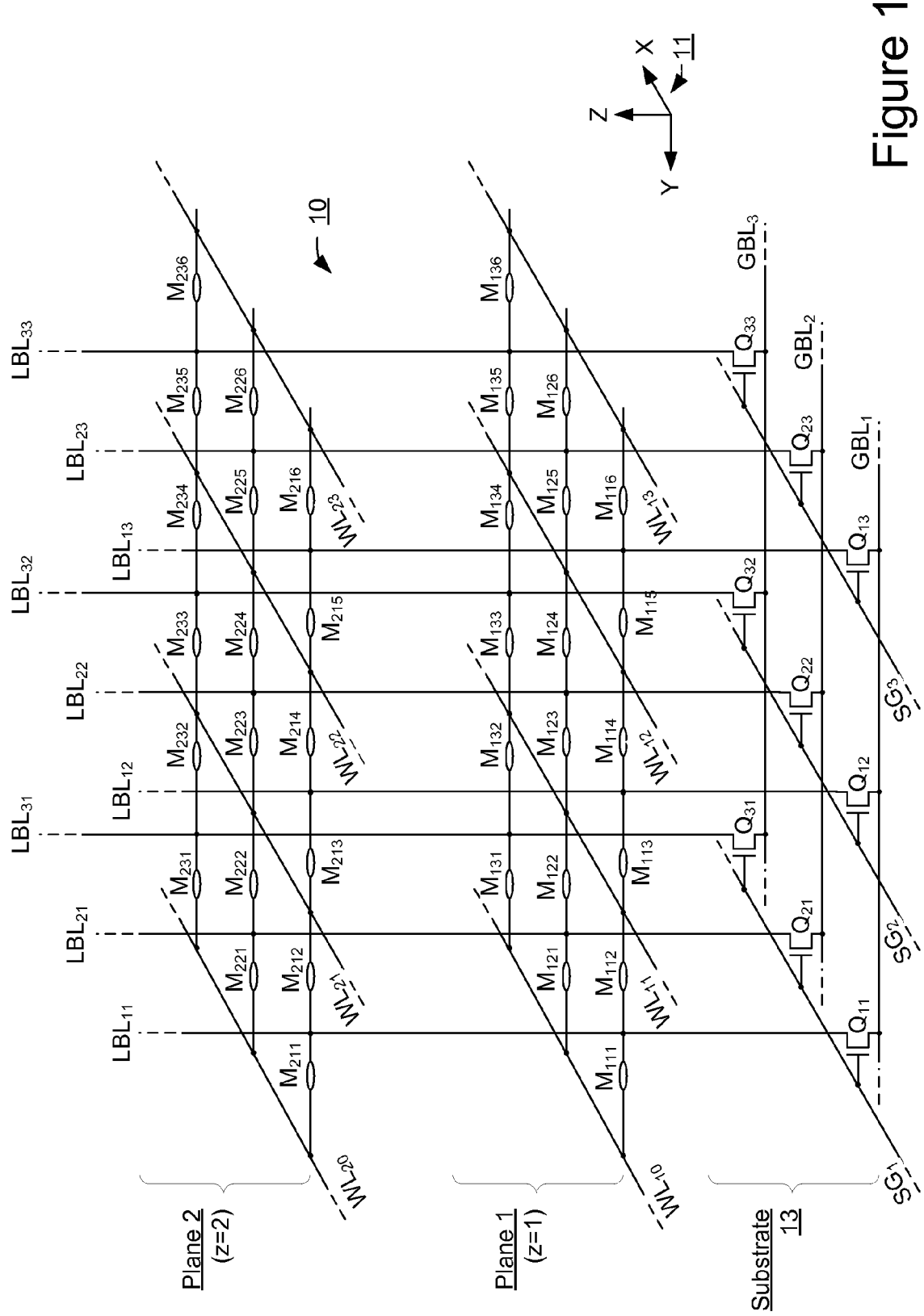
FIG. 1 is an equivalent circuit of a portion of an example three-dimensional array of variable resistance memory elements, wherein the array has vertical bit lines.

The technology described herein is directed to an architecture for a three-dimensional array of memory elements wherein bit lines of the array are oriented vertically. That is, instead of merely stacking a plurality of existing two-dimensional arrays on a common semiconductor substrate, where each two-dimensional array has its own bit lines, multiple two-dimensional arrays are stacked on top of each other in separate planes but then share common bit lines that extend up through the planes.

The memory elements used in the three-dimensional array are preferably variable resistive memory elements. That is, the resistance (and thus inversely the conductance) of the individual memory elements is typically changed as a result of a voltage placed across the orthogonally intersecting conductors to which the memory element is connected. Depending on the type of variable resistive element, the state may change in response to a voltage across it, a level of current though it, an amount of electric field across it, a level of heat applied to it, and the like. With some variable resistive element material, it is the amount of time that the voltage, current, electric field, heat and the like is applied to the element that determines when its conductive state changes and the direction in which the change takes place. In between such state changing operations, the resistance of the memory element remains unchanged, so is non-volatile. The three-dimensional array architecture summarized above may be implemented with a memory element material selected from a wide variety of such materials having different properties and operating characteristics.

The resistance of the memory element, and thus its detectable storage state, can be repetitively set from an initial level to another level and then re-set back to the initial level. For some materials, the amount or duration of the voltage, current, electric field, heat and the like applied to change its state in one direction is different (asymmetrical) with that applied to change in another direction. With two detectable states, each memory element stores one-bit of data. With the use of some materials, more than one bit of data may be stored in each memory element by designating more than two stable levels of resistance as detectable states of the memory element. The three-dimensional array architecture herein is quite versatile in the way it may be operated.

This three-dimensional architecture also allows limiting the extent and number of unaddressed (non-selected) resistive memory elements across which an undesired level of voltage is applied during reading and programming operations conducted on other addressed (selected) memory elements. The risk of disturbing the states of unaddressed memory elements and the levels of leakage current passing through unaddressed elements may be significantly reduced from those experienced in other arrays using the same memory element material. Leakage currents are undesirable because they can alter the apparent currents being read from addressed memory elements, thereby making it difficult to accurately read the states of addressed (selected) memory elements. Leakage currents are also undesirable because they add to the overall power draw by an array and therefore undesirably causes the power supply to have to be made larger than is desirable. Because of the relatively small extent of unaddressed memory elements that have voltages applied during programming and reading of addressed memory elements, the array with the three-dimensional architecture herein may be made to include a much larger number of addressed memory elements without introducing errors in reading and exceeding reasonable power supply capabilities.

In addition, the three-dimensional architecture herein allows variable resistance memory elements to be connected at orthogonal crossings of bit and word line conductors without the need for diodes or other non-linear elements being connected in series with the variable resistive elements. In existing arrays of variable resistance memory elements, a diode is commonly connected in series with each memory element in order to reduce the leakage current though the element when it is unselected but nevertheless has a voltage difference placed across it, such as can occur when the unselected memory element is connected to a bit or word line carrying voltages to selected memory elements connected to those same lines. The absence of the need for diodes significantly reduces the complexity of the array and thus the number of processing steps required to manufacture it. The term connected refers to direct and indirect connections.

Indeed, the manufacture of the three-dimensional array of memory elements herein is much simpler than other three-dimensional arrays using the same type of memory elements. In particular, a fewer number of masks is required to form the elements of each plane of the array. The total number of processing steps needed to form integrated circuits with the three-dimensional array are thus reduced, as is the cost of the resulting integrated circuit.

Referring initially to FIG. 1, an architecture of one example embodiment of a three-dimensional memory 10 is schematically and generally illustrated in the form of an equivalent circuit of a portion of such a memory. A standard three-dimensional rectangular coordinate system 11 is used for reference, the directions of each of vectors x, y and z being orthogonal with the other two. In another embodiment direction x and x are substantially 60 degrees from each other.

A circuit for selectively connecting internal memory elements with external data circuits is preferably formed using select devices $Q_{xy}$, where x gives a relative position of the device in the x-direction and y its relative position in the y-direction. The individual select devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the select devices to which it is connected. The remaining row select lines receive voltages that keep their connected select devices $Q_{xy}$ off. It may be noted that since only one select device ($Q_{xy}$) is used with each of the local bit lines ($LBL_{xy}$), the pitch of the array across the semiconductor substrate in both x and y-directions may be made very small, and thus the density of the memory storage elements large.

Memory elements $M_{zxy}$ are formed in a plurality of planes positioned at different distances in the z-direction above the substrate 13. Two planes 1 and 2 are illustrated in FIG. 1 but there will typically be more, such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

The memory arrays described herein, including memory 10, are monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Figure 2:
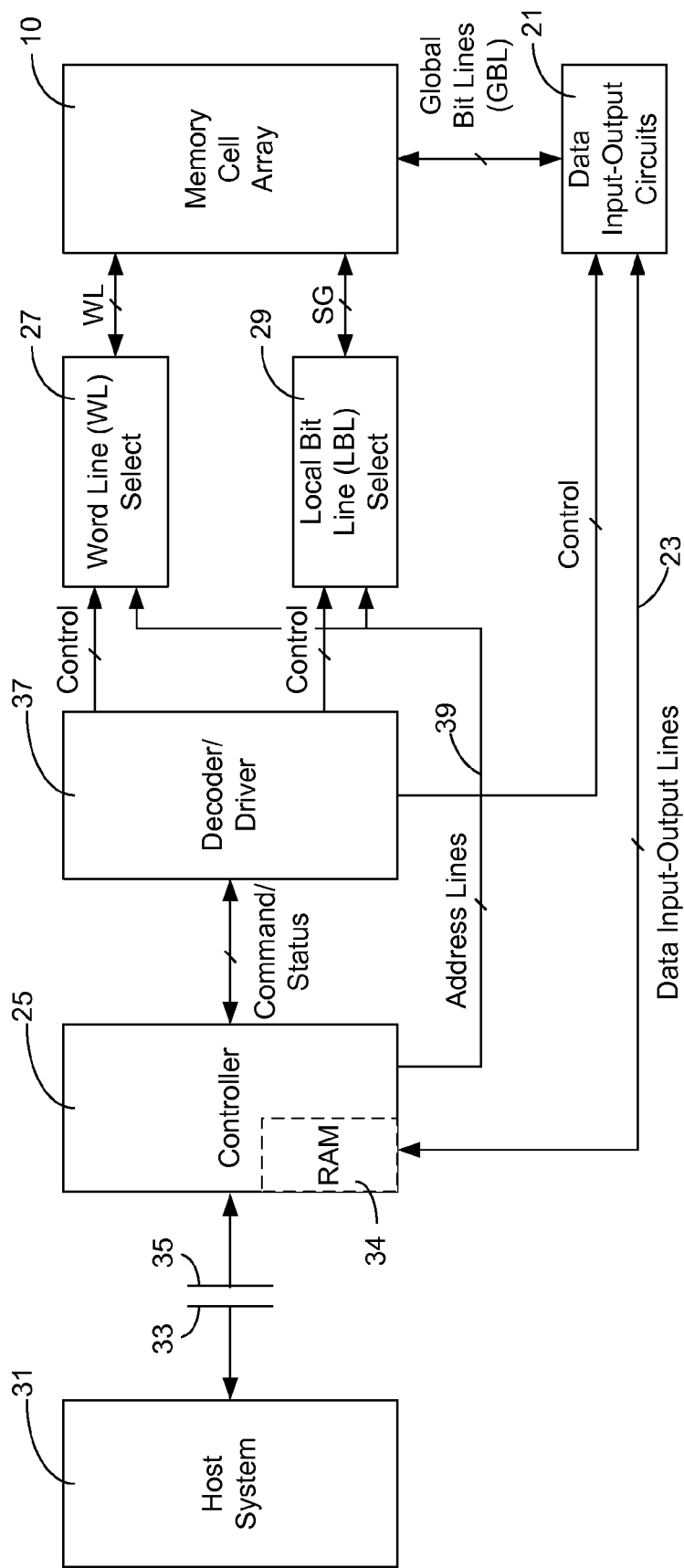
FIG. 2 is a schematic block diagram of a re-programmable non-volatile memory system which utilizes the memory array of FIG. 1, and which indicates connection of the memory system with a host system.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed memory elements $M_{zxy}$. Data input-output circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and row select lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the local bit line select e circuits 29 partially address the designated storage elements within the array 10 by placing proper voltages on the control elements of the select devices $Q_{xy}$, to connect selected local bit lines ($LBL_{xy}$) with the global bit lines ($GBL_x$). The addressing is completed by the circuits 27 applying proper voltages to the word lines $WL_{zy}$ of the array.

Although the memory system of FIG. 2 utilizes the three-dimensional memory array 10 of FIG. 1, the system is not limited to use of only that array architecture. A given memory system may alternatively combine this type of memory with other another type including flash memory, such as flash memory having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments. In some arrays the number of memory elements programmed in one operation may be less than the total number of memory elements connected to the selected word line to minimize IR drops, to minimize power, or for other reasons.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usually preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to current flash memory arrays. Resetting a block of memory elements to a common state corresponds to erasing a block of flash memory elements to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
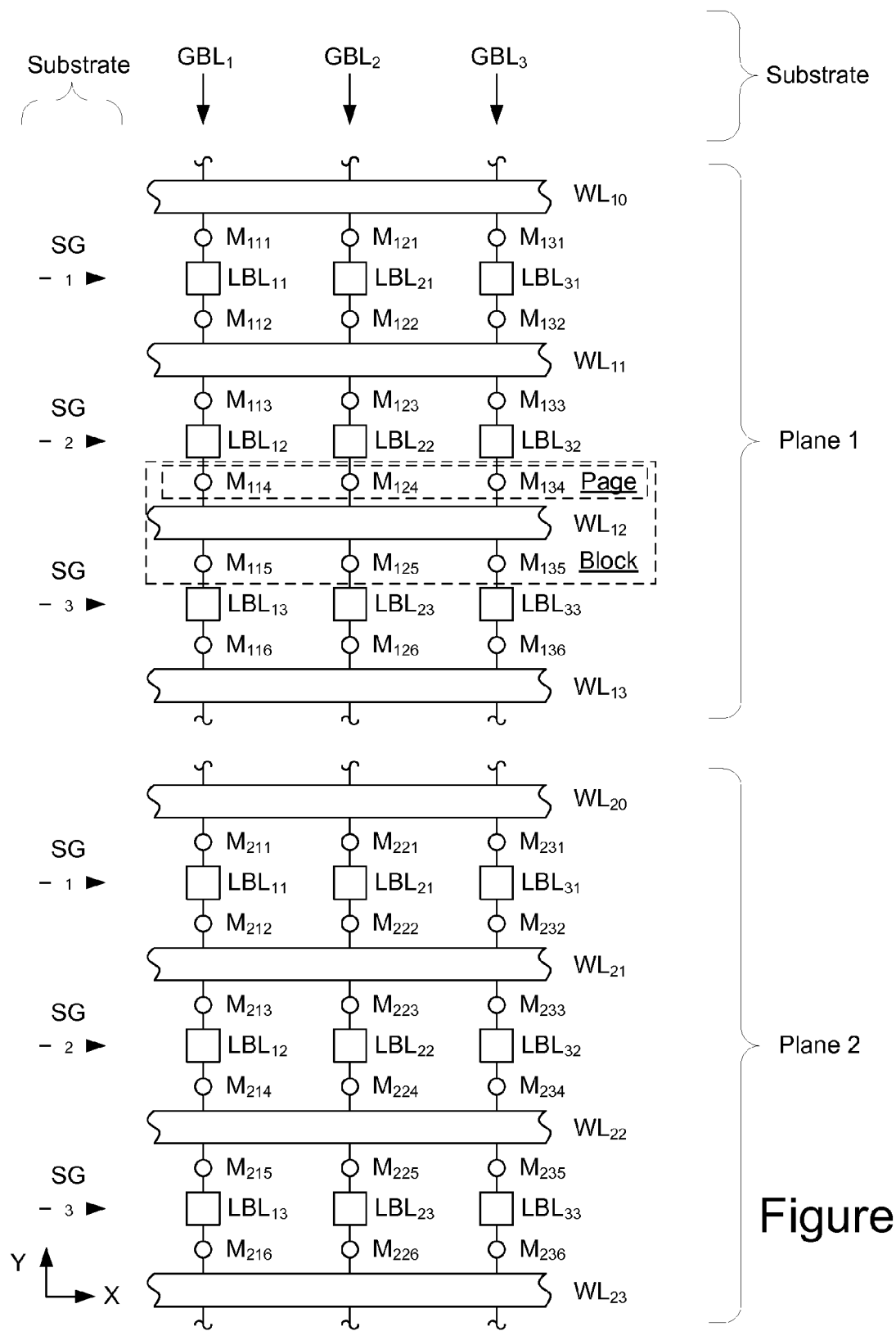
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of the array of FIG. 1. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory elements along one side of the word line of the block and the other page by the memory elements along the opposite side of the word line. The example page marked in FIG. 3 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 3 are included, for simplicity in explanation.

Example resetting, programming and reading operations of the memory array of FIGS. 1 and 3, when operated as array 10 in the memory system of FIG. 2, will now be described. For these examples, each of the memory elements $M_{zxy}$ is taken to include a non-volatile memory material that can be switched between two stable states of different resistance levels by impressing voltages (or currents) of different polarity across the memory element, or voltages of the same polarity but different magnitudes and/or duration. For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory elements that indicate storage of one bit of data, which is either a "0" or a "1," depending upon the memory element state.

To reset (e.g., erase) a block of memory elements, the memory elements in that block are placed into their high resistance state. This state will be designated as the logical data state "1," following the convention used in current flash memory arrays but it could alternatively be designated to be a "0." As shown by the example in FIG. 3, a block includes all the memory elements that are electrically connected to one word line WL or segment thereof. A block is the smallest unit of memory elements in the array that are reset together. It can include thousands of memory elements. If a row of memory elements on one side of a word line includes 1000 of them, for example, a block will have 2000 memory elements from the two rows on either side of the word line.

The following steps may be taken to reset all the memory elements of a block, using the block illustrated in FIG. 3 as an example:
1. Set all of the global bit lines ($GBL_1$, $GBL_2$ and $GBL_3$ in the array of FIGS. 1 and 3) to zero volts, by the circuits 21 of FIG. 2.
2. Set at least the two row select lines on either side of the one word line of the block to H' volts, so that the local bit lines on each side of the word line in the y-direction are connected to their respective global bit lines through their select devices and therefore brought to zero volts. The voltage H' is made high enough to turn on the select devices $Q_{xy}$, for example, something in a range of 1-6 volts, typically 3 volts. The block shown in FIG. 3 includes the word line $WL_{12}$, so the row select lines $SG_2$ and $SG_3$ (FIG. 1) on either side of that word line are set to H' volts, by the circuits 29 of FIG. 2, in order to turn on the select devices $Q_{12}$, $Q_{22}$, $Q_{32}$, $Q_{13}$, $Q_{23}$ and $Q_{33}$. This causes each of the local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.
3. Set the word line of the block being reset to H volts. This reset voltage value is dependent on the switching material in the memory element and can be between a fraction of a volt to a few volts. All other word lines of the array, including the other word lines of selected plane 1 and all the word lines on the other unselected planes, are set to zero volts. In the array of FIGS. 1 and 3, word line $WL_{12}$ is placed at H volts, while all other word lines in the array are placed at zero volts, all by the circuits 27 of FIG. 2.

The result is that H volts are placed across each of the memory elements of the block. In the example block of FIG. 3, this includes the memory elements $M_{114}$, $M_{124}$, $M_{134}$, $M_{115}$, $M_{125}$ and $M_{135}$. For the type of memory material being used as an example, the resulting currents through these memory elements places any of them not already in a high resistance state, into that re-set state.

It may be noted that no stray currents will flow because only one word line has a non-zero voltage. The voltage on the one word line of the block can cause current to flow to ground only through the memory elements of the block. There is also nothing that can drive any of the unselected and electrically floating local bit lines to H volts, so no voltage difference will exist across any other memory elements of the array outside of the block. Therefore no voltages are applied across unselected memory elements in other blocks that can cause them to be inadvertently disturbed or reset.

It may also be noted that multiple blocks may be concurrently reset by setting any combination of word lines and the adjacent select gates to H or H' respectively. In this case, the only penalty for doing so is an increase in the amount of current that is required to simultaneously reset an increased number of memory elements. This affects the size of the power supply that is required. In some embodiments, less than all memory elements of a block will be simultaneously reset.

The memory elements of a page are preferably programmed concurrently, in order to increase the parallelism of the memory system operation. An expanded version of the page indicated in FIG. 3 is provided in FIG. 4, with annotations added to illustrate a programming operation. The individual memory elements of the page are initially in their reset state because all the memory elements of its block have previously been reset. The reset state is taken herein to represent a logical data "1." For any of these memory elements to store a logical data "0" in accordance with incoming data being programmed into the page, those memory elements are switched into their low resistance state, their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

Figure 4:
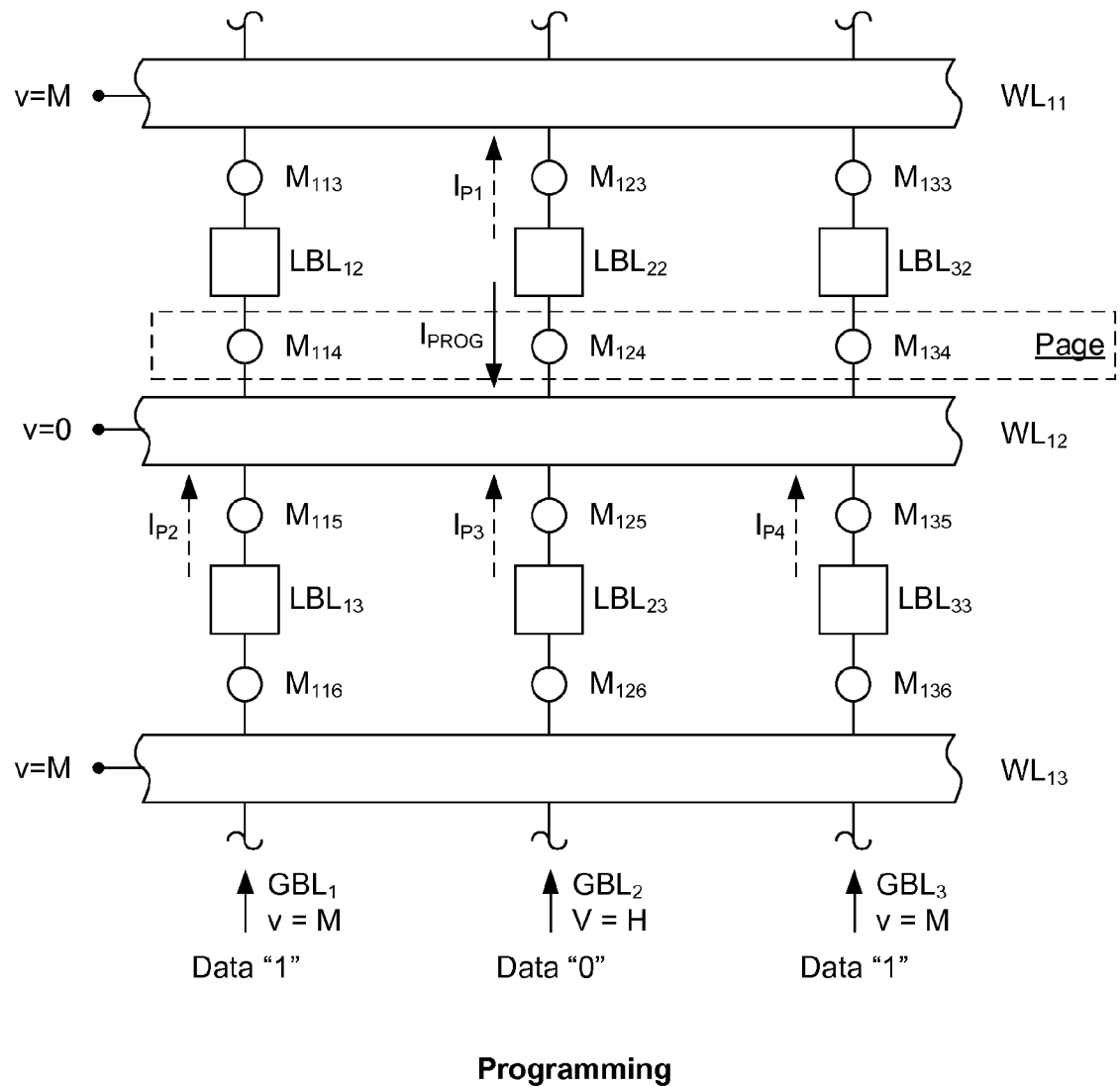
FIG. 4 is an expanded view of a portion of one of the planes of FIG. 3, annotated to show effects of programming data therein.

Referring to FIGS. 3 and 4, an example programming operation within the indicated one page of memory elements $M_{114}$, $M_{124}$ and $M_{134}$ is described, as follows:
1. The voltages placed on the global bit lines are in accordance with the pattern of data received by the memory system for programming. In the example of FIG. 4, $GBL_1$ carries logical data bit "1", $GBL_2$ the logical bit "0" and $GBL_3$ the logical bit "1." The bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory elements $M_{114}$ and $M_{134}$ are to remain in their reset state, while memory element $M_{124}$ is being programmed. Therefore, the programming voltages are applied only to memory element $M_{124}$ of this page by the following steps.

2. Set the word line of the page being programmed to 0 volts, in this case selected word line $WL_{12}$. This is the only word line to which the memory elements of the page are connected. Each of the other word lines on all planes is set to the M level. These word line voltages are applied by the circuits 27 of FIG. 2.

3. Set one of the row select lines below and on either side of the selected word line to the H' voltage level, in order to select a page for programming. For the page indicated in FIGS. 3 and 4, the H' voltage is placed on row select line $SG_2$ in order to turn on select devices $Q_{12}$, $Q_{22}$ and $Q_{32}$ (FIG. 1). All other row select lines, namely lines $SG_1$ and $SG_3$ in this example, are set to 0 volts in order to keep their select devices off. The row select line voltages are applied by the circuits 29 of FIG. 2. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned on, while all other local bit lines (LBLs) of the array are left floating.

The result of this operation, for the example memory element material mentioned above, is that a programming current $I_{PROG}$ is sent through the memory element $M_{124}$, thereby causing that memory element to change from a reset state to a set (programmed) state. The same will occur with other memory elements (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected row select line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that must be delivered by word line drivers that are part of the circuits 27 of FIG. 2.

By floating all the local bit lines other than the selected row (in this example, all but $LBL_{12}$, $LBL_{22}$ and $LBL_{32}$), voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

There are typically parasitic currents present during the programming operation that can increase the currents that must be supplied through the selected word line and global bit lines. During programming there are two sources of parasitic currents, one to the adjacent page in a different block and another to the adjacent page in the same block. An example of the first is the parasitic current $I_{P1}$ shown on FIG. 4 from the local bit line $LBL_{22}$ that has been raised to the voltage level H during programming. The memory element $M_{123}$ is connected between that voltage and the voltage level M on its word line $WL_{11}$. This voltage difference can cause the parasitic current $-I_{P1}$ to flow. Since there is no such voltage difference between the local bit lines $LBL_{12}$ or $LBL_{32}$ and the word line $WL_{11}$, no such parasitic current flows through either of the memory elements $M_{113}$ or $M_{133}$, a result of these memory elements remaining in the reset state according to the data being programmed.

Other parasitic currents can similarly flow from the same local bit line $LBL_{22}$ to an adjacent word line in other planes. The presence of these currents may limit the number of planes that can be included in the memory system since the total current may increase with the number of planes. The limitation for programming is in the current capacity of the memory power supply, so the maximum number of planes is a tradeoff between the size of the power supply and the number of planes. A number of 4-16 planes may generally be used in most cases, but a different amount can also be used.

The other source of parasitic currents during programming is to an adjacent page in the same block. The local bit lines that are left floating (all but those connected to the row of memory elements being programmed) will tend to be driven to the voltage level M of unselected word lines through any programmed memory element on any plane. This in turn can cause parasitic currents to flow in the selected plane from these local bit lines at the M voltage level to the selected word line that is at zero volts. An example of this is given by the currents $I_{P2}$, $I_{P3}$, and $I_{P4}$ shown in FIG. 4. In general, these currents will be much less than the other parasitic current $I_{P1}$ discussed above, since these currents flow only through those memory elements in their conductive state that are adjacent to the selected word line in the selected plane.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating because the parasitic currents flowing to them are so low as to be negligible compared to the identified parasitic currents since they must flow through a series combination of five or more ON devices (devices in their low resistance state). This can reduce the power dissipation caused by charging a large number of word lines.

While the above description assumes that each memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed. An example of this technique is described in U.S. Pat. No. 5,172,338.

Figure 5:
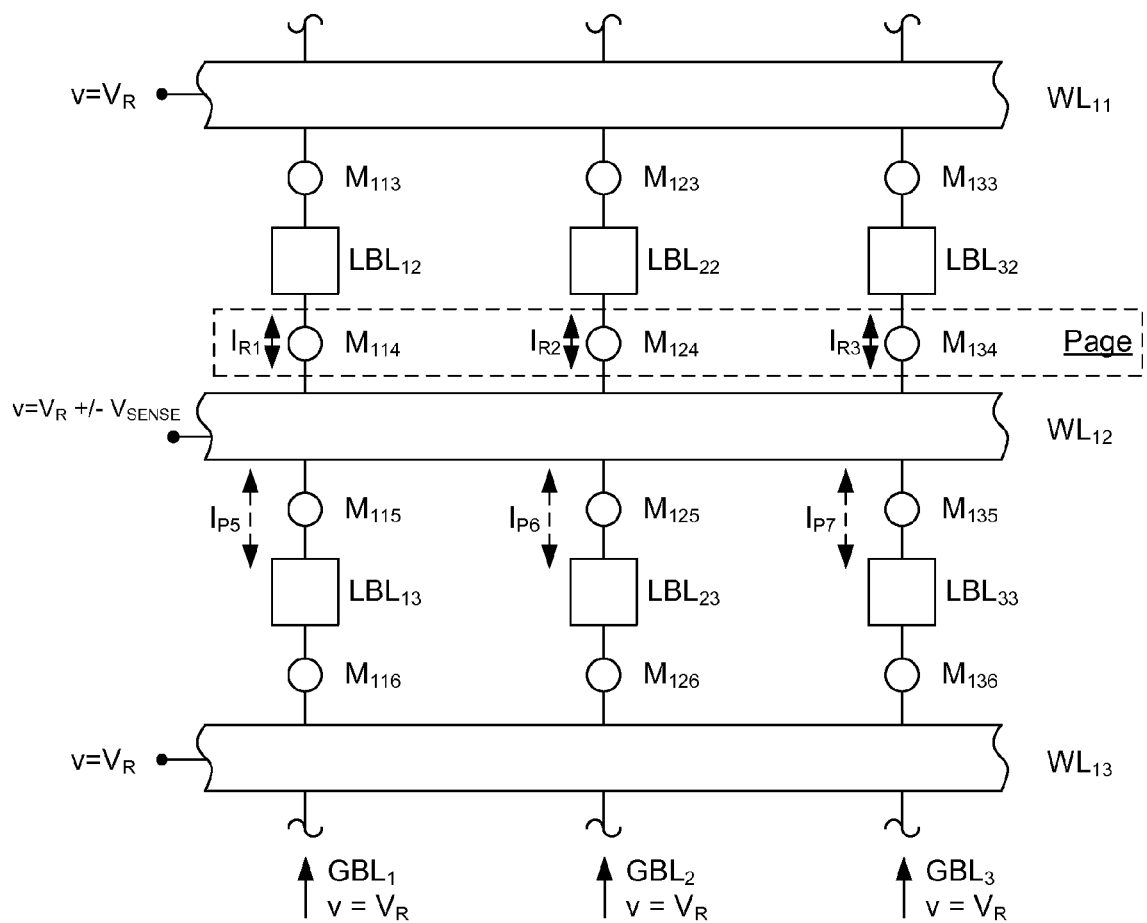
FIG. 5 is an expanded view of a portion of one of the planes of FIG. 3, annotated to show effects of reading data therefrom.

With reference primarily to FIG. 5, the parallel reading of the states of a page of memory elements, such as the memory elements $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.
2. Turn on one row of select devices by placing a voltage on the control line adjacent to the selected word line in order to define the page to be read. In the example of FIGS. 1 and 5, a voltage is applied to the row select line $SG_2$ in order to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in the circuits 21 of FIG. 2, and assume the potential $V_R$ of the global bit lines to which they are connected. All other local bit lines LBLs are allowed to float.
3. Set the selected word line ($WL_{12}$) to a voltage of $V_R \pm V\text{sense}$. The sign of Vsense is chosen based on the sense amplifier and has a magnitude of about 0.5 volt. The voltages on all other word lines remain the same.
4. Sense current flowing into ($V_R+V\text{sense}$) or out of ($V_R-V\text{sense}$) each sense amplifier for time T. These are the currents $I_{R1}$, $I_{R2}$ and $I_{R3}$ shown to be flowing through the addressed memory elements of the example of FIG. 5, which are proportional to the programmed states of the respective memory elements $M_{114}$, $M_{124}$ and $M_{134}$. The states of the memory elements $M_{114}$, $M_{124}$ and $M_{134}$ are then given by binary outputs of the sense amplifiers within the circuits 21 that are connected to the respective global bit lines $GBL_1$, $GBL_2$ and $GBL_3$. These sense amplifier outputs are then sent over the lines 23 (FIG. 2) to the controller 25, which then provides the read data to the host 31.
5. Turn off the select devices ($Q_{12}$, $Q_{22}$ and $Q_{32}$) by removing the voltage from the row select line ($SG_2$), in order to disconnect the local bit lines from the global bit lines, and return the selected word line ($WL_{12}$) to the voltage $V_R$.

Parasitic currents during such a read operation have two undesirable effects. As with programming, parasitic currents place increased demands on the memory system power supply. In addition, it is possible for parasitic currents to exist that are erroneously included in the currents though the addressed memory elements that are being read. This can therefore lead to erroneous read results if such parasitic currents are large enough.

As in the programming case, all of the local bit lines except the selected row ($LBL_{12}$, $LBL_{22}$ and $LBL_{32}$ in the example of FIG. 5) are floating. But the potential of the floating local bit lines may be driven to $V_R$ by any memory element that is in its programmed (low resistance) state and connected between a floating local bit line and a word line at $V_R$, in any plane. A parasitic current comparable to $I_{P1}$ in the programming case (FIG. 4) is not present during data read because both the selected local bit lines and the adjacent non-selected word lines are both at $V_R$. Parasitic currents may flow, however, through low resistance memory elements connected between floating local bit lines and the selected word line. These are comparable to the currents $I_{P2}$, $I_{P3}$, and $I_{P4}$ during programming (FIG. 4), indicated as $I_{P5}$, $I_{P6}$ and $I_{P7}$ in FIG. 5. Each of these currents can be equal in magnitude to the maximum read current through an addressed memory element. However, these parasitic currents are flowing from the word lines at the voltage $V_R$ to the selected word line at a voltage $V_R \pm V\text{sense}$ without flowing through the sense amplifiers. These parasitic currents will not flow through the selected local bit lines ($LBL_{12}$, $LBL_{22}$ and $LBL_{32}$ in FIG. 5) to which the sense amplifiers are connected. Although they contribute to power dissipation, these parasitic currents do not therefore introduce a sensing error.

Although the neighboring word lines should be at $V_R$ to minimize parasitic currents, as in the programming case it may be desirable to weakly drive these word lines or even allow them to float. In one variation, the selected word line and the neighboring word lines can be pre-charged to $V_R$ and then allowed to float. When the sense amplifier is energized, it may charge them to $V_R$ so that the potential on these lines is accurately set by the reference voltage from the sense amplifier (as opposed to the reference voltage from the word line driver). This can occur before the selected word line is changed to $V_R \pm V\text{sense}$ but the sense amplifier current is not measured until this charging transient is completed.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In one embodiment, multiple reference cells may be contained within each page. The number of such cells may be only a few (less than 10), or may be up to a several percent of the total number of cells within each page. In this case, the reference cells are typically reset and written in a separate operation independent of the data within the page. For example, they may be set one time in the factory, or they may be set once or multiple times during operation of the memory array. During a reset operation described above, all of the global bit lines are set low, but this can be modified to only set the global bit lines associated with the memory elements being reset to a low value while the global bit lines associated with the reference cells are set to an intermediate value, thus inhibiting them from being reset. Alternately, to reset reference cells within a given block, the global bit lines associated with the reference cells are set to a low value while the global bit lines associated with the data cells are set to an intermediate value. During programming, this process is reversed and the global bit lines associated with the reference cells are raised to a high value to set the reference cells to a desired ON resistance while the memory elements remain in the reset state. Typically the programming voltages or times will be changed to program reference cells to a higher ON resistance than when programming memory elements.

If, for example, the number of reference cells in each page is chosen to be 1% of the number of data storage memory elements, then they may be physically arranged along each word line such that each reference cell is separated from its neighbor by 100 data cells, and the sense amplifier associated with reading the reference cell can share its reference information with the intervening sense amplifiers reading data. Reference cells can be used during programming to ensure the data is programmed with sufficient margin. Further information regarding the use of reference cells within a page can be found in U.S. Pat. Nos. 6,222,762, 6,538,922, 6,678,192 and 7,237,074.

In a particular embodiment, reference cells may be used to approximately cancel parasitic currents in the array. In this case the value of the resistance of the reference cell(s) is set to that of the reset state rather than a value between the reset state and a data state as described earlier. The current in each reference cell can be measured by its associated sense amplifier and this current subtracted from neighboring data cells. In this case, the reference cell is approximating the parasitic currents flowing in a region of the memory array that tracks and is similar to the parasitic currents flowing in that region of the array during a data operation. This correction can be applied in a two step operation (measure the parasitic current in the reference cells and subsequently subtract its value from that obtained during a data operation) or simultaneously with the data operation. One way in which simultaneous operation is possible is to use the reference cell to adjust the timing or reference levels of the adjacent data sense amplifiers. An example of this is shown in U.S. Pat. No. 7,324,393.

In conventional two-dimensional arrays of variable resistance memory elements, a diode is usually included in series with the memory element between the crossing bit and word lines. The primary purpose of the diodes is to reduce the number and magnitudes of parasitic currents during resetting (erasing), programming and reading the memory elements. A significant advantage of the three-dimensional array herein is that resulting parasitic currents are fewer and therefore have a reduced negative effect on operation of the array than in other types of arrays.

Diodes may also be connected in series with the individual memory elements of the three-dimensional array, as currently done in other arrays of variable resistive memory elements, in order to reduce further the number of parasitic currents but there are disadvantages in doing so. Primarily, the manufacturing process becomes more complicated. Added masks and added manufacturing steps are then necessary. Also, since formation of the silicon p-n diodes often requires at least one high temperature step, the word lines and local bit lines cannot then be made of metal having a low melting point, such as aluminum that is commonly used in integrated circuit manufacturing, because it may melt during the subsequent high temperature step. Use of a metal, or composite material including a metal, is preferred because of its higher conductivity than the conductively doped polysilicon material that is typically used for bit and word lines because of being exposed to such high temperatures. An example of an array of resistive switching memory elements having a diode formed as part of the individual memory elements is given in patent application publication no. US 2009/0001344 A1.

Because of the reduced number of parasitic currents in the three-dimensional array herein, the total magnitude of parasitic currents can be managed without the use of such diodes. In addition to the simpler manufacturing processes, the absence of the diodes allows bi-polar operation; that is, an operation in which the voltage polarity to switch the memory element from its first state to its second memory state is opposite of the voltage polarity to switch the memory element from its second to its first memory state. The advantage of the bi-polar operation over a unipolar operation (same polarity voltage is used to switch the memory element from its first to second memory state as from its second to first memory state) is the reduction of power to switch the memory element and an improvement in the reliability of the memory element. These advantages of the bi-polar operation are seen in memory elements in which formation and destruction of a conductive filament is the physical mechanism for switching, as in the memory elements made from metal oxides and solid electrolyte materials. For these reasons, the embodiments discussed below utilize memory elements that include resistance switching material and do not include a diode or other separate steering device. The use of memory elements that have a non-linear current vs voltage relationship are also envisioned. For example as the voltage across a HfOx memory element is reduced from the programming voltage to one half the programming voltage the current is reduced by a factor of 5 or even more. In such an embodiment the total magnitude of parasitic currents can be managed without the use of diodes in the array.

The level of parasitic currents increases with the number of planes and with the number of memory elements connected along the individual word lines within each plane. The increase in parasitic currents increases only slightly with additional planes because the selected word line is on only one plane such as WL12 in FIG. 4. Parasitic currents Ip1, Ip2, Ip3, and Ip4 are all on the plane that contains WL12. Leakage currents on other planes are less significant because the floating lines tend to minimize currents on elements not directly connected to the selected word line. Also since the number of unselected word lines on each plane does not significantly affect the amount of parasitic current, the planes may individually include a large number of word lines. The parasitic currents resulting from a large number of memory elements connected along the length of individual word lines can further be managed by segmenting the word lines into sections of fewer numbers of memory elements. Erasing, programming and reading operations are then performed on the memory elements connected along one segment of each word line instead of the total number of memory elements connected along the entire length of the word line.

The re-programmable non-volatile memory array being described herein has many advantages. The quantity of digital data that may be stored per unit of semiconductor substrate area is high. It may be manufactured with a lower cost per stored bit of data. Only a few masks are necessary for the entire stack of planes, rather than requiring a separate set of masks for each plane. The number of local bit line connections with the substrate is significantly reduced over other multi-plane structures that do not use the vertical local bit lines. The architecture eliminates the need for each memory element to have a diode in series with the resistive memory element, thereby further simplifying the manufacturing process and enabling the use of metal conductive lines. Also, the voltages necessary to operate the array are much lower than those used in current commercial flash memories.

Since at least one-half of each current path is vertical, the voltage drops present in large cross-point arrays are significantly reduced. The reduced length of the current path due to the shorter vertical component means that there are approximately one-half the number memory elements on each current path and thus the leakage currents are reduced as is the number of unselected memory elements disturbed during a data programming or read operation. For example, if there are N cells associated with a word line and N cells associated with a bit line of equal length in a conventional array, there are 2N cells associated or "touched" with every data operation. In the vertical local bit line architecture described herein, there are n cells associated with the bit line (n is the number of planes and is typically a small number such as 4 to 16), or N+n cells are associated with a data operation. For a large N this means that the number of cells affected by a data operation is approximately one-half as many as in a conventional three-dimensional array.

Materials Useful for the Memory Storage Elements

The material used for the non-volatile memory elements $M_{zxy}$ in the array of FIG. 1 can be a chalcogenide, a metal oxide, CMO, or any one of a number of materials that exhibit a stable, reversible shift in resistance in response to an external voltage applied to or current passed through the material.

Metal oxides are characterized by being insulating when initially deposited. One suitable metal oxide is a titanium oxide ($TiO_x$) in which near-stoichiometric $TiO_2$ bulk material is altered in an annealing process to create an oxygen deficient layer (or a layer with oxygen vacancies) in proximity of the bottom electrode. The top platinum electrode for memory storage element comprising $TiO_x$, with its high work function, creates a high potential $Pt/TiO_2$ barrier for electrons. As a result, at moderate voltages (below one volt), a very low current will flow through the structure. The bottom $Pt/TiO_{2-x}$ barrier is lowered by the presence of the oxygen vacancies ($O^+_2$) and behaves as a low resistance contact (ohmic contact). (The oxygen vacancies in $TiO_2$ are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier $Pt/TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure. Under this positive bias, the oxygen vacancies move away from the proximity of the top $Pt/TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile memory elements $M_{zxy}$ in the array of FIG. 1 include HfOx, ZrOx, WOx, NiOx, CoOx, CoalOx, MnOx, $ZnMn_2O_4$, ZnOx, TaOx, NbOx, HfSiOx, HfAlOx. Suitable top electrodes include metals with a high work function (typically>4.5 eV) capable to getter oxygen in contact with the metal oxide to create oxygen vacancies at the contact. Some examples are TaCN, TiCN, Ru, RuO, Pt, Ti rich TiOx, TiAlN, TaAlN, TiSiN, TaSiN, $IrO_2$ and doped polysilicon. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 2 nm to 20 nm.

One example non-volatile memory element uses Hafnium Oxide (e.g., $HfO_2$) as a reversible resistance-switching material, and positions the reversible resistance-switching material between two electrodes. A first electrode is positioned between reversible resistance-switching material and a first conductor (e.g. bit line or word line). In one embodiment, the first electrode is made of platinum. The second electrode is positioned between reversible resistance-switching material a second conductor (e.g, bit line or word line). In one embodiment, the second electrode is made of Titanium Nitride, and serves as a barrier layer. In another embodiment, the second electrode is n+ doped polysilicon and the first electrode is Titanium Nitride. Other materials can also be used. The technologies described below are not restricted to any one set of materials for forming the non-volatile memory elements.

In another embodiment, the memory storage element will include Hafnium Oxide (or different metal oxide or different material) as the reversible resistance-switching material, without any electrodes being positioned between the reversible resistance-switching material and the conductors (e.g., bit lines and/or word lines).

Another class of materials suitable for the memory storage elements is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS2)_{1-x}$. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and sp$^3$ hybridizations. In the sp$^3$ configuration, the carbon valence electrons are kept in strong covalent bonds and as a result the sp$^3$ hybridization is non-conductive. Carbon films in which the sp$^3$ configuration dominates, are commonly referred to as tetrahedral-amorphous carbon, or diamond like. In the sp$^2$ configuration, not all the carbon valence electrons are kept in covalent bonds. The weak tight electrons (phi bonds) contribute to the electrical conduction making the mostly sp$^2$ configuration a conductive carbon material. The operation of the carbon resistive switching nonvolatile memories is based on the fact that it is possible to transform the sp$^3$ configuration to the sp$^2$ configuration by applying appropriate current (or voltage) pulses to the carbon structure. For example, when a very short (1-5 ns) high amplitude voltage pulse is applied across the material, the conductance is greatly reduced as the material sp$^2$ changes into an sp$^3$ form ("reset" state). It has been theorized that the high local temperatures generated by this pulse causes disorder in the material and if the pulse is very short, the carbon "quenches" in an amorphous state (sp$^3$ hybridization). On the other hand, when in the reset state, applying a lower voltage for a longer time (~300 nsec) causes part of the material to change into the sp$^2$ form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNT's within an inert binder matrix to form a fabric of CNT's. These can be deposited on a silicon wafer using a spin-on or spray coating, and as applied the CNT's have a random orientation with respect to each other. When an electric field is applied across this fabric, the CNT's tend to flex or align themselves such that the conductivity of the fabric is changed. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where it is desirable to include steering elements. The diode can be a p-n junction (not necessarily of silicon), a metal/insulator/insulator/metal (MIIM), or a Schottky type metal/semiconductor contact but can alternately be a solid electrolyte element. A characteristic of this type of diode is that for correct operation in a memory array, it is necessary to be switched "on" and "off" during each address operation. Until the memory element is addressed, the diode is in the high resistance state ("off" state) and "shields" the resistive memory element from disturb voltages. To access a resistive memory element, three different operations are needed: a) convert the diode from high resistance to low resistance, b) program, read, or reset (erase) the memory element by application of appropriate voltages across or currents through the diode, and c) reset (erase) the diode. In some embodiments one or more of these operations can be combined into the same step. Resetting the diode may be accomplished by applying a reverse voltage to the memory element including a diode, which causes the diode filament to collapse and the diode to return to the high resistance state.

For simplicity the above description has consider the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC). The principles of such operation are described in U.S. Pat. No. 5,172,338 referenced earlier. Examples of MLC technology applied to three dimensional arrays of memory elements include an article entitled "Multi-bit Memory Using Programmable Metallization Cell Technology" by Kozicki et al., Proceedings of the International Conference on Electronic Devices and Memory, Grenoble, France, Jun. 12-17, 2005, pp. 48-53 and "Time Discrete Voltage Sensing and Iterative Programming Control for a 4F2 Multilevel CBRAM" by Schrogmeier et al. (2007 Symposium on VLSI Circuits).

Structural Example of the Three-Dimensional Array

Figure 6:
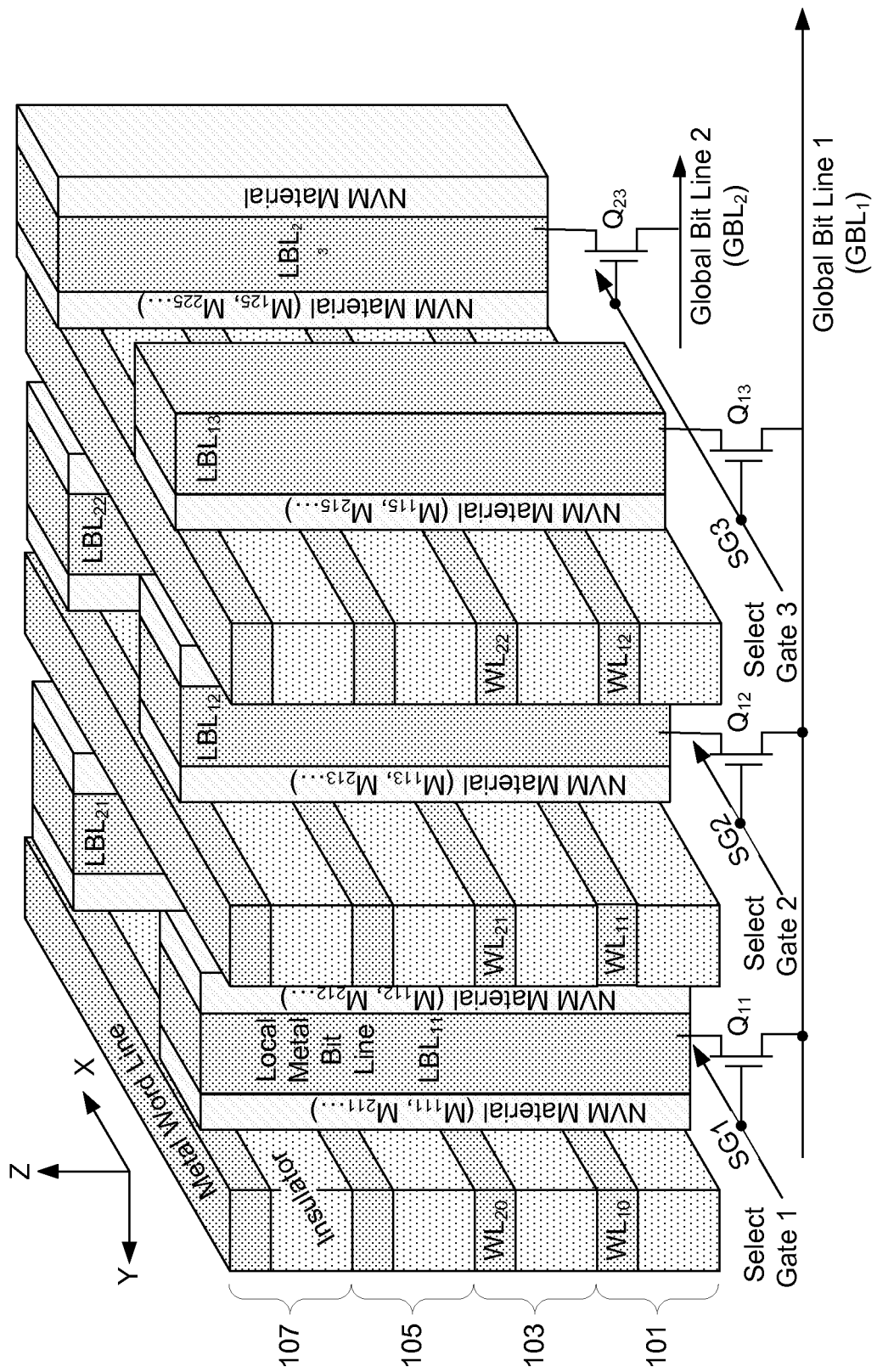
FIG. 6 is an isometric view of a portion of the three-dimensional array shown in FIG. 1 according to a first specific example of an implementation thereof.

One example semiconductor structure for implementing the three-dimensional memory element array of FIG. 1 is illustrated in FIG. 6, which is configured for use of non-volatile memory element (NVM) material that is non-conductive when first deposited. A metal oxide of the type discussed above has this characteristic. Since the material is initially non-conductive, there is no necessity to isolate the memory elements at the cross-points of the word and bit lines from each other. Several memory elements may be implemented by a single continuous layer of material, which in the case of FIG. 6 are strips of NVM material oriented vertically along opposite sides of the vertical bit lines in the y-direction and extending upwards through all the planes. A significant advantage of the structure of FIG. 6 is that all word lines and strips of insulation under them in a group of planes may be defined simultaneously by use of a single mask, thus greatly simplifying the manufacturing process.

Referring to FIG. 6, a small part of four planes 101, 103, 105 and 107 of the three-dimensional array are shown. Elements of the FIG. 6 array that correspond to those of the equivalent circuit of FIG. 1 are identified by the same reference numbers. It will be noted that FIG. 6 shows the two planes 1 and 2 of FIG. 1 plus two additional planes on top of them. All of the planes have the same horizontal pattern of conductor, dielectric and NVM material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be conventional CMOS transistors (or vertical MOSFET thin film transistors, or Junction FET, or npn transistors) and fabricated using the same process as used to form the other conventional circuitry. In the case of using npn transistors instead of MOS transistors, the row select line (SG) lines are replaced with the base contact electrode lines elongated in the x-direction. Also fabricated in the substrate but not shown in FIG. 6 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

In one embodiment, the NVM material includes Hafnium Oxide, the word lines comprise TiN, and the bit lines comprise N+ silicon.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

An outline of a process for fabricating the structure of FIG. 6 is as follows:

1. The support circuitry, including the select devices Q, global bit lines GBL, row select lines SG and other circuits peripheral to the array, is formed in the silicon substrate in a conventional fashion and the top surface of this circuitry is planarized, such as by etching with use of a layer of etch stop material placed over the circuitry.
2. Alternating layers of dielectric (insulator) and metal are formed as sheets on top of each other and over at least the area of the substrate in which the select devices Q are formed. In the example of FIG. 6, four such sheets are formed.
3. These sheets are then etched (isolated) by using a mask formed over the top of them that has slits elongated in the x-direction and spaced apart in the y-direction. All of the material is removed down to the etch stop in order to form the trenches shown in FIG. 6 in which the local bit line (LBL) pillars and NVM material is later formed. Contact holes are also etched through the etch stop material layer at the bottom of the trenches to allow access to the drains of the select devices Q at the positions of the subsequently formed pillars. The formation of the trenches also defines the width in the y-direction of the word lines (WL).
4. NVM material is deposited in thin layers along the sidewalls of these trenches and across the structure above the trenches. This leaves the NVM material along the opposing sidewalls of each of the trenches and in contact with the word line (WL) surfaces that are exposed into the trenches.
5. Doped poly silicon (or suitable metallic electrode material) is then deposited in these trenches in order to make contact with the NVM material. The deposited material is patterned using a mask with slits in the y-direction. Removal of the deposited material by etching through this mask leaves the local bit line (LBL) pillars. The NVM material in the x-direction may also be removed between pillars. The space between pillars in the x-direction is then filled with a dielectric material and planarized back to the top of the structure.

A significant advantage of the configuration of FIG. 6 is that only one etching operation through a single mask is required to form the trenches through all the layers of material of the planes at one time. However, process limitations may limit the number of planes that can be etched together in this manner. If the total thickness of all the layers is too great, the trench may need to be formed in sequential steps. A first number of layers are etched and, after a second number of layers have been formed on top of the first number of trenched layers, the top layers are subjected to a second etching step to form trenches in them that are aligned with the trenches in the bottom layers. This sequence may be repeated even more times for an implementation having a very large number of layers.

Vertical Switches

To enable the memory to be denser (e.g., more memory elements per area), the size of the memory elements can be made smaller and the memory elements can be arranged closer to each other than in the past. To enable the memory elements to be closer to each other, one embodiment uses a vertically oriented select device (e.g., three terminal switch and/or select transistor) for connecting the individual local bit line pillars to the respective global bit lines. For example, the select devices $Q_{11}, Q_{12}, \ldots, Q_{21}, Q_{22}, \ldots$ of FIG. 1 can be implemented as vertically oriented select devices. In one embodiment, each vertically oriented select device is a pillar select device that is formed as a vertical structure, switching between a local bit line pillar and a global bit line. The pillar select devices, unlike previous embodiments where they are formed within a CMOS layer, are in the present embodiments formed in a separate layer (pillar select layer) above the CMOS layer/substrate, along the z-direction between the array of global bit lines and the array of local bit lines. The CMOS layer is the substrate where the support circuitry is implemented, including the row select circuit and word line drivers. The use of vertically oriented select devices above, but not in, the substrate allows the memory elements to be arranged in a more compact fashion, thereby increasing density. Additionally, positioning the vertically oriented select devices above the substrate allows for other devices (e.g., the word line drivers) to be positioned in the substrate under the memory array rather than outside of the array, which allows the integrated circuit to be smaller.

For example, a pillar shaped Thin Film Transistor (TFT) FET or JFET can be can be used as the select device. In one example implementation, a control node of the select transistor has a collar shaped hole, and the gate and channel region are formed in the hole with the source/drain regions formed above/below the channel region. Another alternative is to define the gates as a rail etch and have the channel deposited in a trench between the gates and singulated by an etch with crossing lines mask (rather than holes).

Figure 7:
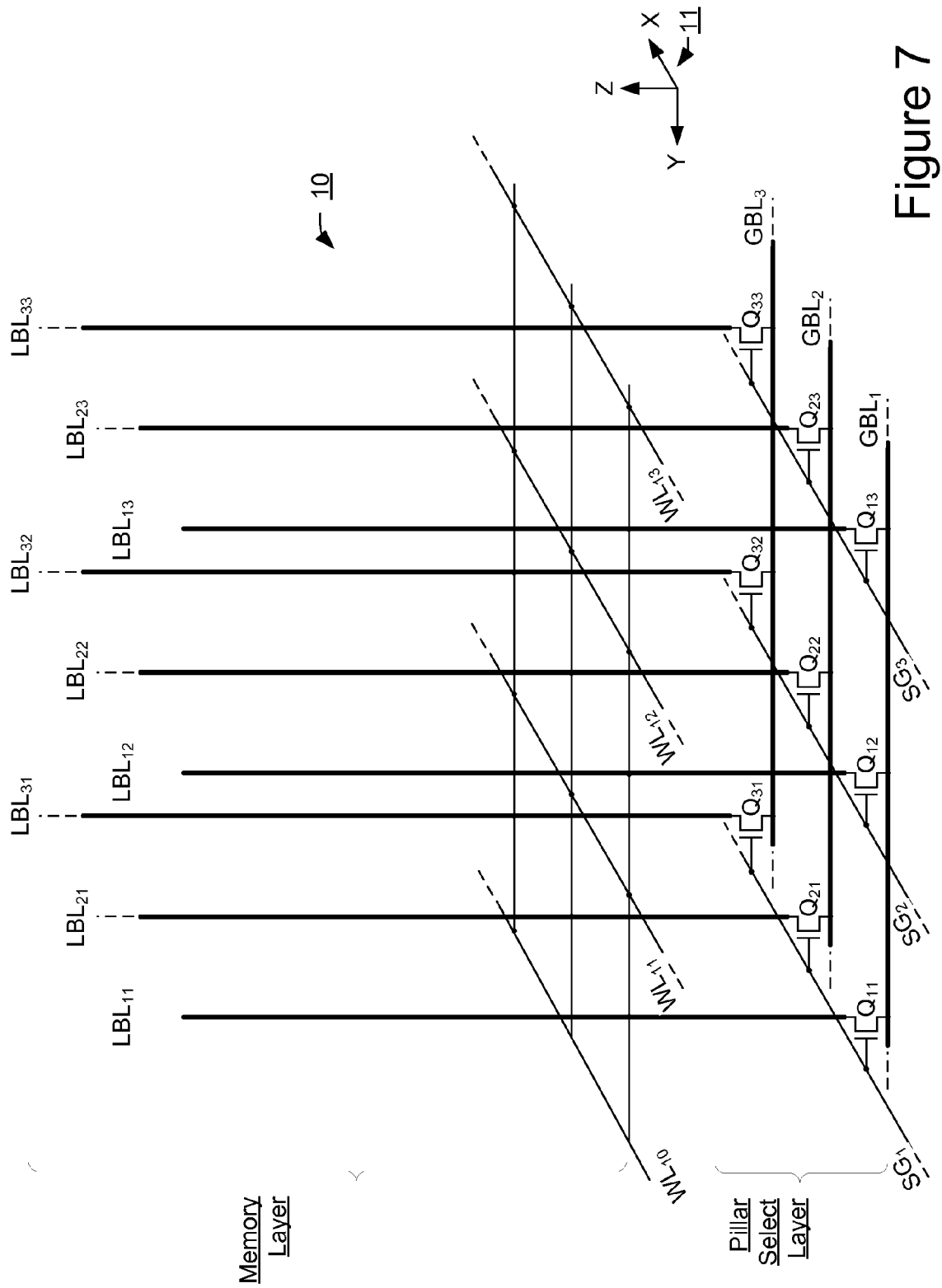
FIG. 7 is an equivalent circuit of a portion of an example three-dimensional array of variable resistance memory elements, wherein the array has vertical bit lines and a pillar select layer, both of which are above (and not in) the substrate.

FIG. 7 illustrates schematically the three dimensional memory ("3D memory") comprising of a memory layer on top of a pillar select layer. The 3D memory 10 is formed on top of a CMOS substrate (not shown explicitly) where structures in the CMOS are referred to as being in the FEOL ("Front End of Lines"). The vertically oriented select devices switching individual vertical bit lines (that are above and not in the substrate) to individual global bit lines are now formed on top of the FEOL layer in the BEOL ("Back End of Lines"). Thus, the BEOL comprises of the pillar select layer with the memory layer on top of it. The vertically oriented select devices (such as $Q_{11}, Q_{12}, \ldots, Q_{21}, Q_{22}, \ldots$, etc) are formed in the pillar select layer as vertically oriented select devices. The pillar select layer is formed above (and not in) the substrate. The memory layer is similar to that described above, comprising of multiple layers of word lines and memory elements. For simplicity, FIG. 7 shows only one layer of word lines, such as $WL_{10}$, $W_{11}, \ldots$, etc without showing the memory elements that exist between each crossing of a word line and a bit line.

Figure 8B:
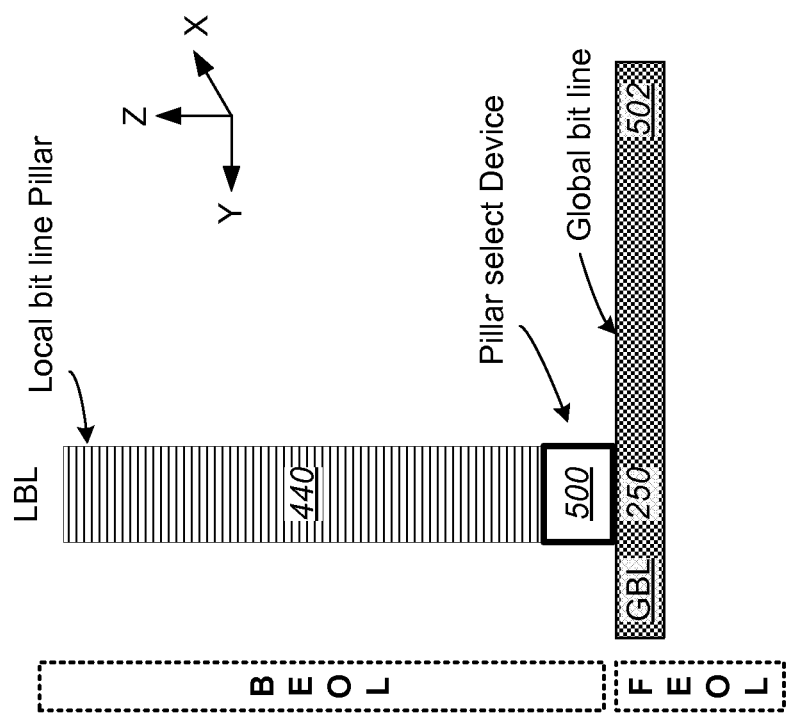
FIG. 8B is plan view that depicts a vertical bit line, a vertically oriented select device and a global bit line.
Figure 8A:
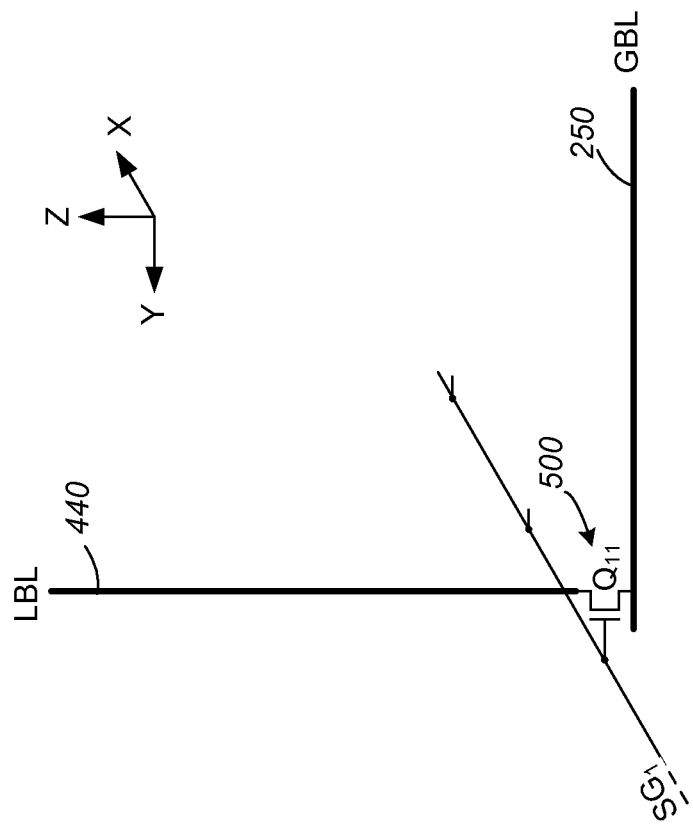
FIG. 8A is a schematic that depicts a vertical bit line, a vertically oriented select device and a global bit line.

FIG. 8A illustrates a schematic circuit diagram of a given vertically oriented select device switching a local bit line to a global bit line. In the example, the local bit line LBL 440 is switchable to the global bit line GBL 250 by a vertically oriented select transistor 500 such as $Q_{11}$. The gate of the select transistor $Q_{11}$ is controllable by a signal exerted on a row select line $SG_1$.

FIG. 8B illustrates the structure of the vertically oriented select device in relation to the local bit line and the global bit line. The global bit line such as GBL 250 is formed below the vertically oriented select device, in the FEOL as part of the metal layer-1 or metal layer-2 502. The vertically oriented select device in the form of the vertical active TFT transistor 500 (e.g., vertically oriented channel MOS TFT or vertically oriented channel JFET) is formed in the BEOL layer on top of the GBL 250 (and above, but not in, the substrate). The local bit line LBL 440, in the form of a pillar, is formed on top of the vertically oriented select device 500. In this way, the vertically oriented select device 500 can switch the local bit line pillar LBL to the global bit line GBL.

Figure 9:
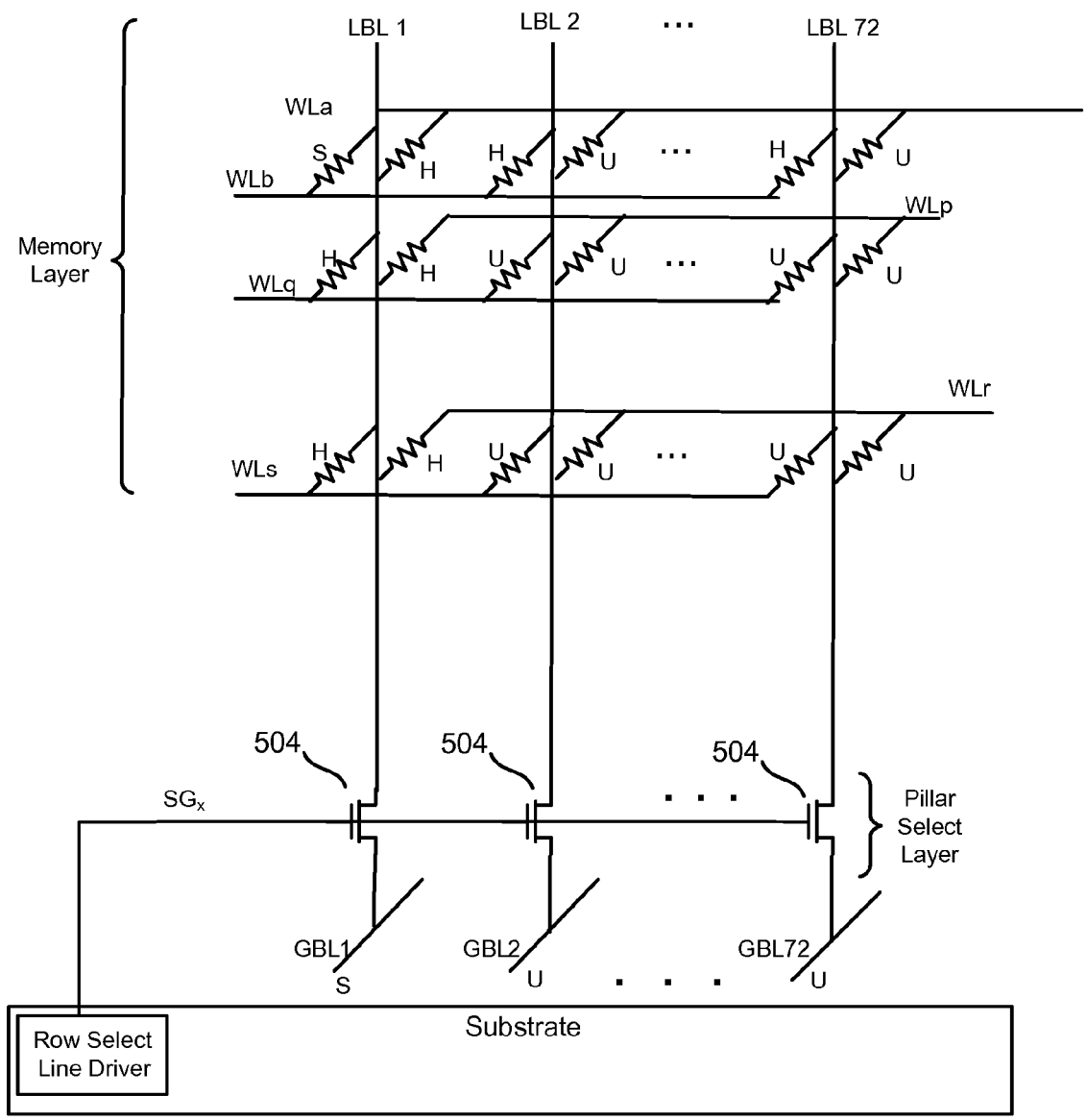
FIG. 9 is a schematic of a portion of the memory system, depicting vertical bit lines above the substrate, vertically oriented select devices above the substrate and row select line drivers in the substrate.

FIG. 9 shows a portion of the memory system, with the memory elements being depicted as resistors (due to their reversible resistance switching properties). FIG. 9 shows the Pillar Select Layer below the Memory Layer and above (and not in) the Substrate. Only a portion of the Memory Layer is illustrated. For example, FIG. 9 shows bit lines LBL1, LBL2, . . . LBL72. In this embodiment each of the word lines are connected to 72 memory elements. Each of the memory elements is connected between a word line and a bit line. Therefore, there will be 72 memory elements connected to the same word line and different bit lines (of the 72 bit lines in a row). Each of the bit lines are connected to a respective global bit line by one of the vertically oriented select devices 504 of the Pillar Select Layer. The signal $SG_x$ driving the set of vertically oriented select devices 504 depicted in FIG. 9 is controlled by the Row Select Line Driver. Note that the Row Select Line Driver is implemented in the substrate. The global bit lines (GBL1, GBL2, . . . GBL72) are implemented in the metal lines above the substrate. FIG. 9 shows one slice taken along the word line direction such that each of the bit lines depicted in FIG. 9 are connected to different global bit lines via the vertically oriented select devices 504.

In one embodiment, pairs of neighboring word lines (e.g., WLa and WLb, WLp and WLq, WLr and WLs) will be connected to memory elements that are in turn connected to common bit lines. FIG. 9 shows three pairs of word lines (WLa and WLb, WLp and WLq, WLr and WLs), with each of the pair being on a different layer of the memory structure. In one illustrative embodiment, the word lines receive address dependent signals such a that word line WLb is selected for memory operation while word lines WLa, WLp, WLq, WLr and WLs are not selected. Although the enabling signal applied on row select line $SG_X$ causes all of the vertically oriented select devices 504 to connect the respective global bit lines to the respective local bit lines of FIG. 9, only the global bit line GLBL1 includes a data value for programming (as noted by the S). Global bit lines GLBL2 and GLBL72 do not include data for programming (as noted by the U). This can be due to the data pattern being stored as the global bit lines receive data dependent signals. Note that while SGx receive an enable signal, other select lines receive a disable signal to turn off the connected select devices.

Because local bit line LBL 1 and word line WLb are both selected for programming, the memory element between local bit line LBL1 and word line WLb is selected for the memory operation (as noted by the S). Since local bit line LBL1 is the only bit line with program data, the other memory elements connected to WLb will be half selected (as noted by H). By half selected, it is meant that one of the control lines (either the bit line or the word line) is selected but the other control line is not selected. A half selected memory element will not undergo the memory operation. The word line WLa is not selected; therefore, the memory cell between WLa and local bit line LBL1 is half selected, and the other memory elements on WLa are unselected. Since word lines WLp, WLq, WLr and WLs are not selected, their memory elements connected to LBL1 are half selected and the other memory elements connected to those word lines are unselected.

Figure 10:
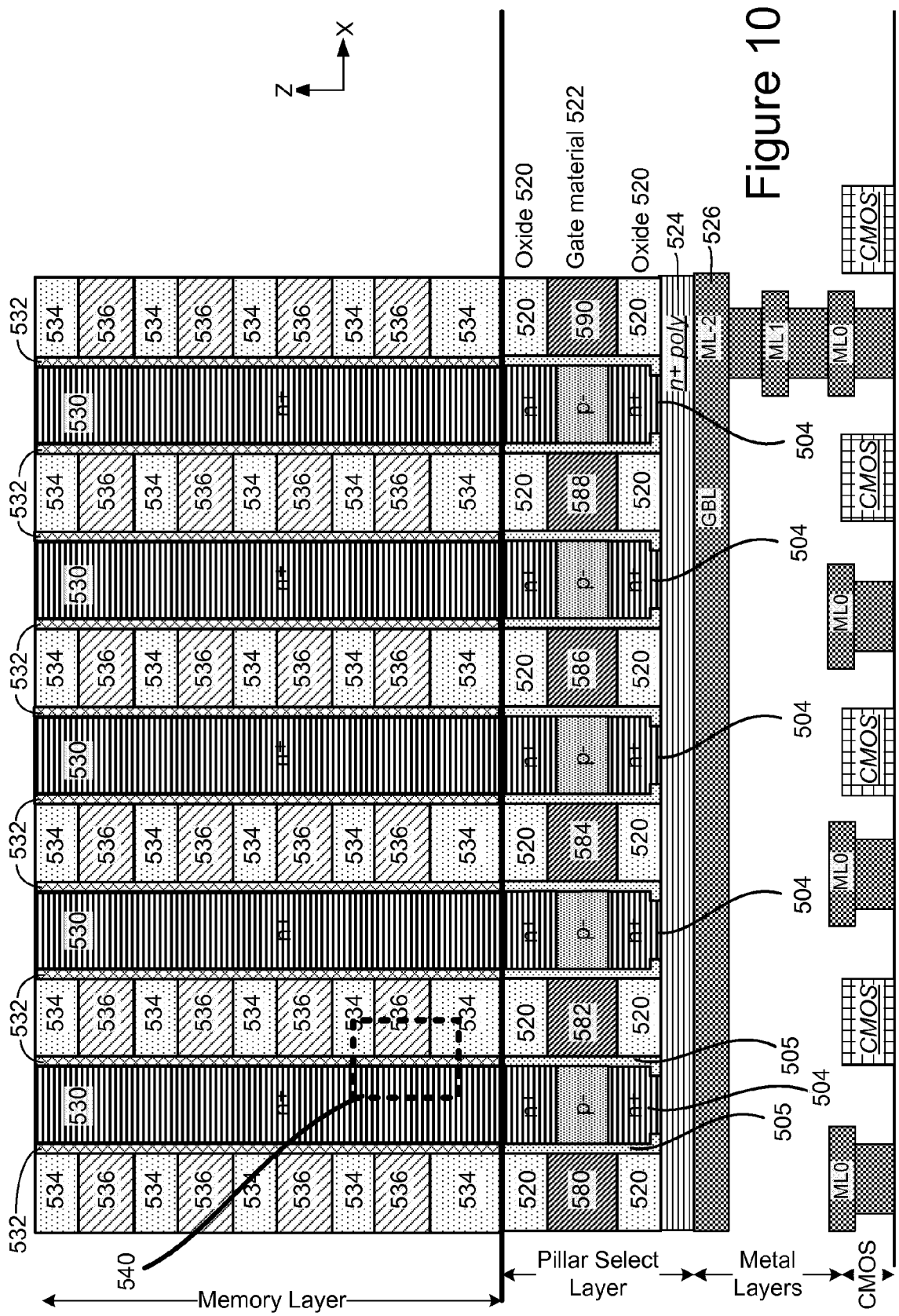
FIG. 10 illustrates one embodiment of a memory structure with vertical local bit lines above the substrate and vertically oriented select devices above the substrate that connect the bit lines to global bit lines.

FIG. 10 is a cross-sectional view of a memory structure using the vertically oriented select device discussed above and the memory structure of FIG. 6. As described below, the memory structure of FIG. 10 is a continuous mesh array of memory elements because there are memory elements connected to both sides of the bit lines and memory elements connected to both sides of the word lines. At the bottom of FIG. 10, the CMOS substrate is depicted. Implemented on the top surface of the CMOS structure are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, . . . of FIG. 1), which are labeled in FIG. 10 as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate. Directly below each vertical bit line 530 are the vertically oriented select devices 504, each of which comprises (in one example embodiment) a n+/p-/n+ TFT. Each of the vertically oriented select devices 504 have oxide layers 505 on each side. FIG. 10 also shows an n+ polysilicon layer 524. As can be seen, the npn TFT of vertically oriented select devices 504 can be used to connect the global bit line GBL (layer 526) with any of the vertical bit lines 530.

FIG. 10 shows six row select lines ($SG_x$) 580, 582, 584, 586, 588 and 590 in the gate material layer 522, each underneath a stack of multiple word lines. As can be seen, each of the row select lines 580, 582, 584, 586, 588 and 590 is positioned between two vertically oriented select devices 504, above and not in the substrate. Therefore each row select line can serve as the gate signal to either of the two neighboring vertically oriented select devices 504; therefore, the vertically oriented select devices 504 are said to be double gated. Each vertically oriented select device 504 can be controlled by two different row select lines, in this embodiment.

Figure 11:
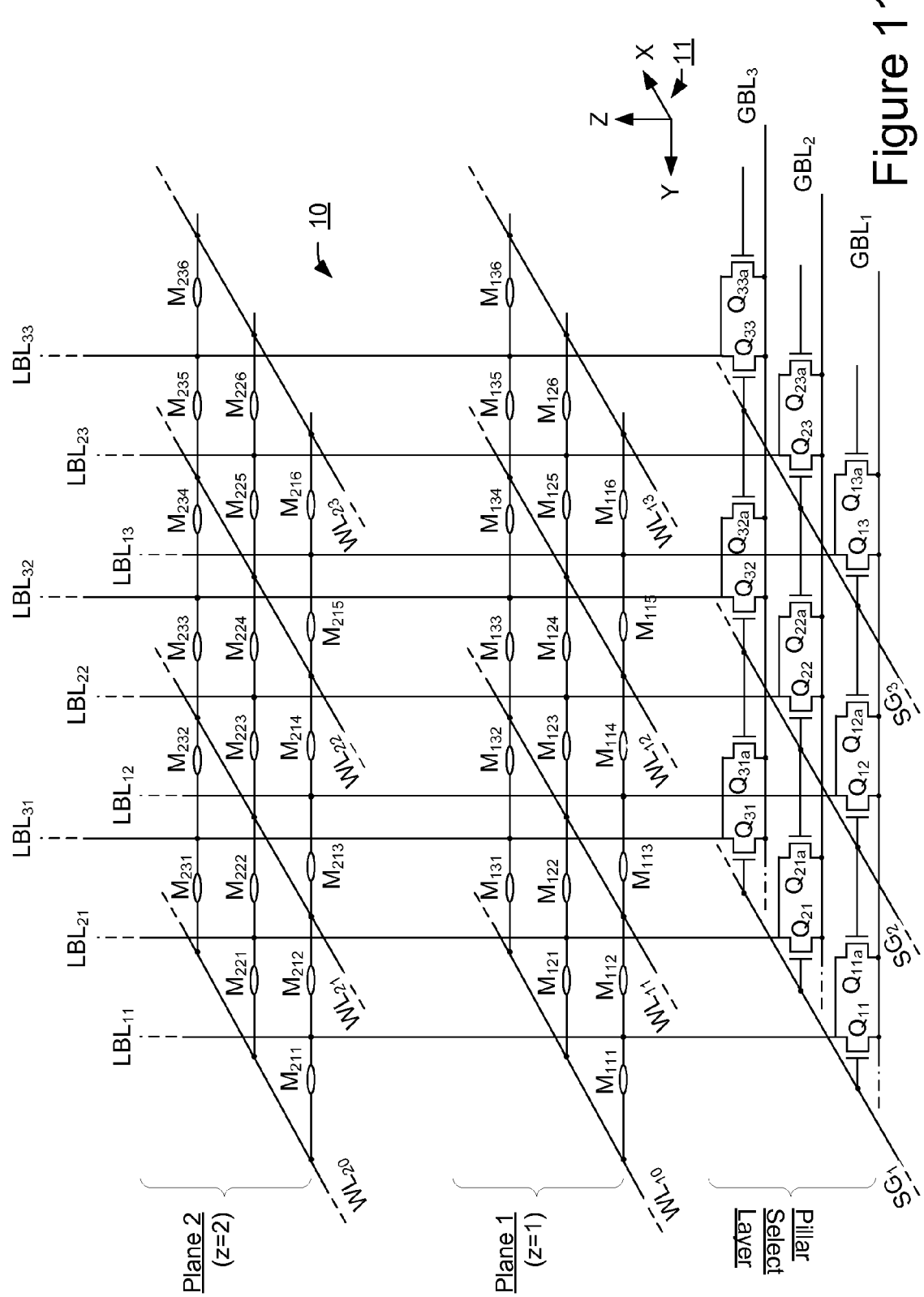
FIG. 11 is a schematic of a portion of the memory system, depicting vertical bit lines and vertically oriented select devices above the substrate.

FIG. 11 is a partial schematic of the memory system of FIG. 10 depicting the above-described double-gated structure for the vertically oriented select devices 504. Planes 1 and 2 of FIG. 11 are the same as in FIG. 1. As can be seen, each local bit line LBL is connectable to a respective global bit line GBL by two row select signals. FIG. 11 shows two transistors connecting to each local bit line. For example, transistor $Q_{11}$ can connect local bit line $LBL_{11}$ to global bit line $GBL_1$ in response to row select line $SG_1$ and transistor $Q_{11a}$ can connect local bit line $LBL_{11}$ to global bit line $GBL_1$ in response to row select line $SG_2$. The same structure is used for the other local bit lines depicted in FIG. 11.

Figure 12:
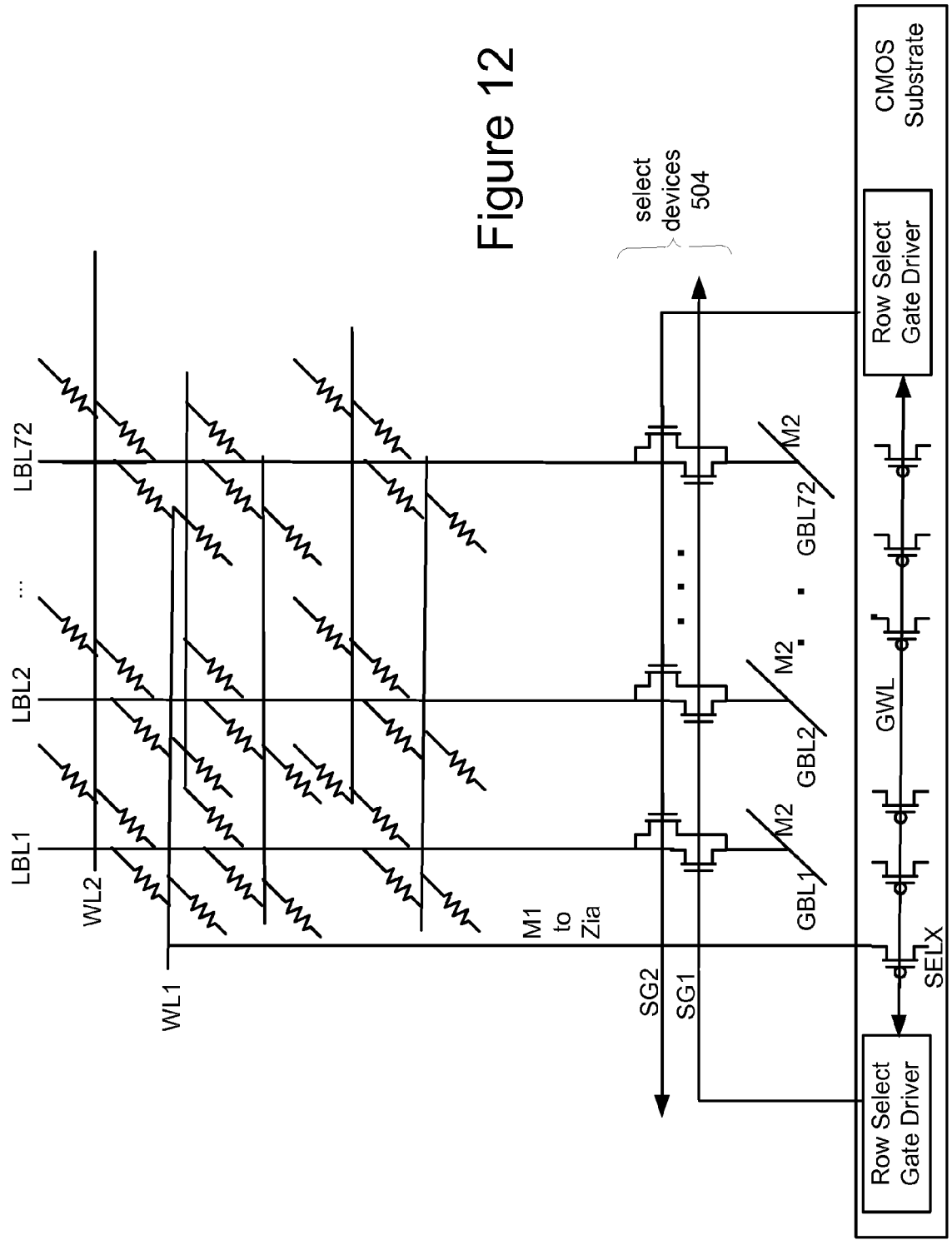
FIG. 12 is a schematic of a portion of the memory system, depicting vertical bit lines, vertically oriented select devices above the substrate and row select line drivers in the substrate.

FIG. 12 shows another partial schematic also depicting the double-gated structure such that each local bit line (LBL1, LBL2, . . . LBL72) are connected to their respective global bit lines (GBL1, GBL2, . . . GBL72) by any of two respective vertically oriented select devices that are positioned above the CMOS substrate. As can be seen, while the double-gated structure of FIG. 10 includes positioning the various select devices 504 above the substrate, the Row Select Line Drivers providing the row select lines $SG_1$, $SG_2$, . . . are positioned in the substrate. Similarly, the global word lines (e.g., GWL) are position in a metal layer on the substrate and below the vertically oriented select devices. Furthermore, as will be explained below, in one embodiment the Row Select Line Driver uses the appropriate global word line GWL as an input.

Figure 13:
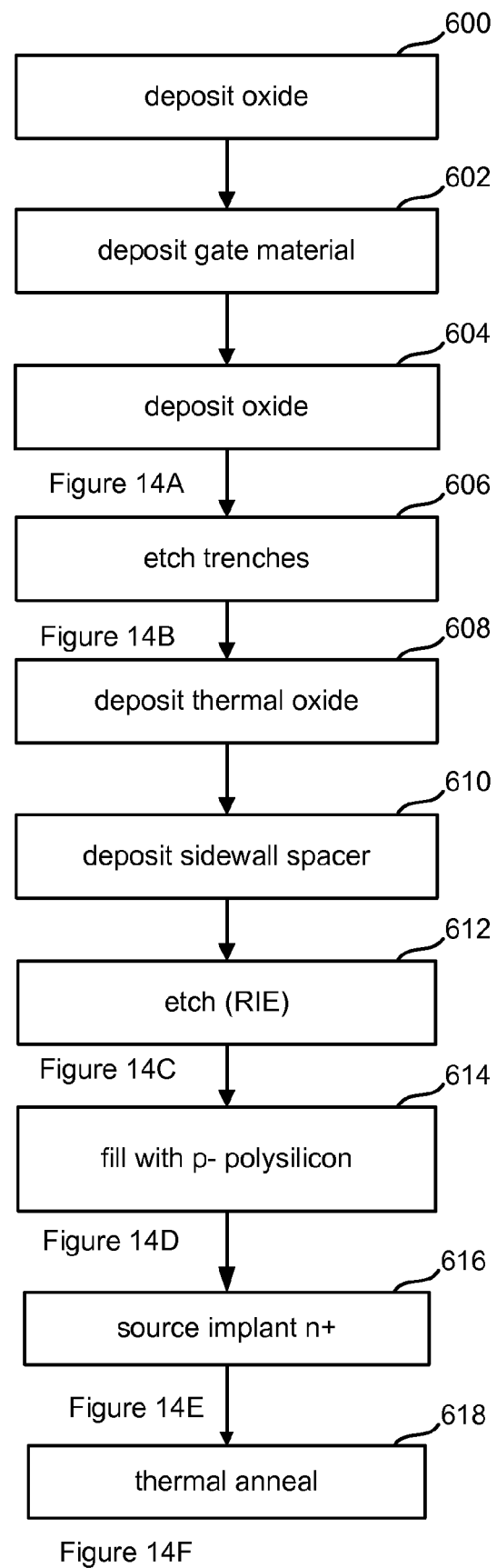
FIG. 13 is a flow chart describing one embodiment of a process for fabricating the structure of FIG. 10.
Figure 14A:
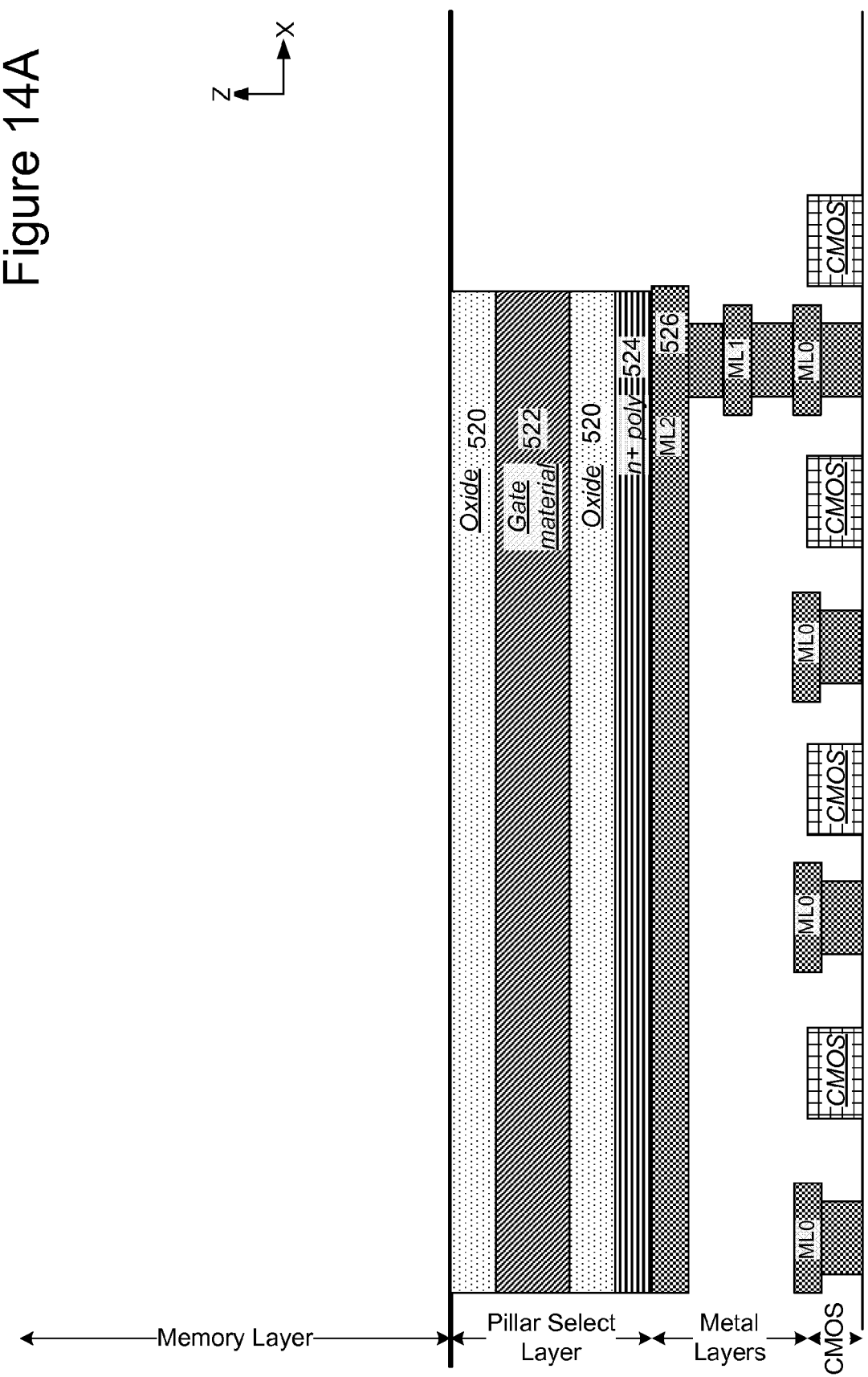

FIG. 13 is a flow chart describing one embodiment for manufacturing the Pillar Select Layer depicted in FIG. 10. This process can be performed after manufacturing the metal layers and substrate layers (e.g., drivers and other logic), and before manufacturing the memory layer. The substrate layers, metal layers and memory layers can be manufactured using other processes known and/or described elsewhere. In step 600, lower oxide layer 520 is deposited above the metal layer. For example, Chemical Vapor Deposition (CVD) can be used to deposit $SiO_2$. In one embodiment, the n+ polysilicon layer 524 is added prior to step 600. In step 602, gate material 522 is deposited on top of the lower oxide layer 520. For example, CVD can be used to deposit TiN. In step 604, upper oxide layer 520 is deposited on top of the gate material 522. For example, CVD can be used to deposit $SiO_2$. FIG. 14A depicts the structure after step 604. In one embodiment, the height of the oxide layers 520 is approximately 20 to 50 nanometers while the height of the gate material 522 is approximately 50 to 150 nanometers.

Figure 14B:
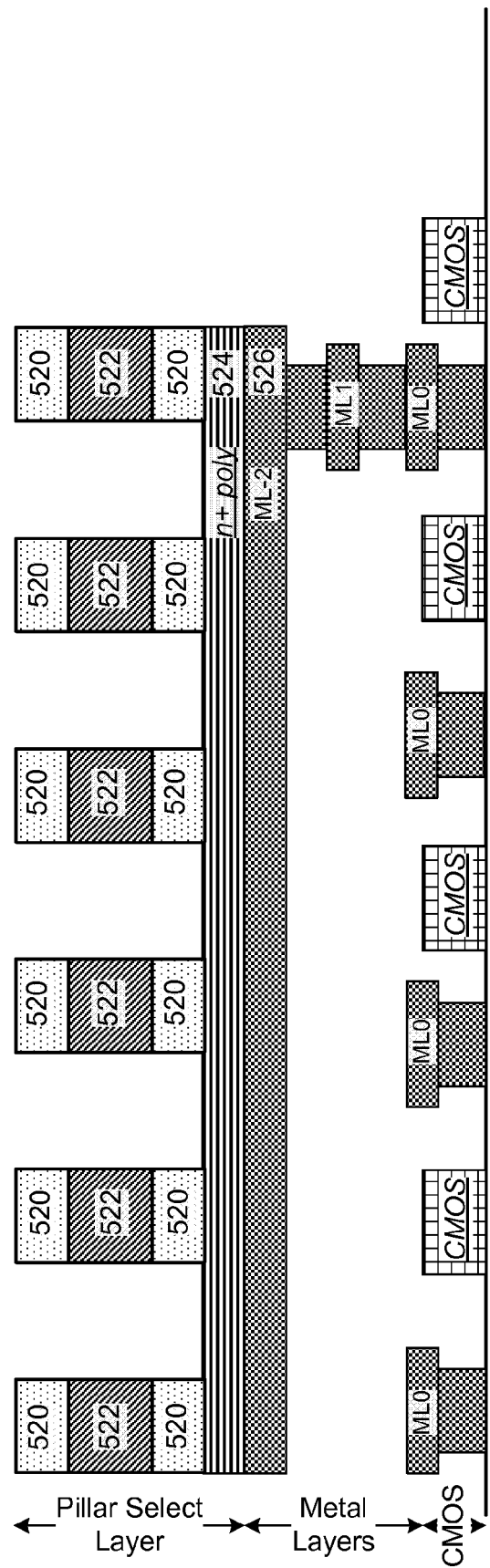

In step 606, trenches are etched for pillar device channels and the field area definition. FIG. 14B depicts a device after step 606. In step 608, a gate oxide layer is deposited on top of the structure. In one embodiment, ALD or a low temperature thermal oxide process can be used. In one example implementation, the oxide layer deposited will be approximately 3 to 10 nanometers thick. In step 610, a side wall spacer (e.g. silicon) is deposited. In one example implementation, the side wall spacer is approximately 5 nanometers thick. In step 612, an etching process is performed. For example, reactive ion etching (RIE) is used. FIG. 14C depicts the structure after the etching step of 612. For example, FIG. 14C shows gate oxide 650 and side wall silicon spacer 652 on the sides of each of the depicted pillars.

Figure 14D:
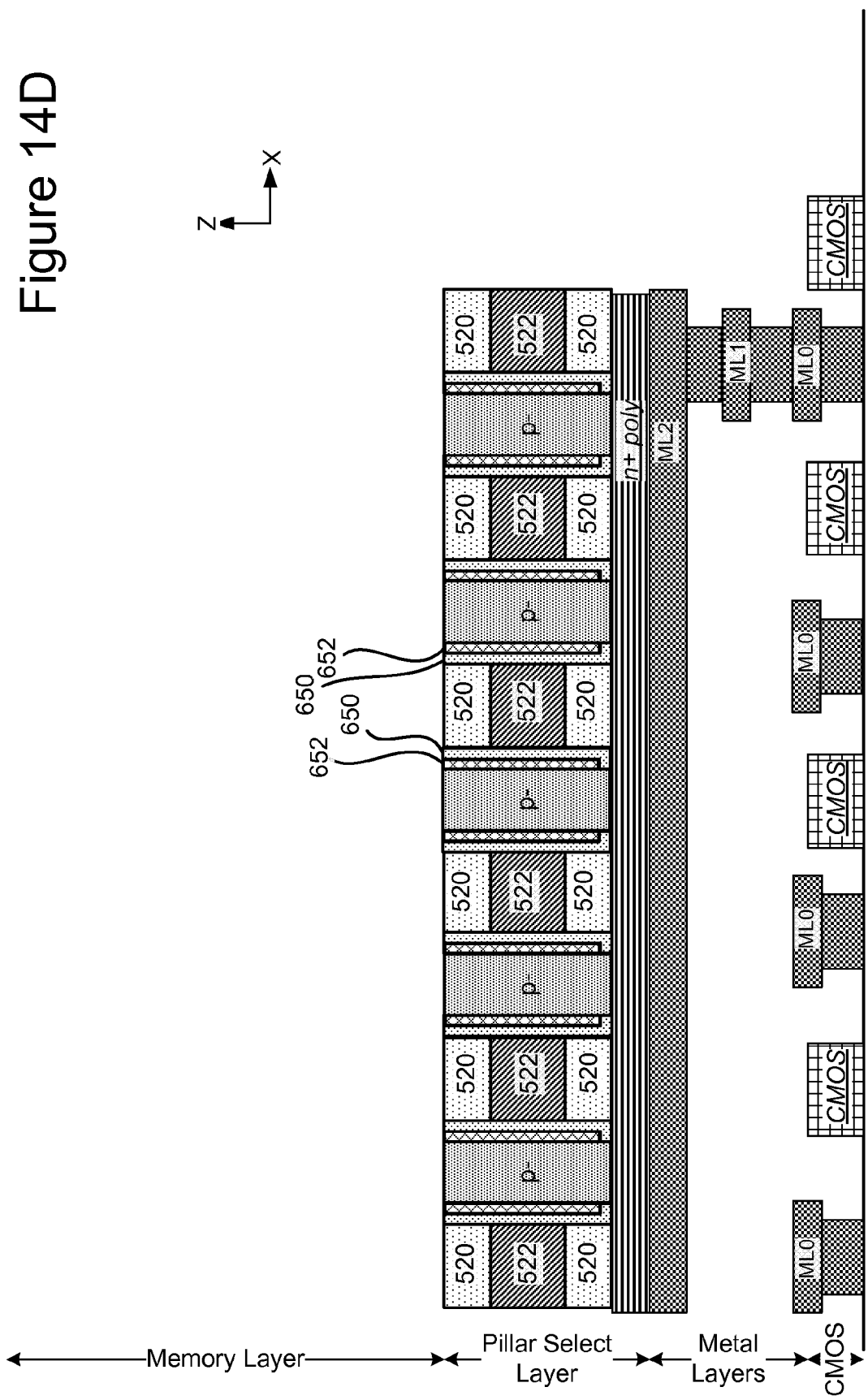
Figure 14E:
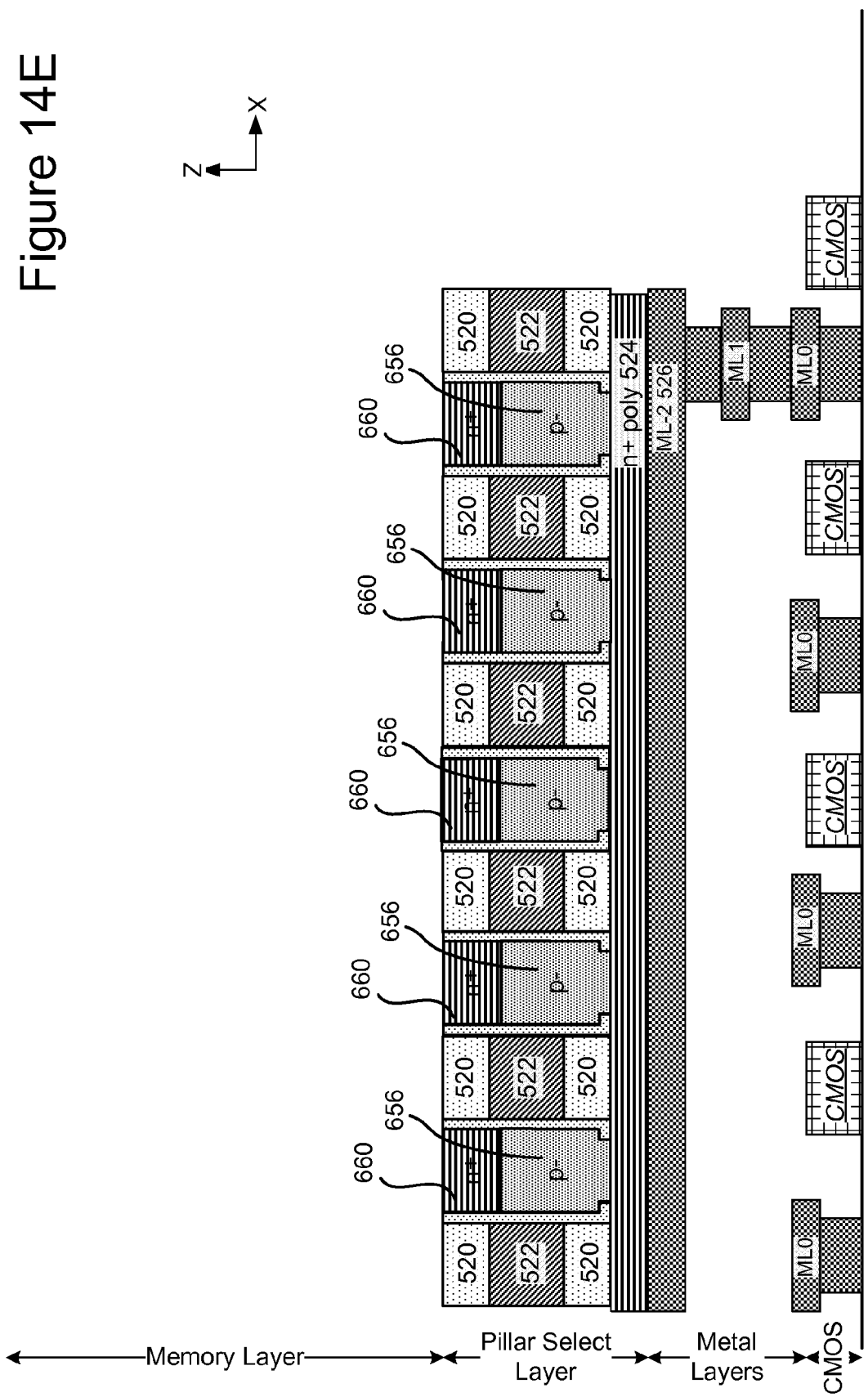

In step 614, p– polysilicon is used to fill trenches. This is finished with a planarization process. For example, FIG. 14D shows p– polysilicon material 656 filled in the trenches between side wall spacer layers 652. In step 616, a source implant step is performed to create a n+ source region above p– silicon material 656. FIG. 14E depicts the structure after step 616, showing n+ source region 660 above p– polysilicon material 656.

Figure 14F:
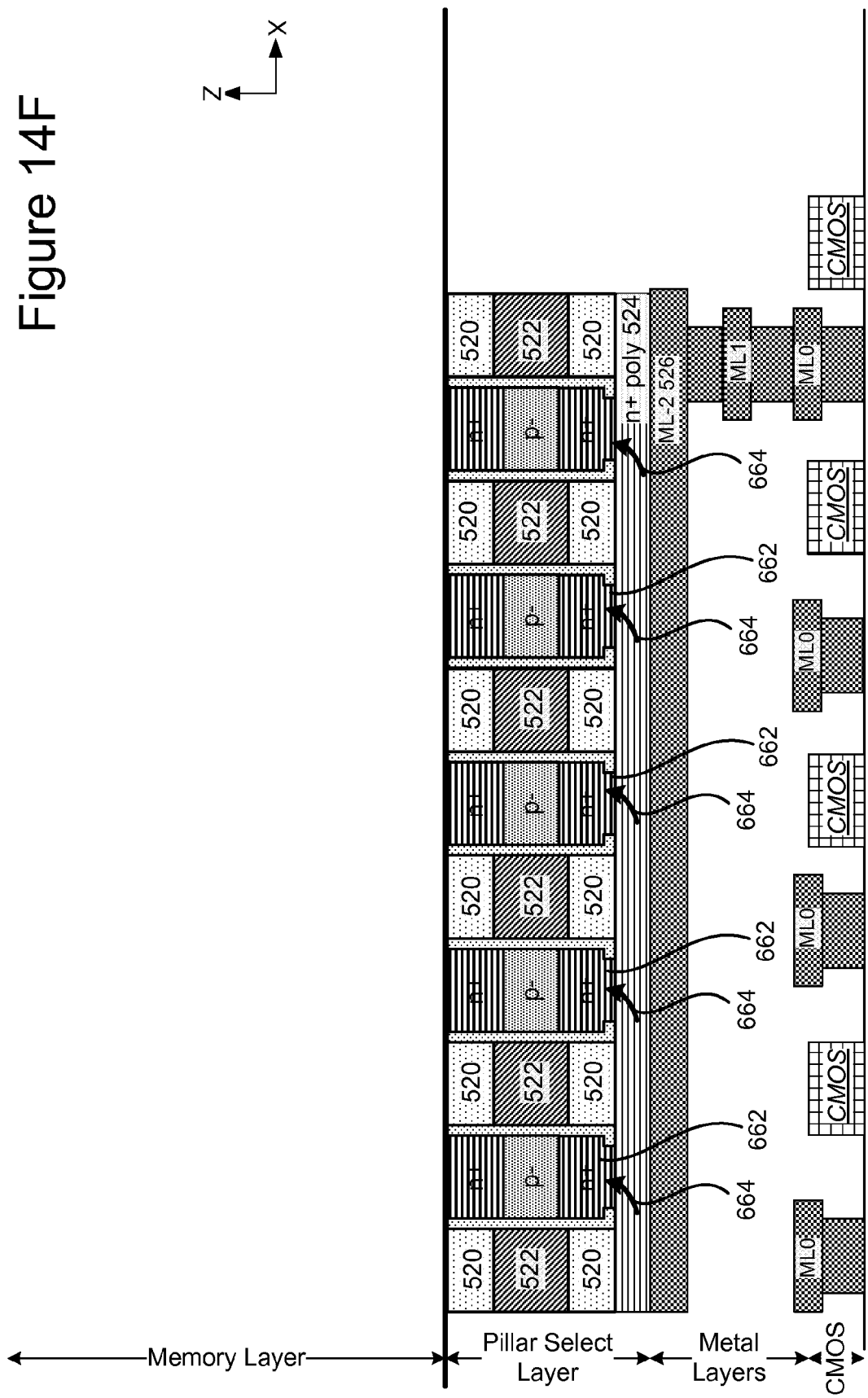

In step 618, a thermal anneal process is performed which activates the junction between p– material 656 and n+ poly 524 such that the p– silicon 656 has its bottom end doped with n+ to form the drain due to diffusion of a n+ implant from n+ polyslicon layer 524. This diffusion is depicted by arrows 664 of FIG. 14F. Note that FIG. 14F also shows the resulting n+ drain regions 662. In other embodiments, the p and n can be reversed, as long as the channel area is of a first type of polysilicon (or other material) and the source/drain are a second type of polysilicon (or other material).

As described above, the structure of FIG. 10 (and FIGS. 14A-F) provides that each vertically oriented select device for connecting a global bit line to a vertical local bit line can be controlled by either of two neighboring row select lines $SG_x$. In one embodiment, to prevent disturb to unselected memory elements a memory element is selected by driving the select signal SGx on the opposite side of the associated bit line from the selected memory element. For example, looking back at FIG. 10, when desiring to perform a memory operation on a memory element 540, row select line 580 will be selected rather than row select line 582, even though both select lines 580 and 582 can turn on the select device 504 positioned between signals 580 and 582.

Figure 15:
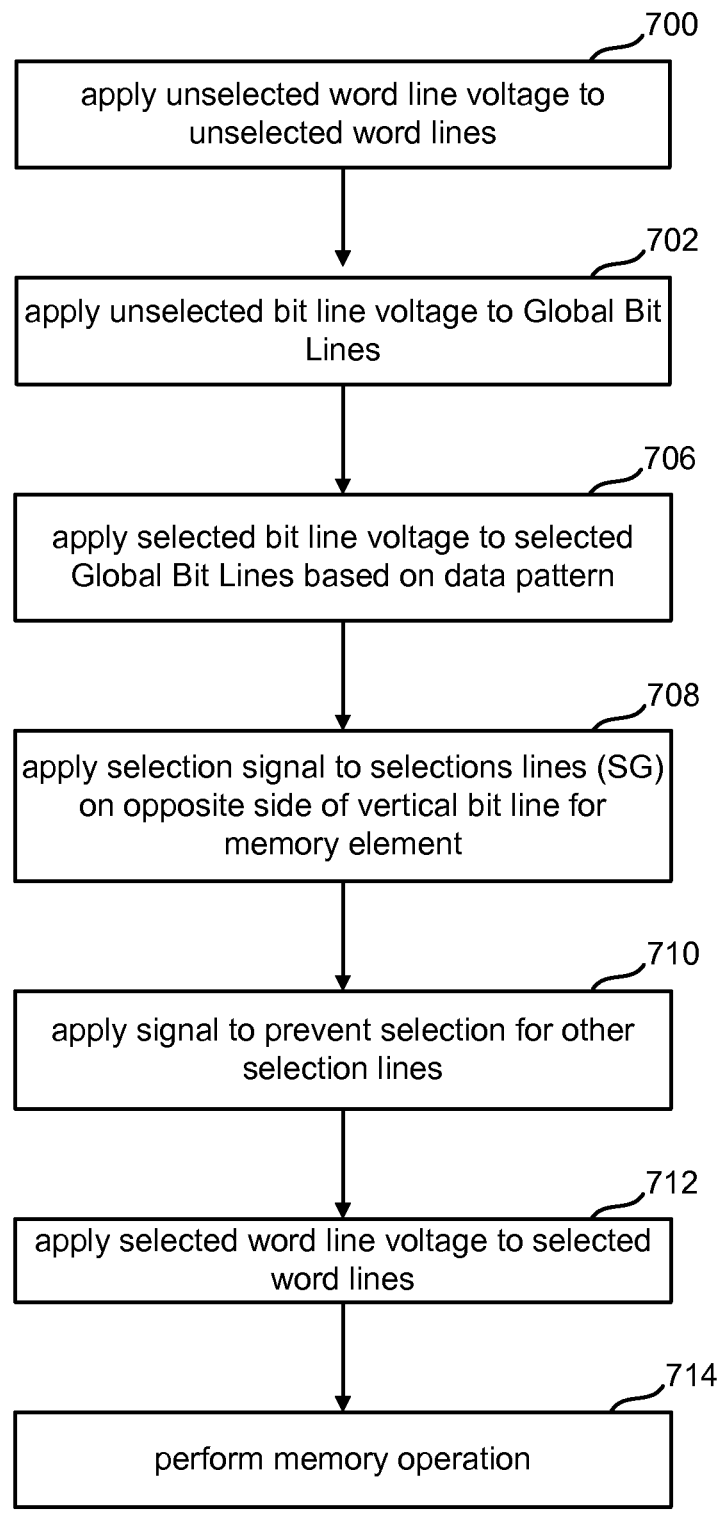
FIG. 15 is a flow chart describing one embodiment of a process for operating the structure of FIG. 10.

FIG. 15 is a flow chart describing one example process for operating the memory device of the embodiment where memory elements are chosen by driving row select lines on the opposite side of the vertical bit lines. In step 700 of FIG. 15, the unselected word line voltage is applied to the unselected word lines. In step 702, the unselected bit line voltage is applied to all the global bit lines. In one embodiment, the local bit lines are floated, so they drift toward (or to) the unselected word line voltage. In step 706, the selected bit line voltage is applied to selected global bit lines. In step 708, the selection signal is applied to the appropriate row select lines ($SG_x$) on the opposite side of the vertical bit lines for the memory elements that are selected. The signal applied to the row select lines is the appropriate signal to turn on the vertically oriented select devices 504 in order to connect the global bit line to the local bit lines. The row select lines on the same side of the global bit line as the memory element that is selected will receive a signal that would not turn on any of the vertically oriented select devices. In step 712, the selected word line voltage is applied to selected word lines. Therefore, in step 714 the appropriate memory operation is performed. Note that the order of steps depicted in FIG. 15 can be changed.

Figure 16:
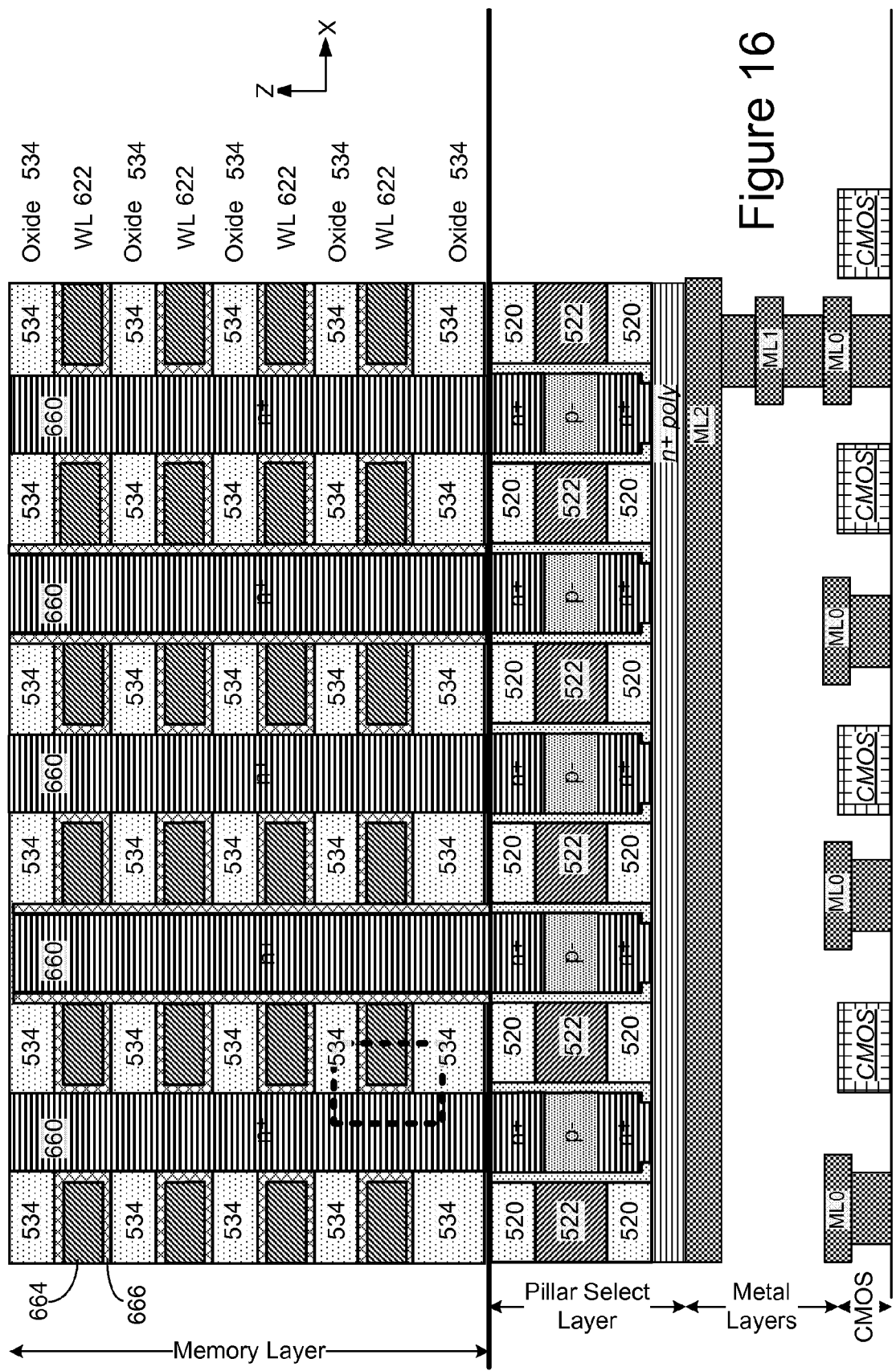
FIG. 16 illustrates one embodiment of a memory structure with vertical local bit lines and vertically oriented select devices that connect the bit lines to global bit lines.

FIG. 16 is another example of a memory system according to the technology described above. In the embodiment of FIG. 16, the Pillar Select Layer and metal select layers are the same as described above with respect to FIG. 10. However, the memory layer of FIG. 16 is different than the memory layer of FIG. 10. The memory layer of FIG. 16 does include vertical bit lines 660. Additionally, the memory layer includes oxide layers 534 alternating with word line layers 662. However, word line layers 622 are different than word line layers 536 of FIG. 10. For example, each word line includes word line material 664 (e.g. TiN), surrounded by the reversible resistance switching material 666.

Figure 17:
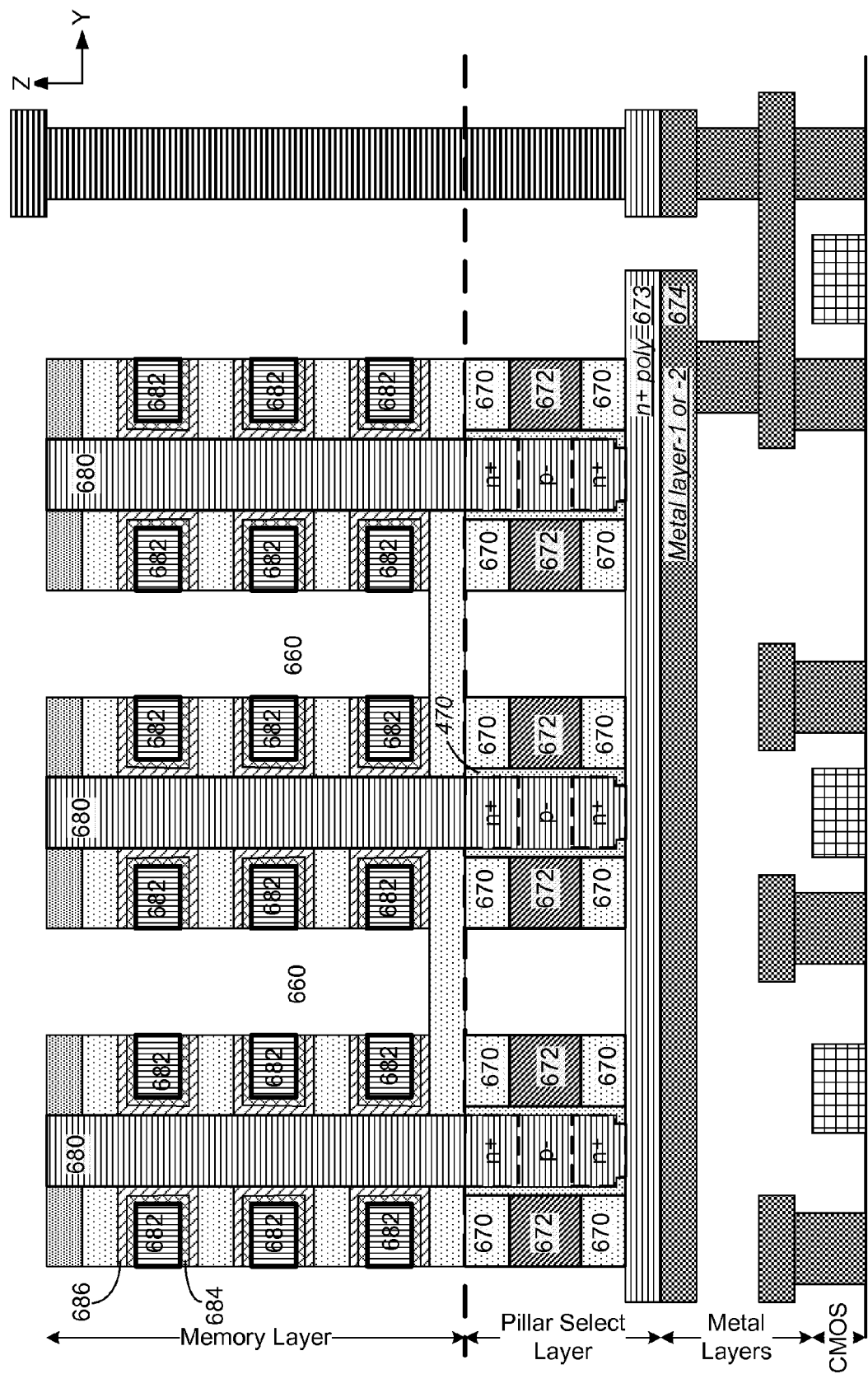
FIG. 17 illustrates one embodiment of a memory structure with vertical local bit lines and vertically oriented select devices that connect the bit lines to global bit lines.

FIG. 17 shows another embodiment of a memory system that includes vertical bit lines. However, in the embodiment of FIG. 17, each word line will only have a memory element on one side of the word line. Therefore, there are gaps/trenches 660 between vertical bit lines. For example, on each side of a vertical bit line 680 are sets of word lines 682. Each word line 682, which could be comprise of Tungsten, is surrounded by a Titanium Nitride layer 684 to provide a suitable electrode for the resistance switching material. Each Titanium Nitride layer 684 is surrounded by reversible resistance switching material 686. FIG. 17 shows the row select lines 672 positioned between oxide regions 670. FIGS. 18A-18I describe one process for manufacturing the Pillar Select Layer for the structure of FIG. 17

FIGS. 18A-18I illustrate the formation of the pillar select device at the BEOL (top) portion of 3D memory shown in FIG. 17 at various processing stages.

Figure 18A:
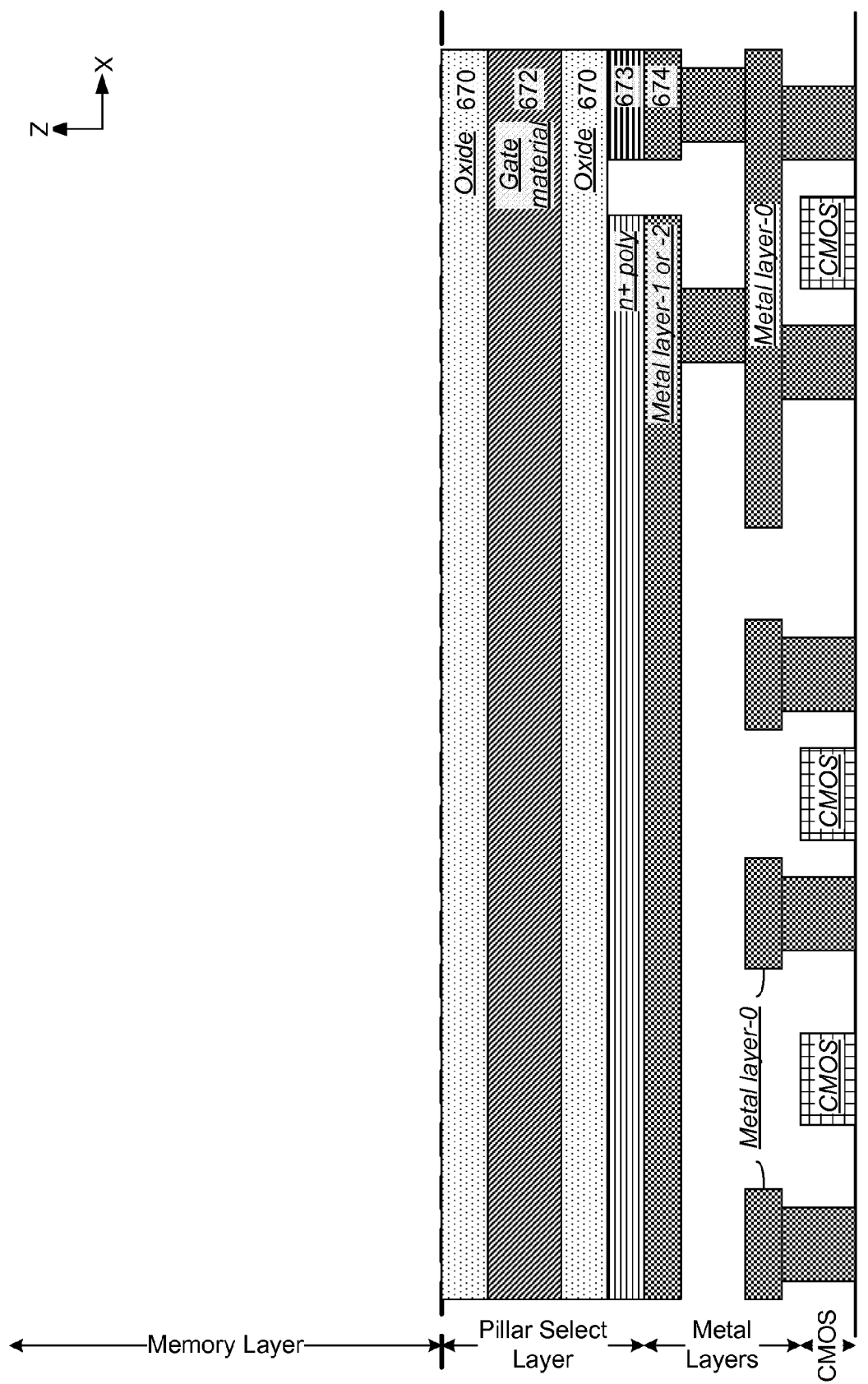
FIGS. 18A-I depict the structure of FIG. 17 during the process of fabricating.

FIG. 18A illustrates a first stage of fabricating the pillar select layer. A layer 673 of N+ poly is formed on top of the global bit line 674. This is followed by a sandwich comprising an oxide layer 670, a gate material layer 672 and another oxide layer 670. The gate material layer 672 is, for example, metal, Titanium Nitride or doped polysilicon. This gate material will form the row select line, such as $SG_1$.

Figure 18B:
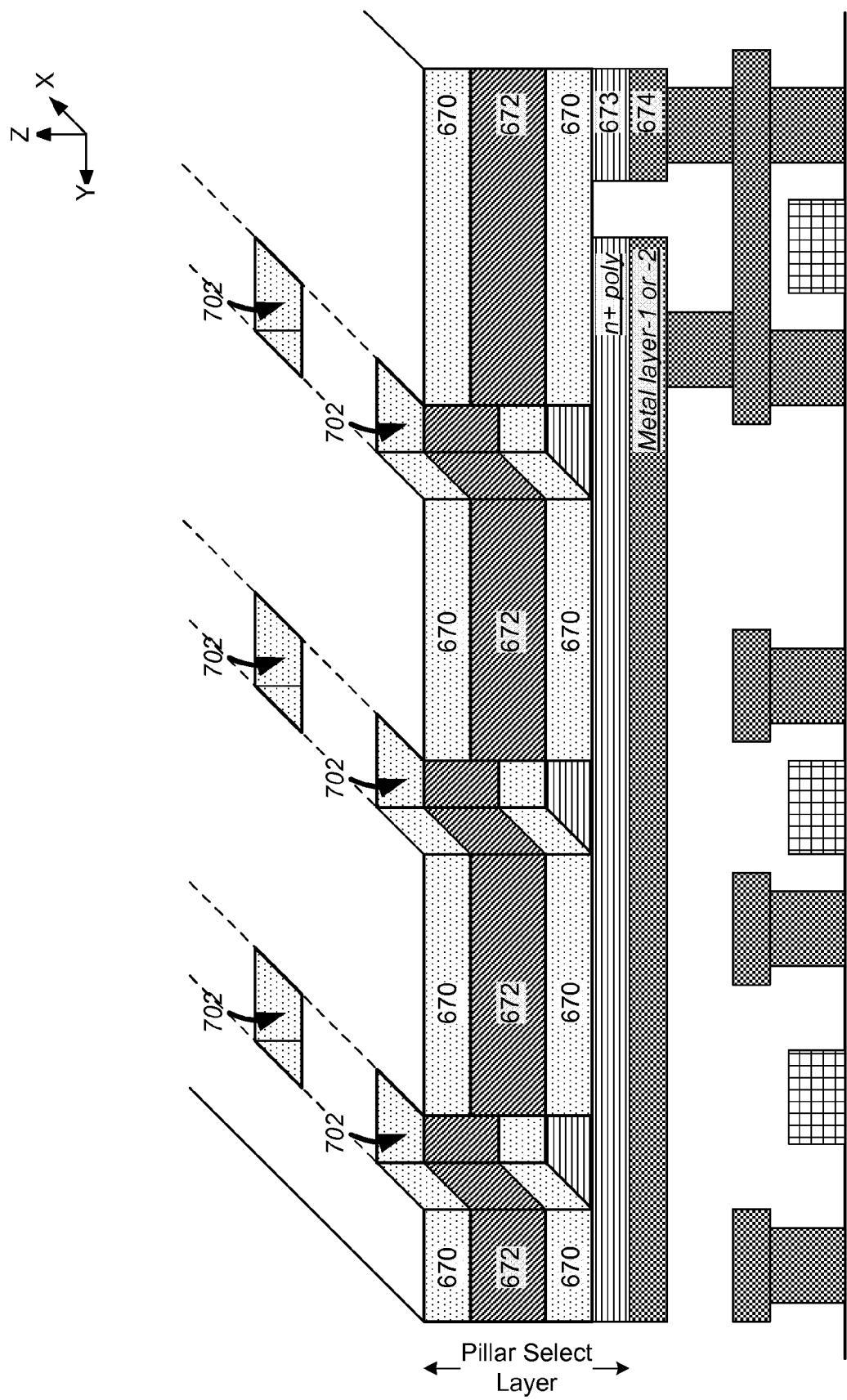

FIG. 18B illustrates a damascene process in which excavations are made in the pillar select layer sandwich by a hard mask and RIE process to form the pillar holes 702.

Figure 18C:
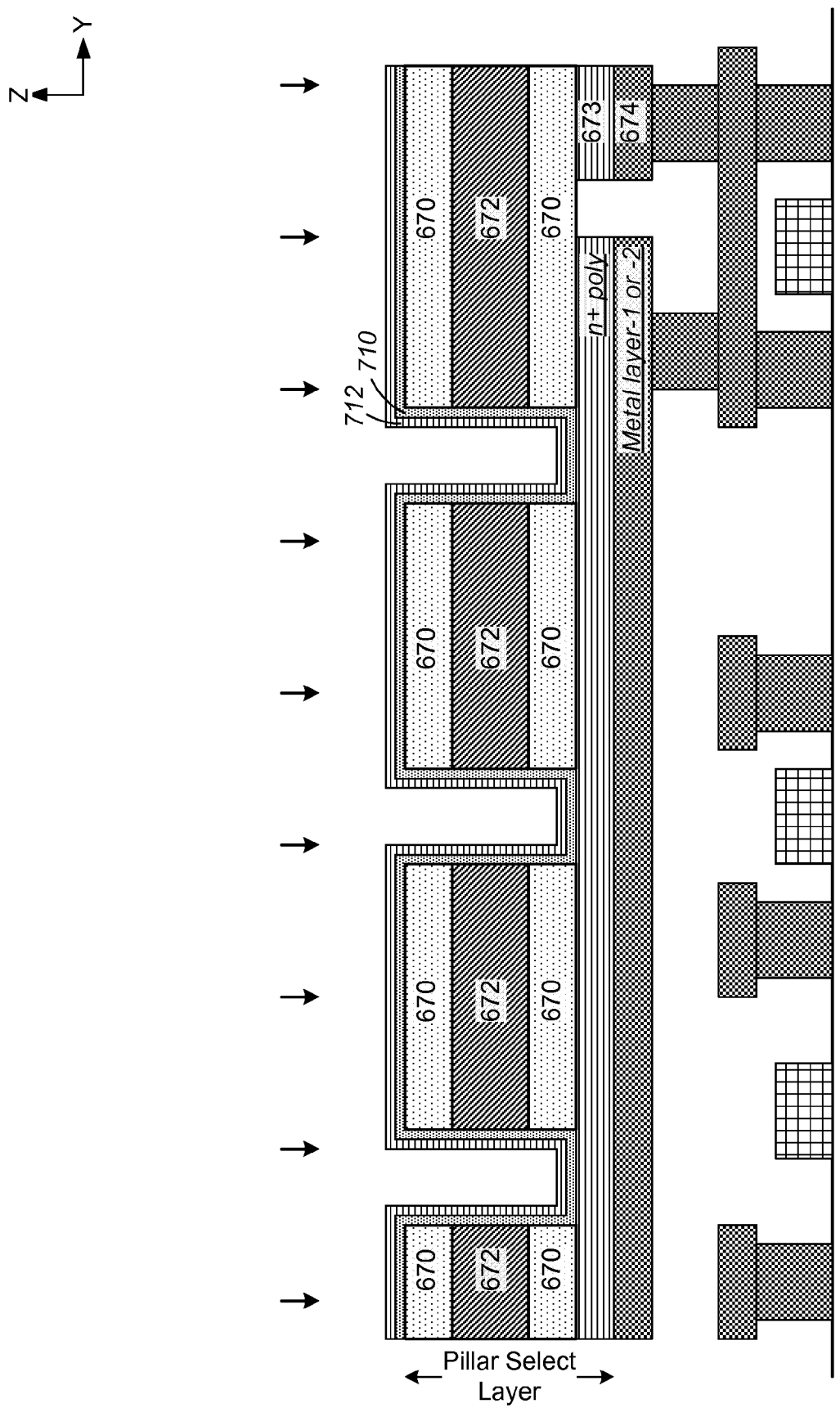

FIG. 18C illustrates the deposition of a gate oxide layer 710 followed by a polysilicon layer 712.

Figure 18D:
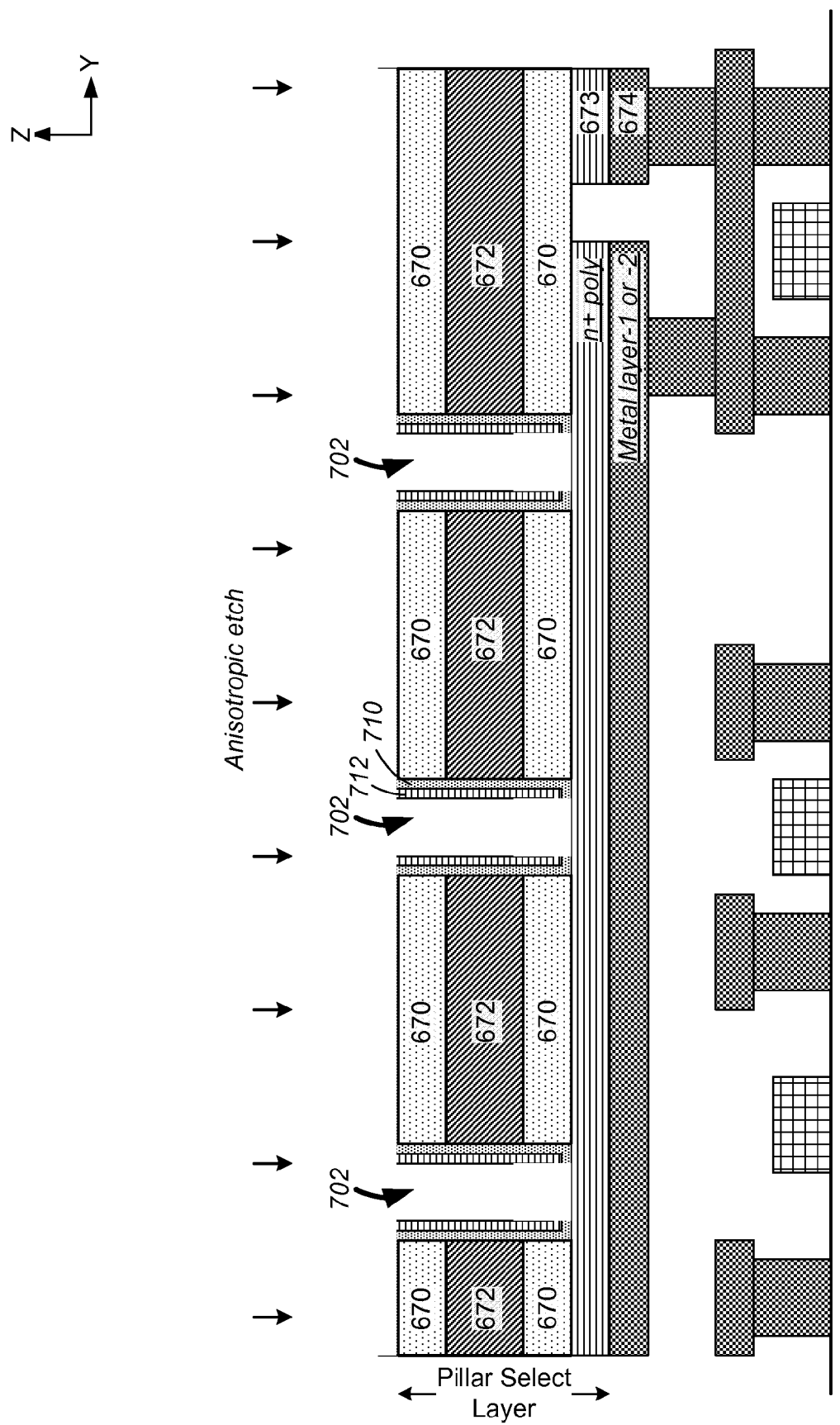

FIG. 18D illustrates an anisotropic etch in which the bottom of the pillar holes 702 is etched through to the n+ poly layer 673.

Figure 18E:
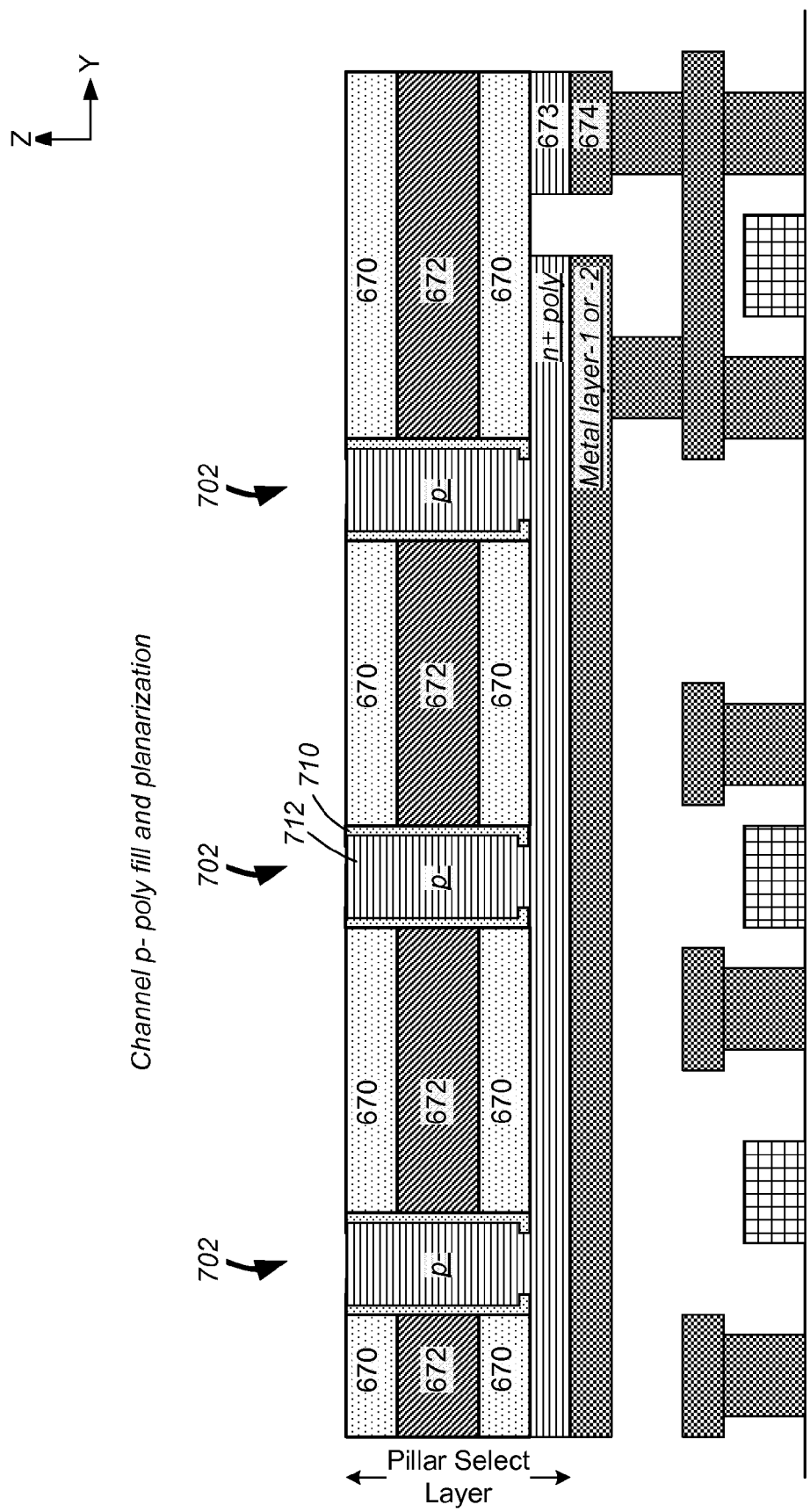

FIG. 18E illustrates the pillar holes being filled with P− polysilicon, which is a suitable channel material. This is finished with a planarization process.

Figure 18F:
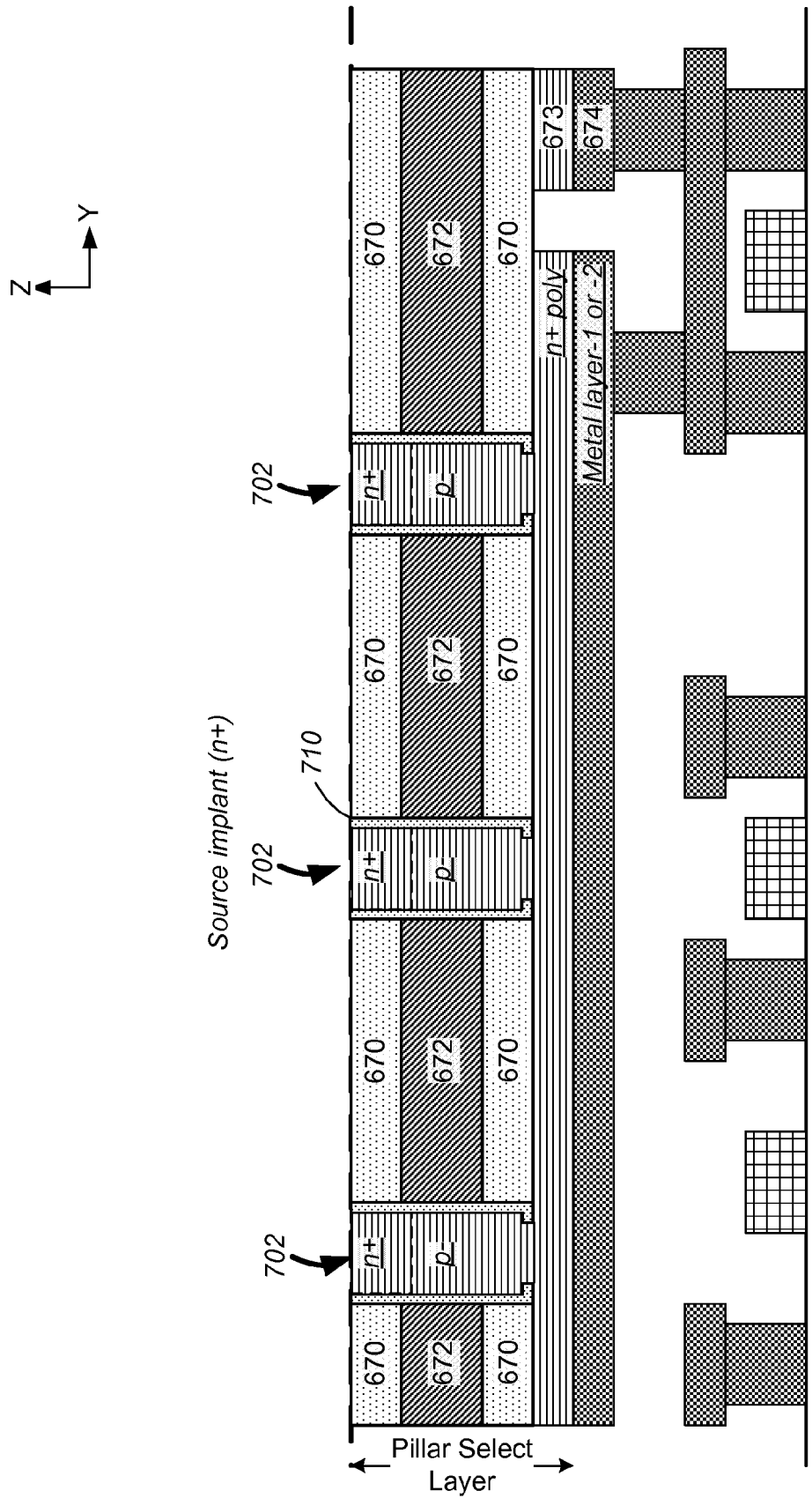

FIG. 18F illustrates creating a source region in the filled-in P− polysilicon. This is accomplished by a blanket source implant of n+ through the filled in pillar holes 702.

Figure 18G:
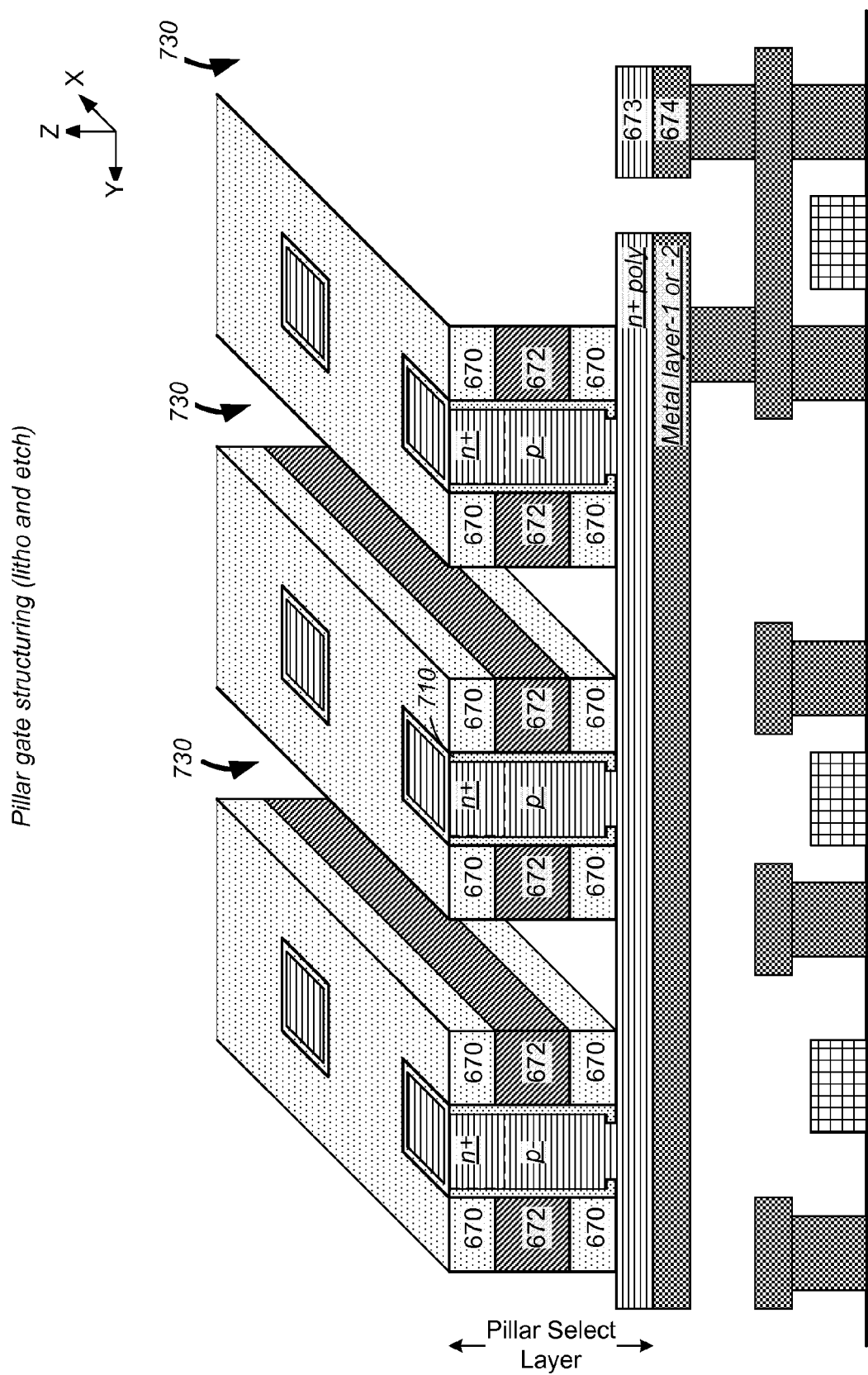

FIG. 18G illustrates a perspective view of the pillar select layer after trenches are cut. The trenches 730 are cut to isolate the individual rows of pillars and to structure the pillar gates. This is accomplished by litho and etch processes.

Figure 18H:
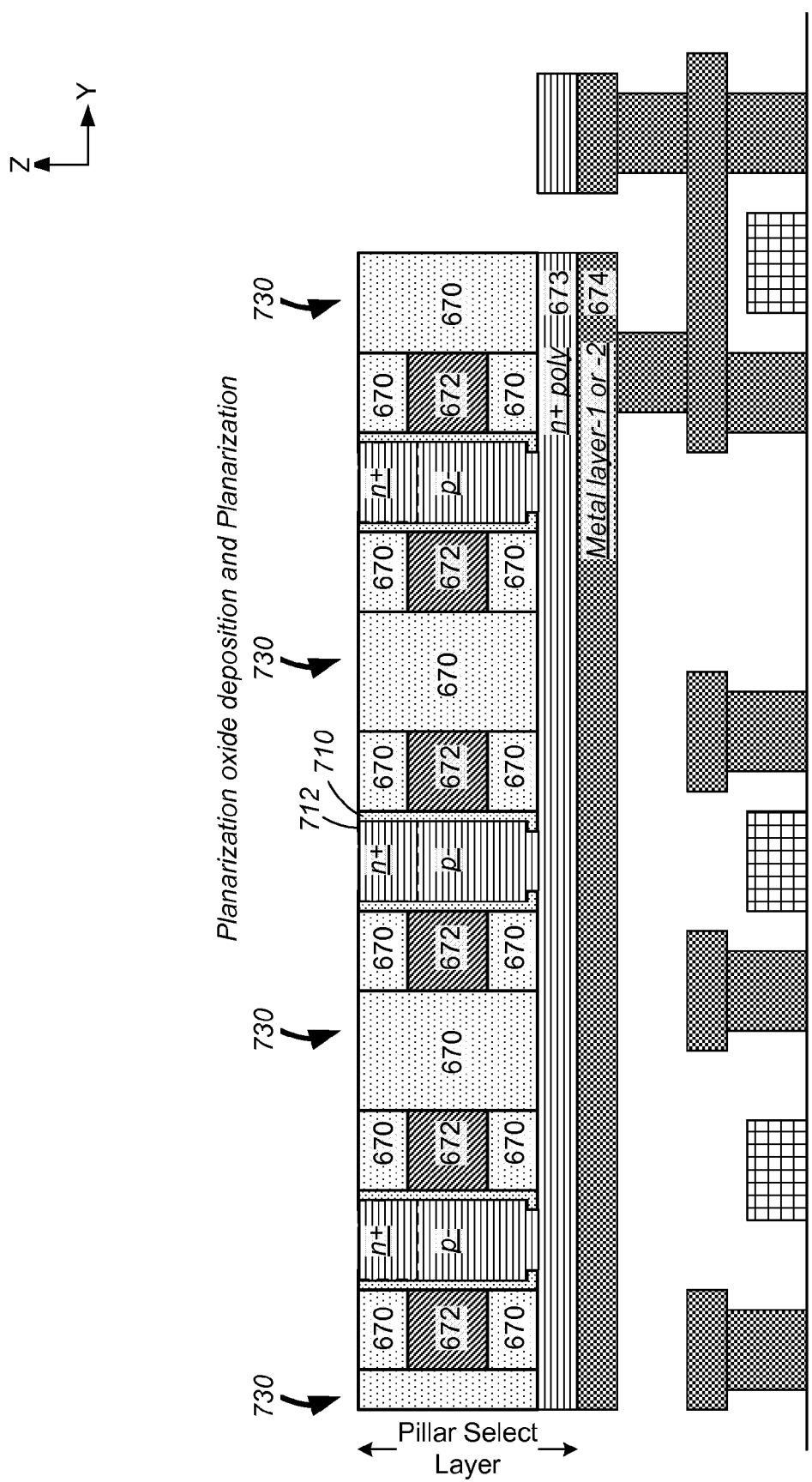

FIG. 18H illustrates filling the trenches with oxide. The isolation trenches 730 are filled with oxide 670 followed by planarization.

Figure 18I:
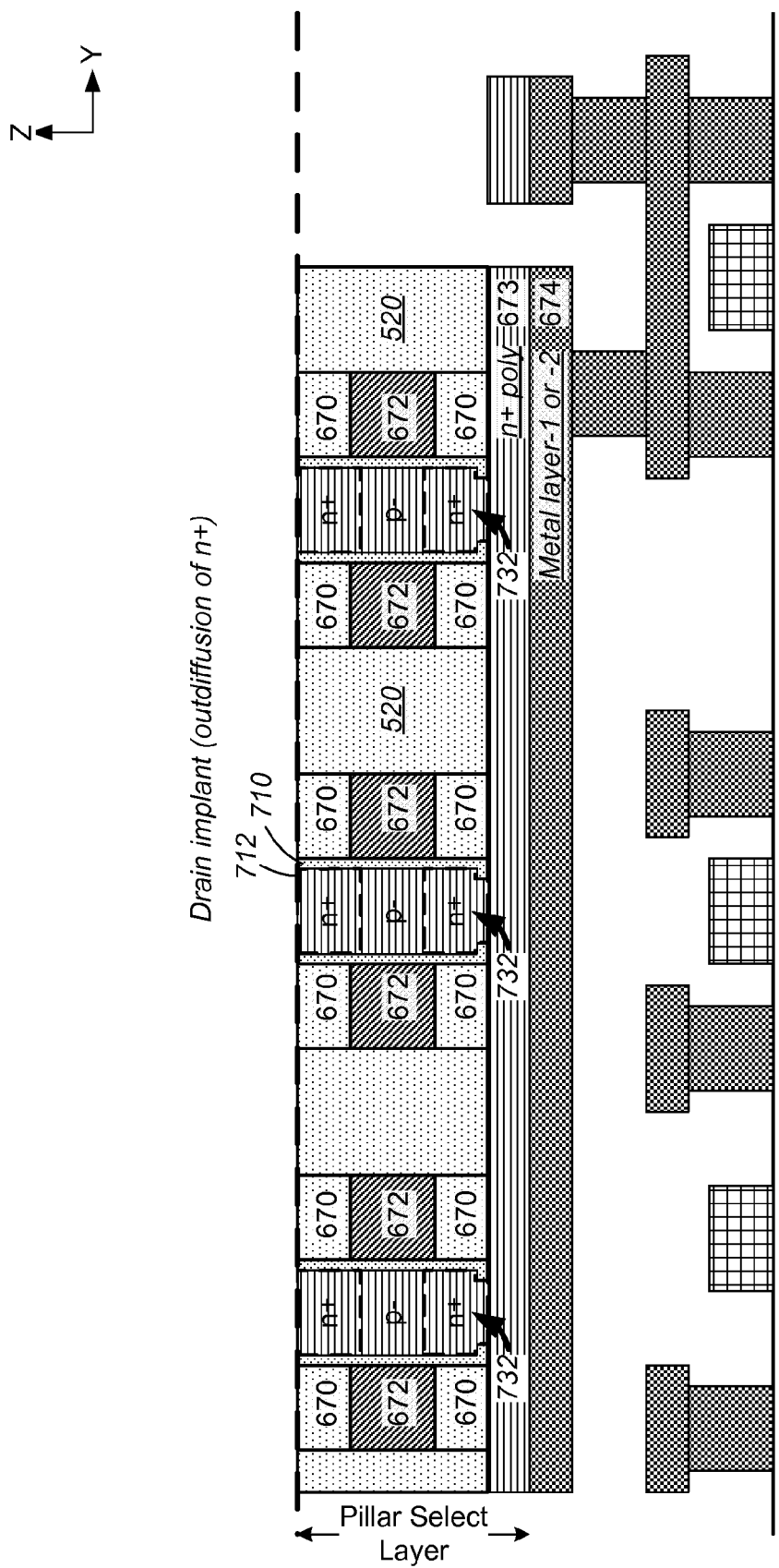

FIG. 18I illustrates the formation of the drain of the pillar select device. The p− polysilicon filling the pillar hole has its bottom end doped with n+ to form the drain. This is accomplished by out diffusion (see arrow 732) of n+ implant from the n+ poly layer 673.

Thus, between each local bit line pillar and the metal line is formed a pillar select device in the form of a npn MOS thin film transistor controlled by a row select line 672.

Connected Word Lines

In prior designs, word line drivers were implemented in the substrate but outside the memory array (rather than underneath the memory array). To make the integrated circuit smaller, it is preferable to implement the word line drivers underneath the memory array. In some cases, a word line driver is as big in size as 16 word lines aggregated. Thus, the word line drivers have been too big to fit underneath the memory array. One proposed solution is to connect one word line driver to a group of multiple word lines connected together, where a memory system will have many of such groups. In one example implementation, 16 (or another number of) word lines will be connected together, and the connected group of word lines will be connected to a single word line driver. In one example, the 16 word lines are connected together to form a comb shape. However, other shapes can also be used. Using one word line driver to drive 16 (or a different number of) word lines in a single comb (or other shaped structure) reduces the number of word line drivers need. Therefore, the word line drivers can fit underneath the memory array. The use of the vertically oriented select devices described above also provides more room underneath the memory array (e.g., in the substrate) in order to implement the word line drivers. Additionally, using one or more word line drivers to drive multiple word lines reduces the number of wires needed from the word line drivers to the word lines, thereby saving room, simplifying routing, reducing power and reducing the chance of a fault. Additionally, because the word lines and bit lines are now shorter, there is a smaller time constant than in previous designs. Because there is a smaller time constant, the lines will settle quicker and there is no significant transient effect that will cause a disturb for unselected memory elements.

Figure 19:
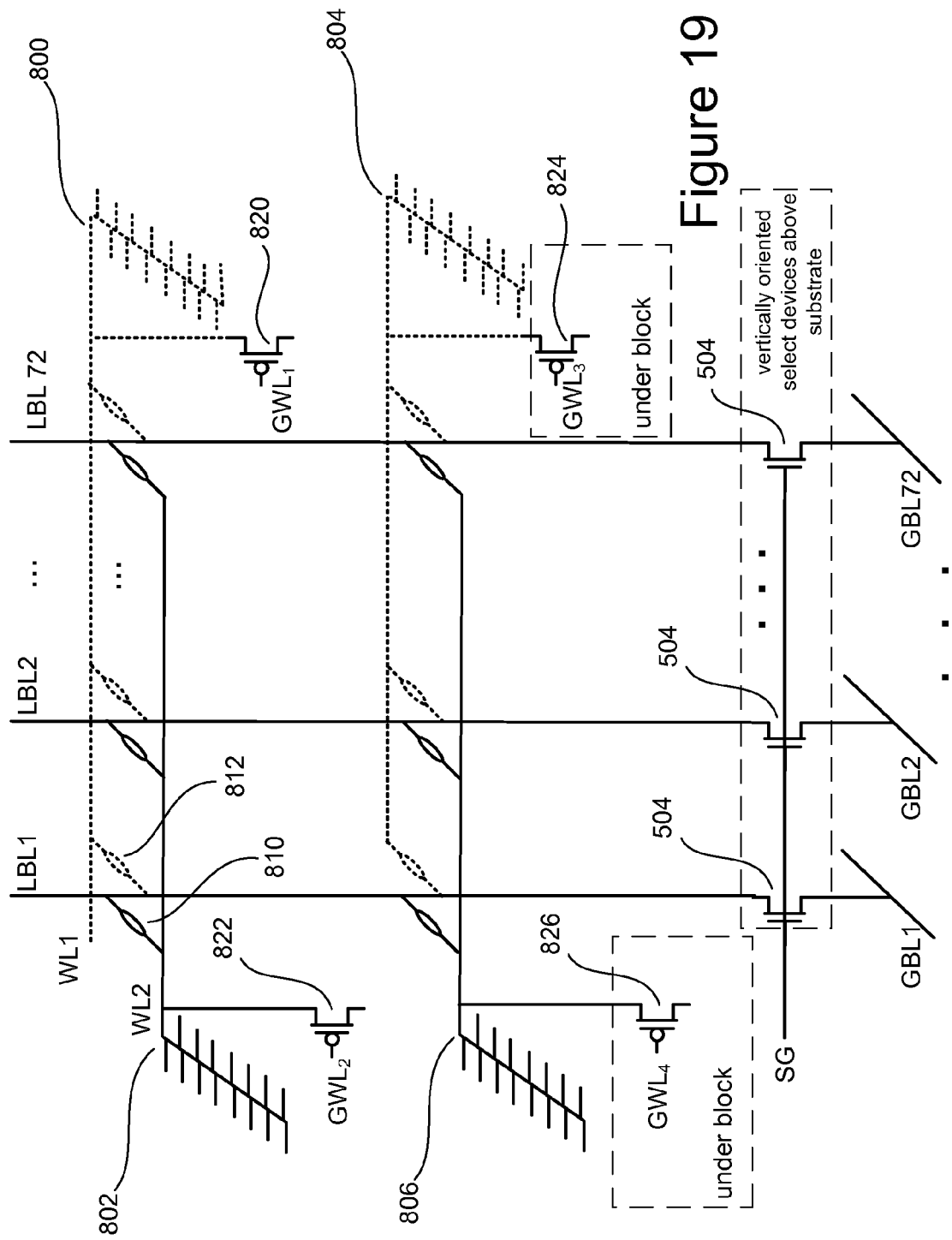
FIG. 19 is a schematic of a portion of the memory system, depicting vertical bit lines, vertically oriented select devices above the substrate and word line combs (connected word lines).

FIG. 19 is a partial schematic depicting a portion of a memory system which uses the comb structure described above. For example, FIG. 19 shows combs 800, 802, 804 and 806. A memory system is likely to have many more combs than depicted in FIG. 19; however, FIG. 19 will only show four combs to make it easier to read. Each comb includes 16 word lines, also referred to as word line fingers. For each comb, a first set such as eight (e.g., half) of the word line fingers are on a first side of the comb and are in a first block while another set such as eight (e.g., half) of the word line fingers are on the second side of the comb and are in a second block that is next to the first block. FIG. 19 shows that combs 800 and 802 (and all of the attached word line fingers) are in a first plane or level of the memory array, and combs 804 and 806 (and all of the attached word line fingers) are on a second plane or level of the memory array. Each of the combs has a signal line to one word line driver. For example, word line comb 800 is connected to word line driver 820. When word line comb 800 is selected, all of the word line fingers connected to word line comb 800 are selected (e.g., receive the selected word line signal). Word line comb 802 is connected to word line driver 822. Word line comb 804 is connected to word line driver 824. Word line comb 806 is connected to word line driver 826. Word line drivers 820, 822, 824 and 826 are implemented underneath the memory array in the substrate. In one embodiment, a word line driver is located underneath the block (or one of the blocks) for which it is connected to.

FIG. 19 shows that word line comb 800 includes word line WL1 which is connected to memory elements that are in turn connected to local bit lines LB1, LB2, . . . LB72 (72 local bit lines). Word line comb 802 includes word line WL2 that is also connected to memory elements for the same 72 local bit lines LBL1, LBL2, . . . LBL72. In this arrangement, word line comb 800 is on one side of the memory array and word line comb 802 is on the opposite side of the memory array such that the word line fingers from comb 800 are interleaved with the word line fingers of word line comb 802. To make it easier to read, FIG. 19 is created such that word line combs 800, 804, and their word line fingers appear as dotted lines to show that they are from the right side of the memory array while combs 802, 806 are solid lines to show that they are from the left side of the memory array. In this arrangement, each memory element connected to a word line of word line comb 802 for the block being depicted will have a corresponding memory element connected to a word line for word comb 800 that connects to the same local bit line. For example, memory element 810 (connected to WL2) and memory element 812 (connected to WL1) are both connected to LBL1. Therefore, the system has to be operated such that if LBL1 is selected, only appropriate memory element 810 or 812 should be selected. Note that the local bit lines are connected to the appropriate global bit lines by the vertically oriented select devices 504 (described above) that are above the substrate. In other embodiments, the word line comb structure can be used without using the vertically oriented select devices. For example, the word line comb structures can be used with select devices that are implemented in the substrate.

Figure 20:
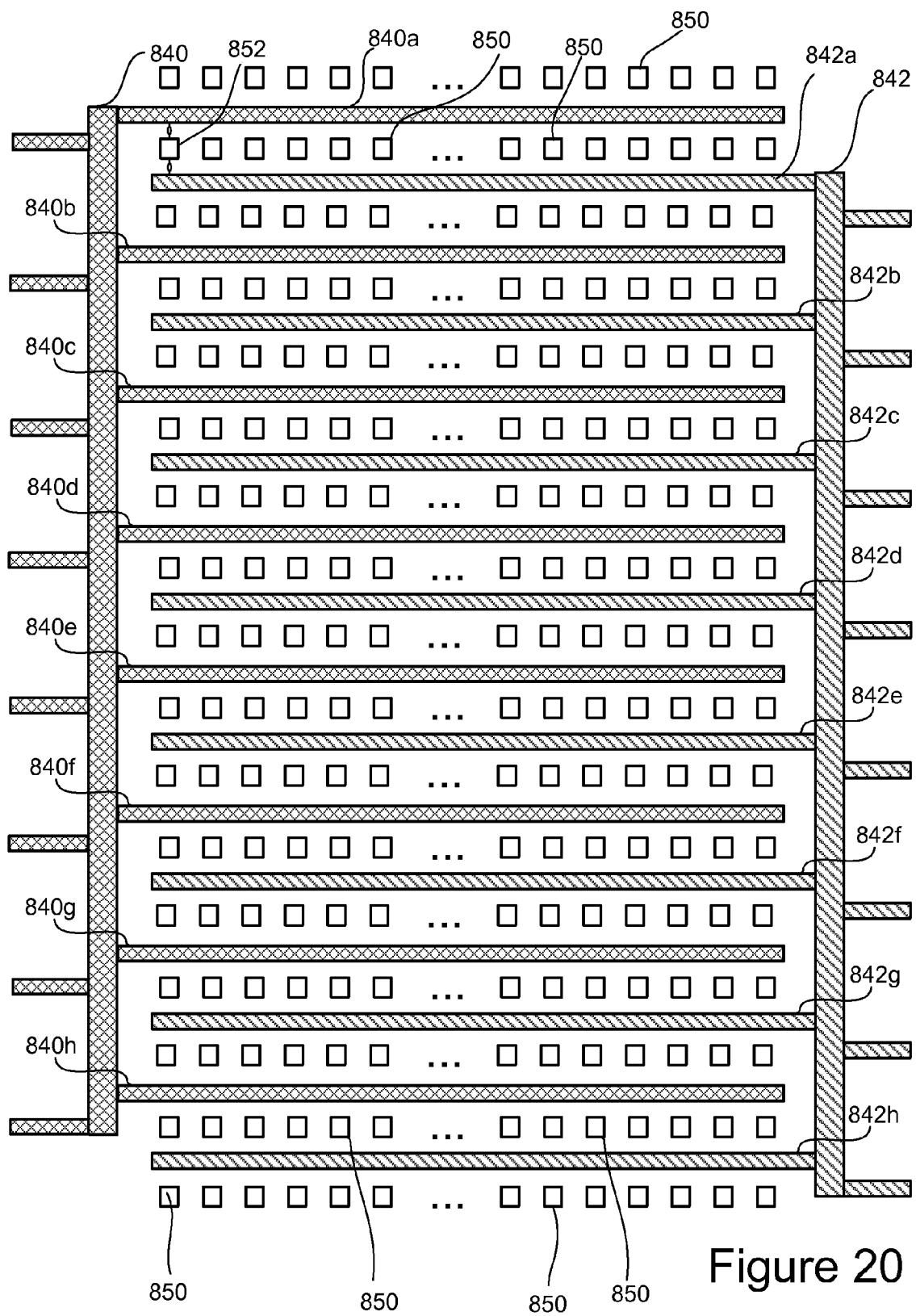
FIG. 20 is a top view of two word line combs and multiple vertical bit lines.

FIG. 20 is a top view of one layer of the memory array depicting part of two word line combs 840 and 842. As described above, each word line comb has word line fingers on two sides of its spine. FIG. 20 only shows the word line fingers on one side of each spine (with stubs being depicted for the word line fingers on the other side of the spine). For example, word line comb 840 includes word line fingers 840a, 840b, 840c, 840d, 840e, 840f, 840g and 840h. Word line comb 842 includes word line fingers 842a, 842b, 842c, 842d, 842e, 842f, 842g and 842h. Between adjacent word line fingers from word line combs 840 and 842 (which are interleaved as describe above), are vertical bit lines 850 (note that only a subset of vertical bit lines are labeled with reference number 850 to make the drawing easy to read). At the edge of the word line comb, the row of vertical bit lines is shared with an adjacent word line comb. Between each vertical bit line and each word line finger is a memory element. To make the drawing easy to read, memory elements are only depicted for local bit line 852.

Figure 21A:
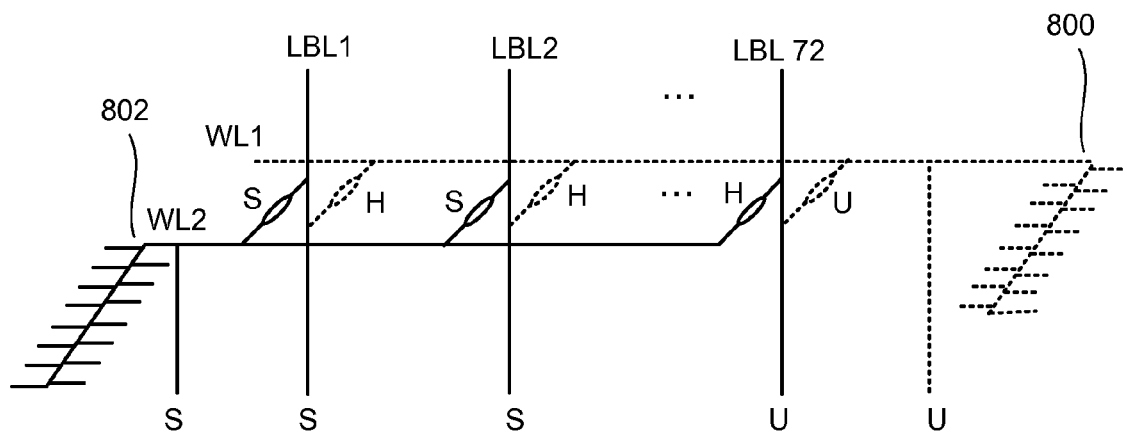
FIGS. 21A and B are schematics of a portion of a memory system, and show word lines combs.
Figure 21B:
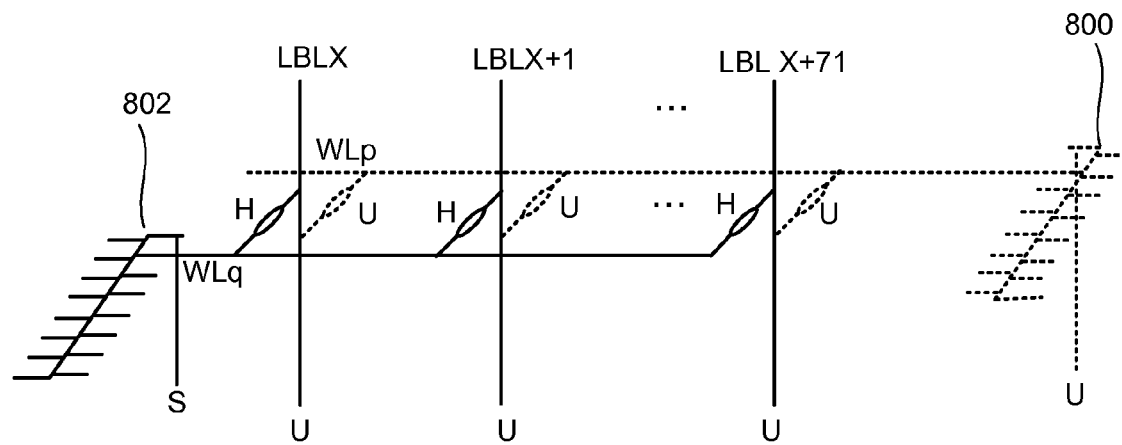

Because two word line comb structures are interleaved and share local bit lines, biasing memory elements connected to one of the word line combs (and not the other) will have an effect on the other word line comb. Biasing the vertical bit lines will have an effect on all memory element (for any word line comb) connected to those bit lines, even though the respective word line combs are not biased. Biasing a word line comb will bias all 16 (or other number of) word line fingers that are part of that word line comb. However, it is typically desired to only program or read from memory elements connected to one word line finger of the comb. FIGS. 21A and 21B will explain various biasing techniques to prevent a disturb.

FIG. 21A shows word line combs 800 and 802 from FIG. 19. These word line combs are interleaved. In one example, word line comb 802 is biased as a selected word line and word line comb 800 receives the unselected word line voltage. In this example, local bit line LB1 and local bit line LB2 are biased with the selected bit line voltage while all of the other local bit lines will be unselected. In this arrangement, therefore, those memory elements connected from WL2 to LBL1 and from WL2 to LBL2 are selected (S). Those memory elements connected between WL1 and LBL1 and WL1 and LBL2 are half selected (H) because one of the two control lines are biased. Memory elements connected to WL2 that are also connected to unselected local bit lines are half selected (H). Memory elements connected between WL1 and unselected local bit lines are unselected (U). Fully selected memory elements (S) will experience a voltage differential to cause a memory operation. Half selected memory elements will have a small voltage differential that is not large enough to cause a memory operation to occur. Unselected memory elements will experience no (or minimal) voltage differential.

FIG. 21B depicts the case that explains how word line fingers connected to a selected word line comb will not cause disturb to memory elements that should not be selected. For example, word line comb 802 is selected, therefore, word line WLq will receive the program signal. However, it is not desired to program any memory elements connected to word line WLq. Unselected local bit lines LBLX, etc. will be receiving the unselected bit line voltage or floating (as appropriate by the particular implementation). Note that word line WLp receives the unselected word line voltage from word line comb 800. The unselected memory elements U along word line WLp and many other unselected cells on other memory levels provide a leakage path from unselected word lines such as WLp to the unselected bit lines LBLX, LBLX+1, etc. through LBLX+2. Even if many of the memory elements are in the high resistance state, the leakage path is sufficient to bring the unselected bit lines near to the unselected word line voltage in the case of floating unselected bit lines. The unselected bit line voltage and unselected word line voltage are both intermediate to the selected bit line voltage and selected word line voltage, and in many embodiments approximately equal. In either case, the unselected bit lines are at an intermediate unselected voltage bias The memory elements that are connected to WLq (H) are connected on the other terminal to these unselected bit lines that are near the unselected voltage bias. Therefore, each of the memory elements connected to WLq will be half selected (H) and safe from disturb.

Word line comb 800, which is not selected, will not provide a programming voltage to word line WLp. Therefore, all the memory elements connected between word line WLp and the local bit lines that are unselected will be completely unselected (U).

Figure 22A:
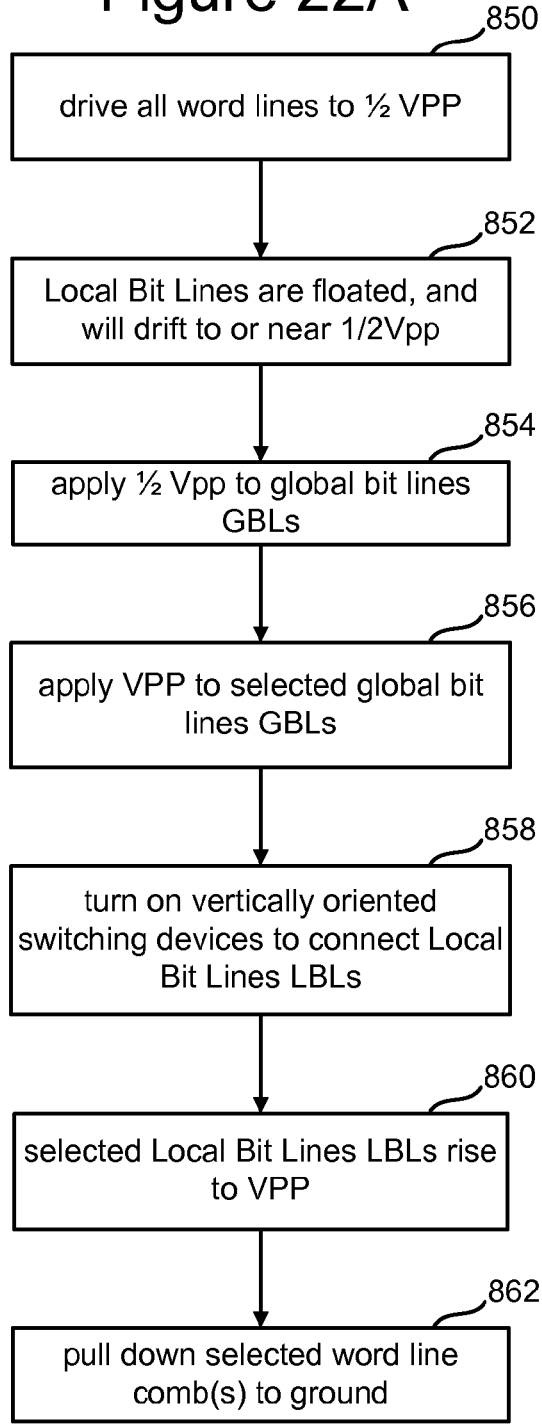
FIGS. 22A and B are flow charts describing embodiments for programming the memory system.
Figure 23:
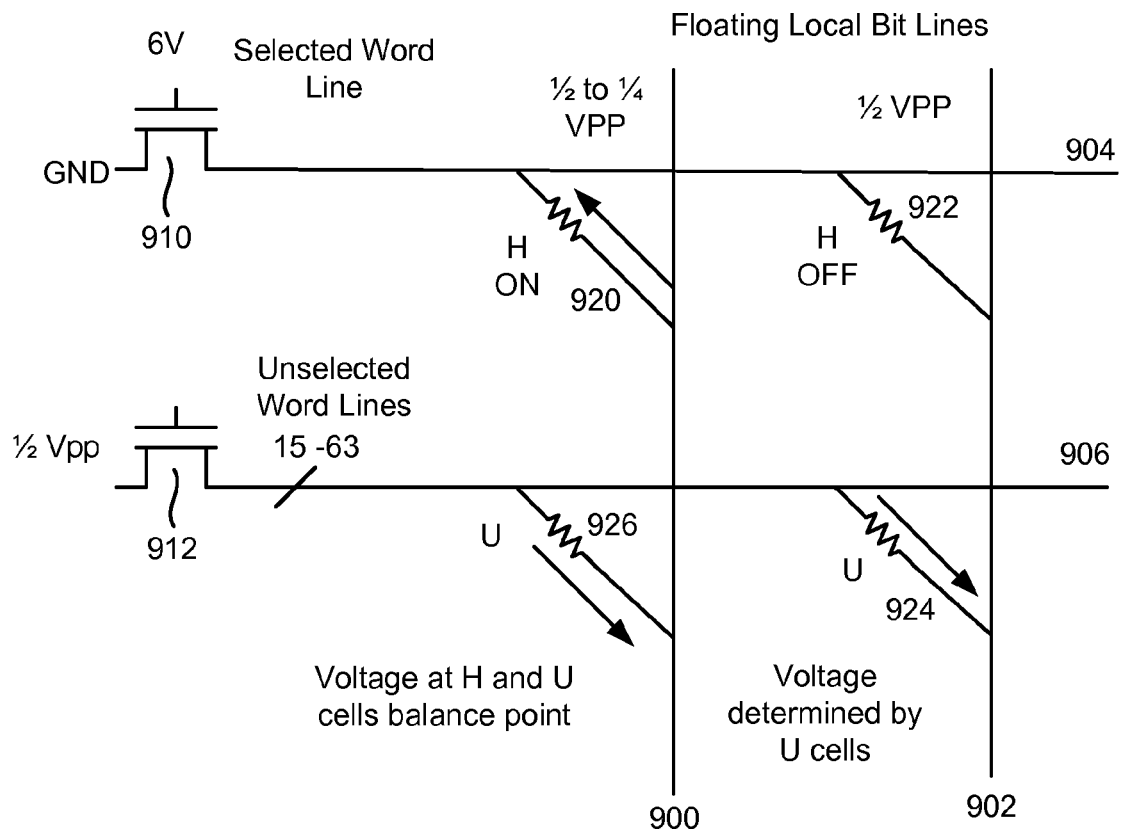
FIG. 23 is a schematic of a portion of the memory system, depicting the programming operation.

FIG. 22A is a flow chart describing one embodiment for programming memory elements. The process of FIG. 22A can be performed as part of a SET process or as part of a RESET process. FIG. 23 is a partial schematic of four memory elements 920, 922, 924 and 926 connected to local bit lines 900 and 902 and connected to word line fingers 904 and 906. The schematic at FIG. 23 will be used to explain the process of FIG. 22A and how disturb is avoided.

In Step 850, all word lines are driven to a common signal of ½ VPP. For example, word lines 904 and 906 will be driven to ½ VPP. In general ½ Vpp represents the intermediate unselected word line voltage and is not necessarily exactly half the programming voltage Vpp. Due to IR drops and other particulars of each embodiment the intermediate unselected biases can be adjusted higher or lower than half the programming voltage and may range from ¼ to ¾ of the Vpp. FIG. 23 shows transistor 912 applying ½ VPP to word lines 906. In one embodiment, VPP is the largest voltage used on the integrated circuit for the memory array. One example of VPP is 4 volts; however, other values can also be used. In step 852, the local bit lines are all floated; therefore, they will drift to or near ½ VPP. In step 854, ½ VPP (e.g., an unselected voltage) is applied to all global bit lines. In step 856, one or more data dependent signals are applied to the global bit lines; for example, VPP is applied to only the selected global bit lines. In step 858, the vertically oriented select devices discussed above (e.g. switch 504) are turned on in order to connect the selected local bit lines to the selected global bit lines. In step 860, selected local bit lines will rise to or toward VPP. In step 862, the selected word line comb is pulled down to ground. In some embodiments more than one word line comb can be pulled down to ground. In other embodiments, only one word line comb can be selected at a time.

FIG. 23 shows transistor 910 being used to pull down word line 904 (a word line finger) to ground. Note in the example of FIG. 23, memory element 920 is on; therefore, when the floated bit lines rises toward ½ VPP, local bit line 900 may not rise all the way to ½ VPP because memory element 920 is conducting (low resistant state). Therefore, local bit line 900 may be a little bit below ½ VPP (in some cases as far down as ¼ VPP). In the above discussion, the bit lines are self-biasing, in that they are left floating and still able to bias the appropriate voltages to avoid disturbs. There is one half selected (H) memory element in each floating bit line which sees current from the floating bit line while the more numerous unselected memory elements (U) supply current to the unselected bit line. The self-biasing saves power and is safe for disturb. For unselected bit lines that have the half selected memory element (H) 922 in an off-state, the bit line rises to ½ VPP through unselected memory elements (U), but current is low and there is no disturb. For unselected bit lines that have the H memory element 920 in a low resistance state, the local bit line falls to a voltage in the range of ¼ to ½ VPP, but this self biasing wastes no power compared alternatives that might bias all bit lines at an unselected bit line bias and no memory elements are disturbed.

Figure 22B:
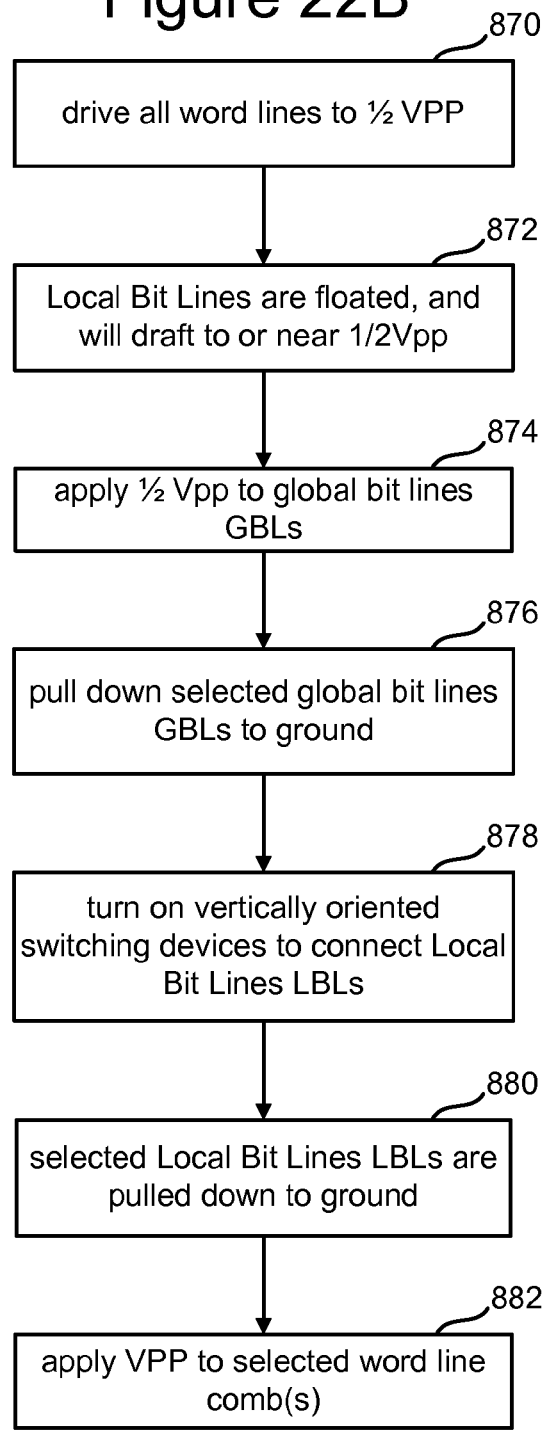

FIG. 22B is a flow chart describing other embodiments for programming memory elements. The process of FIG. 22B is similar to the process of FIG. 22A, except that the voltage differential experienced by the programmed memory elements has a reverse polarity. Therefore, if the process of FIG. 22A is used to SET the memory element, then the process of 22B can be can be used to RESET the memory element. Similarly, if the process of FIG. 22A is used to RESET the memory element then the process of FIG. 22B can be used to SET the memory element. In step 870 of FIG. 22B, all word lines are driven to a common signal of ½ VPP. In step 872, all local bit lines are floated and they will therefore drift to at or near ½ VPP. In step 874, ½ VPP is applied to the all global bit lines. In step 876, one or more data dependent signals are applied to the global bit lines; for example, the selected global bit lines are pulled down to ground. In step 878, the vertically oriented select devices are turned on to connect the selected local bit lines to the selected global bit lines. In step 880, the selected local bit lines are pulled down to or toward ground in response to being connected to the global bit lines. At step 882, VPP is then applied to the selected word line comb (or multiple word line combs in some embodiments) in order to create the appropriate differential to cause the programming operation to be performed.

FIG. 24 is a flow chart describing one embodiment of a process for reading memory elements. FIG. 25 is an accompanying partial schematic to explain the process of reading depicted in FIG. 24. In step 940 of FIG. 24, all word lines are driven to a common signal of Vread. In one embodiment Vread is equal to 2 volts; however, other values can also be used. In step 942, the local bit lines are floated; therefore, they will drift to or near Vread. Some floating local bit lines will drift to a voltage just under Vread if they are connected to a memory element in the low resistance state. In step 944, the global bit lines are charged to one or more signals; for example, the global bit lines are charged to Vread. In step 946, the selected word line comb (or in some embodiments multiple word line combs) are pulled down to ground. In step 948 the appropriate vertically oriented select devices are turned on in order to connect the appropriate selected local bit lines to the selected global bit lines. In step 950, current through the selected memory element (for example memory element 980 in FIG. 25) flows from the selected bit line, from the vertical select device, from the associated global bit line, through a current conveyor clamp device, and ultimately from a sense node in the associated sense amplifier. In step 952, the sense amplifier will sense the current and determine the state of the memory element.

FIG. 25 shows selected local bit lines 960, 962, as well as word lines 964, 966 (word line fingers). FIG. 25 also shows memory elements 980, 982, 984, and 986. Vread is applied to the unselected word lines, as depicted by transistor/switch 970. The local bit lines 960 and 962 will draft towards Vread. Switch 968 pulls down selected word line 964 to ground (see step 946). Because memory element 980 is turned on (low resistant state), bit line 960 may drift to a level a little bit less than Vread. In this example, both bit lines 960 and 962 are selected; therefore, current through memory elements 980 and 982 are passed to associated global bit lines (not shown) and to associated sense amplifiers. Since word line 966 is not selected, it is biased at Vread, memory elements 984 and 986 have zero or very close to zero volts differential bias and contribute negligible current to the associated selected bit line. If bit lines 960 were not selected either by floating or by connection to a global bit line with no associated sense amplifier, current would flow through memory element 980 decreasing the bit line 960 below Vread. Unselected memory elements 986 would conduct also and the bit line would drift to a voltage below Vread Since there is no connection to an active sense amplifier, this current is not sensed. For these unselected bit lines, the bit lines are self-biasing, in that they are left floating and still able to bias the appropriate voltages to avoid disturbs. There is one memory element 980 or 982 in each bit line connected to a selected word line 964 which sinks current from the bit line while the more numerous unselected memory elements (U) supply current to the bit line. The self-biasing saves power and is safe for disturb.

In one embodiment, when a double-gated vertically oriented select device is a non-ideal component, it may leak a small current when the connected global bit line and the connected row select line are both at ground. To prevent such leakage, one embodiment may include driving a small positive voltage (e.g. 0.75 volts or something near that value) rather than ground on the global bit line. In this way, the global bit line (the drain of the vertically oriented select device) will be at a higher potential than the gate, thereby ensuring that the select device remains off. To accomplish this, in one embodiment, VPP must also be raised by 0.75 volts. Note that the row select line will be at ground (not 0.75 volts). A similar situation can arise when performing a reset operation and, therefore, during a reset operation the global bit line can also be driven at 0.75 volts (rather than ground), and the signal VPP will also be raised by the same 0.75 volts (or other value).

Row Select

The above discussion describes how use of the vertically oriented select devices and word line combs (or other shapes of connected word lines) allows for a more compact memory system. Another means for reducing the size of the memory system is to reduce the area needed for row select line drivers. Looking back at FIG. 1, row select lines are depicted as $SG_1$, $SG_2$, $SG_3$, .... Additionally, FIG. 16 depicts the row select lines as gate material 522. The drivers for these row select lines are implemented in the substrate. It is desirable to reduce the area of the substrate needed to implement these drivers.

Figure 26:
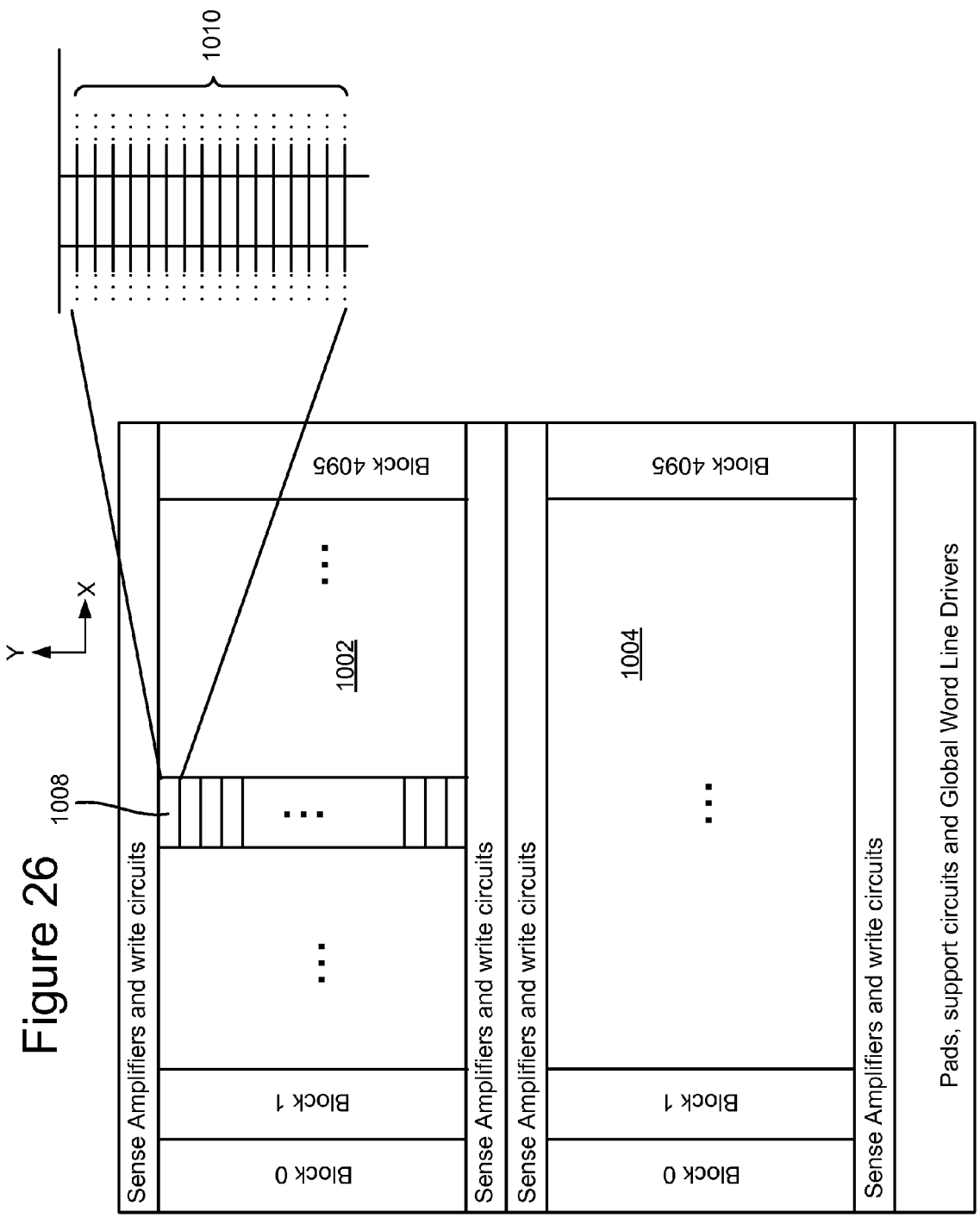
FIG. 26 is a block diagram depicting an architecture for a memory system.

FIG. 26 depicts a top view of a memory system (or a portion of a memory system). The memory system includes two memory arrays: memory array 1002 and memory array 1004. Memory array 1002 includes 4096 blocks of memory elements (Block 0, Block 1, ... Block 4095). Memory array 1004 also includes 4096 blocks of memory elements (Block 0, Block 1, ... Block 4095). At the top of each block and at the bottom of each block are sense amplifiers and write circuits. At the bottom of the entire system are pads, support circuits and global word line drivers.

In one example implementation, each block is the width of two interleaved word line combs (e.g., word line comb 800 and word line comb 802 of FIG. 19, or word line comb 840 and word line comb 842 of FIG. 20). The memory elements associated with sixteen word lines of two interleaved word line combs can be referred to as a comb group. In one embodiment, adjacent comb groups share the row of vertical bit lines at the top and bottom of the comb group. A block comprises many comb groups, for example 4096 comb groups, one of which is designated 1008 in FIG. 26. In one example implementation, each block will have sixteen levels of word lines; however, more or less than 16 levels can be used. Additionally, each comb group, in this example, will include sixteen rows of vertically oriented bit lines and therefore sixteen row select lines. For example, FIG. 26 shows comb group 1008 having sixteen row select lines 1010. Global bit lines (not shown in FIG. 26) lie below the memory layers and connect to local bit lines through the vertical select devices. In one embodiment global bit lines span comb groups in a block from the middle of the block to the top and from the middle of the block to the bottom. In another embodiment global bit lines span the entire height of the blocks.

Global word lines (which connect to the selected word line combs via a word line selection circuit not depicted in FIG. 26) extend across the entire chip. For example, the global word lines will extend across the entire memory system depicted in FIG. 26. In one embodiment, when a memory operation is performed, the system will select one word line comb, as described above. By activating one word line comb, the system will be activating two adjacent blocks since a word line comb has word line fingers extending to two adjacent blocks. Since only two blocks are selected by the word line combs, it is possible to select bit lines in many blocks without experiencing disturbs. Therefore, one proposal is that a row select signal can span across and connect to many blocks because only the two blocks will have the relevant word line comb selected. All the other blocks will have all word line combs unselected. All the memory elements connected to the selected vertical bit lines in blocks that have no word line combs selected, will only be half selected and will not experience a disturb (as described above). By extending the length of the row select line, the number of drivers for the row select line can be reduced. By reducing the number of drivers for the row select lines, the reduced number of drivers will be able to fit in the substrate underneath the memory elements or in a narrow band between the blocks.

In one embodiment, one row select line driver will drive a row select line that connects to vertically oriented select devices in 128 blocks. In one embodiment, a set of 128 blocks will have 16 row select line drivers with one driver for each of the sixteen row select lines for the comb groups arranged along a horizontal direction in the 128 blocks. In some example implementations, half of the row select line drivers will be on one side of the set of the blocks and half of the row select line drivers will be on the other side of the set of blocks such that the left and right side drivers will have their respective row select lines interleaved.

Figure 27:
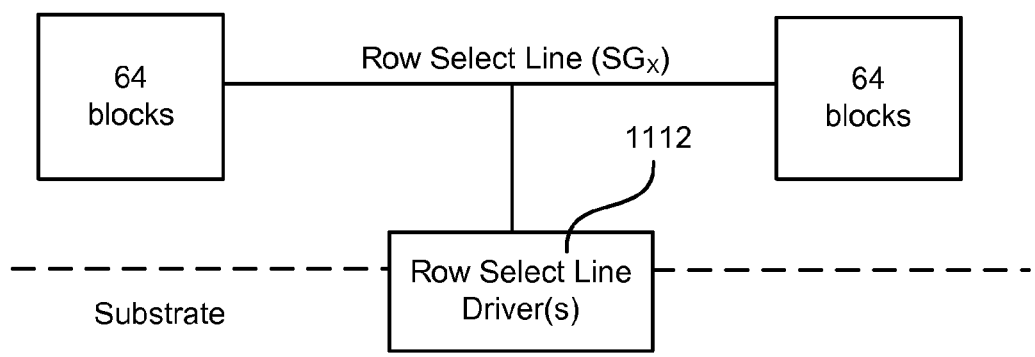
FIG. 27 is a block diagram showing a row select line driver and the associated row select line.

FIG. 27 illustrates one example of a row select line driver 112 driving a row select line $SG_x$ for 128 blocks. One or more row select line drivers 1112 are shown driving two sets of 64 blocks. On one side of the row select line drivers 112 are a first set of 64 blocks and on the other side of row select line driver 1112 are another set of 64 blocks. The row select line driver is implemented in the substrate while the 64 blocks of memory are located above the substrate.

FIG. 28A shows one example embodiment implementing the row select line drivers to drive 128 blocks. In the example of FIG. 28A, a complete set of sixteen row select line drivers 1030 for the 128 blocks are located in the middle of the blocks such that 64 blocks are on one side of the drivers 1030 and 64 blocks are on the other side of drivers 1030. Thus, if there are 4096 blocks in the memory array, there will be 32 sets of drivers 1030 positioned between a left set of 64 blocks and a right set of 64 blocks. FIG. 28A shows the row select lines emanating from drivers 130 to the left and to the right. In this manner, a row of vertically oriented bit lines are selected for all 128 blocks. Because only one word line comb (covering two blocks) is selected, only the memory elements in the two selected blocks will experience the memory operation. All the other memory elements will either be unselected or half selected, thereby avoiding disturbance.

FIG. 28B depicts another implementation of driving row select lines across 128 blocks. In this embodiment, between groups of 32 blocks, half of the necessary row select line drivers are positioned. That is, there will be eight drivers between each group of 32 blocks. For example, the top eight select lines are driven by eight drivers 1040 between a first pair of 32 blocks, the bottom eight row select lines are driven by eight drivers 1042 between a second pair of 32 blocks. Further down the array, another set of eight drivers 1044 will be located between another pair of 32 blocks, etc.

FIG. 28C depicts another example of arranging row select line drivers to be positioned in a distributed manner between blocks. In the example of FIG. 28C, between each group of eight blocks are two of the sixteen necessary row select line drivers. For example, FIG. 28C shows eight groups of eight blocks, including groups 1049, 1051, 1053, 1055, 1057, 1059, 1061 or 1063. Between groups 1049 and 1051, two row select line drivers 1050 are located. Between groups 1051 and 1053, two row select line drivers 1052 are located. Between groups 1053 and 1055, two row select line drivers 1054 are located. Between groups 1055 and 1057, two row select line drivers 1056 are located. Between groups 1057 and 1059, two row select line drivers 1058 are located. Between groups 1059 and 1061, two row select line drivers 1060 are located, between groups 1061 and 1063, two row select line drivers 1062 are located and to the right of group 1063 two row select line drivers 1064 are located. Each of the row select line drivers (1050, 1052, 1054, 1056, 1058, 1060, 1062, 1064, ... ) drive 64 blocks to the left and 64 blocks to the right. As the blocks are broken up into groups of eight, each word line driver will drive eight groups to the left and eight groups to the right. In another embodiment a different number of blocks to the left versus to the right are driven from each of the row select drivers. For example drivers 1050 drives 40 to the left and 88 to the right, driver 1052 drives 48 to the left and 80 to the right, driver 1054 56 to the left and 72 to the right, each driver in the sequence driving more to the left and fewer to the right until driver 1064 drives 96 to the left and 32 to the right. The extent of the 16 row select lines are coincident in such an arrangement and fewer row select drivers are needed at the edge of the array of blocks. In yet another embodiment, for any given block, the respective row select line drivers are interleaved between the left side and the right side. Other arrangements can also be used.

Figure 29:
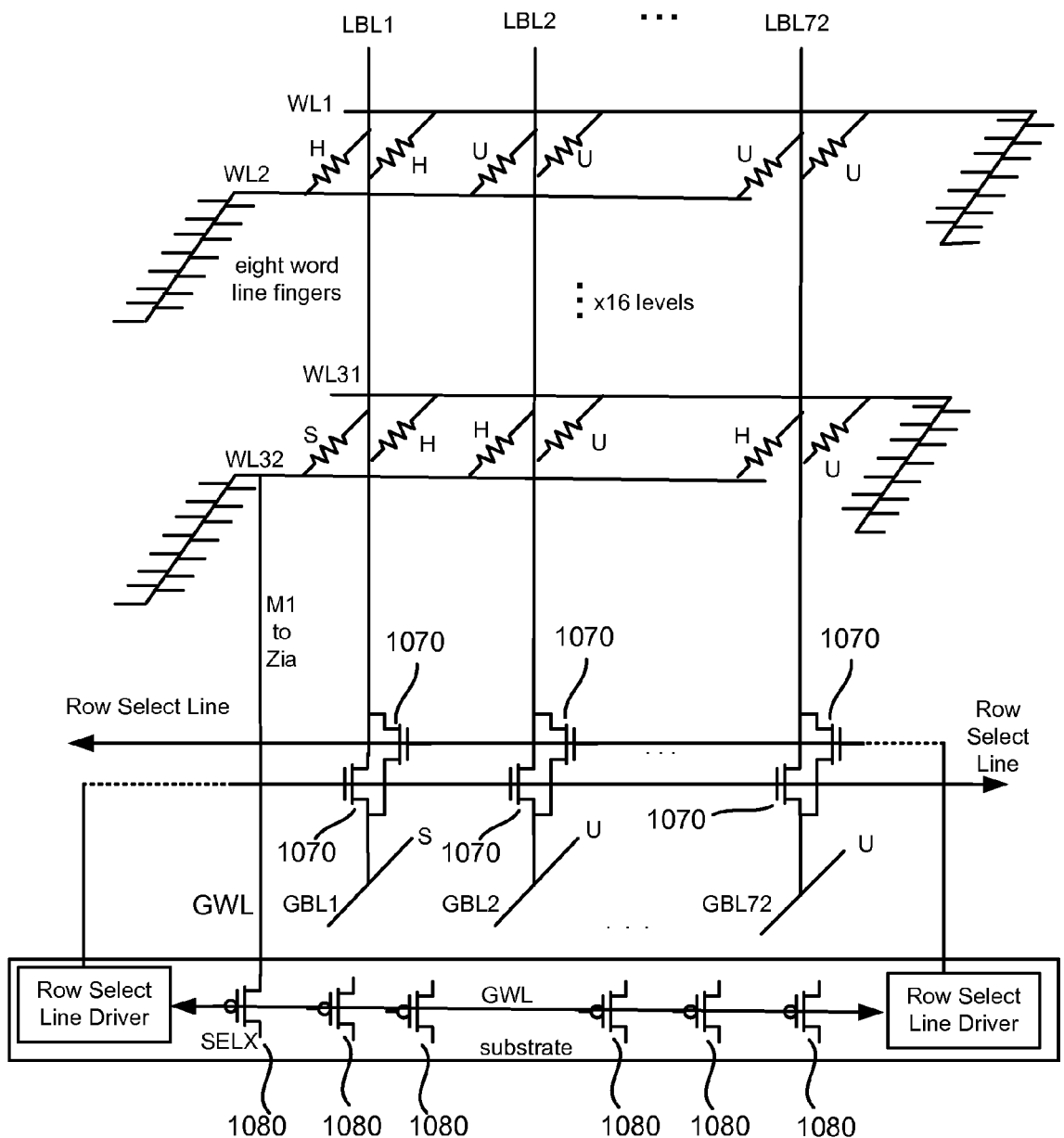
FIG. 29 is a schematic of a portion of the memory system, depicting vertical bit lines, vertically oriented select devices above the substrate, word line combs, and row select lines that run across multiple blocks of memory elements.

FIG. 29 is a partial schematic depicting a portion of one comb group in a block and some of the support circuitry. FIG. 29 shows bit lines LBL1, LBL2, ... , LBL72, all of which are vertically oriented bit lines as discussed above. FIG. 29 also shows four word lines WL1, WL2, WL31 and WL32. In one embodiment, WL1 and WL2 are part of different word line combs on the same level. Word line WL31 and word line WL32 are also on the same level and connected to different word line combs. In the embodiment of FIG. 29, there are 16 levels, with two word line combs per level, eight word line fingers extending into a block from each word line comb, and 72 bit lines on each side of a word line. Therefore, in one embodiment, a comb group in a block includes 72×17=1224 bit lines including the shared bit lines at the comb edges, 8×2=16 word line fingers per level and a total of 16×16=256 word lines fingers. Each of the global word lines GWL are driven by a MOSFET select device 1080 in the substrate, which is PMOS in some embodiments and NMOS in other embodiments. Each of the vertically oriented select devices 1070 are connected to a global bit line (GBL1, GBL2, ... , GBL72) and an appropriate row select signal. The vertically oriented select devices 1070 and the row select lines are implemented above the substrate, as described above. The row select lines span across 128 (or another number of) blocks and eventually connect to row select line drivers in (and/or on the substrate). In one embodiment, the global word line connects to the gate of word line drivers 1080, which connect the word line to SELX source inputs to drive the various word line combs to either a selected or unselected voltage. The word line driver 1080 and SELX signal lines carry significant current when the word line is selected and are non-minimum devices and metal lines respectively.

In the embodiment of FIG. 29, it is assumed that one word line comb is selected and none of the other three word line combs are selected. Additionally, it is assumed that GBL1 is selected for programming while GBL2 and ... GBL72 do not have data for programming. Therefore, the memory element between WL32 and LBL1 is selected for programming. The other memory elements between WL32 and the other bit lines are half selected (H). The memory element between WL31 and LBL1 is half selected (H). The other memory elements connected to WL31 being unselected (U). For WL1, WL2, and the first word line of each word line comb for the other 14 levels, the memory element connected to LBL1 is half selected (H) and all the other memory elements are unselected. In light of the above, none of the memory elements that are not selected will be disturbed. As can be seen from FIG. 29, each bit line connects to two word line combs on each of the sixteen levels. Therefore, the fan out of each bit line is 32 memory elements (16 levels×2 memory elements per level). Additional memory elements associated with adjacent rows of vertical bit lines are not shown to make the drawing clearer. Some of those additional memory elements connect to WL1, WL2, or WL31 and are unselected. Other of those additional memory elements connect to WL32 and are half selected. Operation of the system includes driving signals on word lines and global bit lines, using row select line drivers to apply signals on a plurality of row select lines, activating a plurality of select devices based on the signals applied to the row select lines (with each block of memory elements connected to a different subset of the select devices and each row select line connects to a subset of the select devices for multiple blocks), and communicating signals from the global bit lines to vertically oriented bit lines above and not in the substrate using the select devices.

Figure 30:
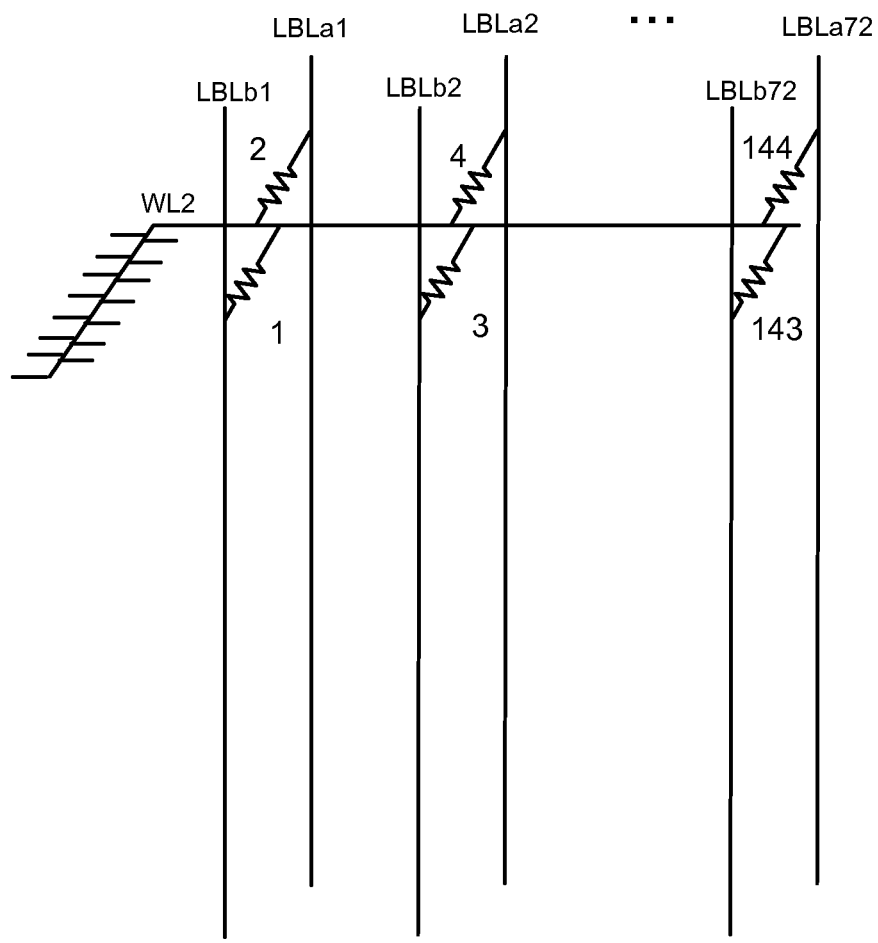
FIG. 30 is a schematic of a portion of the memory system, depicting vertical bit lines, word line combs, word lines and memory elements.

FIG. 30 shows that each word line finger interacts (via memory elements) to 72 local bit lines on one side of the word line finger and 72 bit lines on the other side of the word line. Therefore, there are 144 memory elements connected to each word line finger. Since there are 8 word line fingers connected to each word line comb, the fan out of a word line comb is 1152 memory elements (8 fingers×144 memory elements per finger). Therefore the fan out of a bit line is significantly less than the fan out of a word line comb. Additionally, the fan out of a bit line is less than the fan out of a word line finger.

The fan out of a row select line driver is 9216 (128 blocks×72 local bit lines per block). Therefore, the fan out of a bit line, the fan out of a word line finger, and the fan out of a word line comb are all individually less than the fan out of the row select line driver.

The global bit line spans across all 4096 comb groups of a block; therefore, the fan out of a global bit line is 65,536 (4096 blocks×16 rows of bit lines). The fan out of a global word line is 65,536. Therefore, the fan out of the global word line and the fan out of the global bit line are both bigger than the fan out of a bit line, the fan out of a word line, the fan out of a word line comb and the fan out of a row select line driver.

The fan out of the various lines driving the memory core is devised to balance the area of these drivers which dominate the support circuit area of the chip and thereby produce the most efficient memory chip. Low fan out lines have the most number of drivers. High fan out lines have the least number of drivers while serving the same number of memory elements. The optimum chip would associate the most compact driving circuit with the lowest fan out line because it has the largest number of drivers. Vice versa, an optimum chip would associate the most area consuming circuit with the highest fan out line. In the above embodiment of the memory chip, the optimum chip efficiency is achieved by the association of drivers and fan outs for bit lines, word lines, row select gate driver, global word line and global bit line. The bit line is driven by the most compact driver, it being a single vertically oriented thin film transistor and is given the smallest fan out, which implies the largest number of devices. The word line is driven by a single device driver which is next in the rank of driver area. The row select driver, as described below, is a three device driver and third in driver area rank. And finally the global bit and global word line driving circuitry involves more complicated decoding circuitry and are of approximately equal complexity. The increasing rank of driving circuitry complexity is aligned with the increasing fan out of the driven line to achieve the optimum efficiency of the memory system.

Three Device Driver for Row Select

Figure 31A:
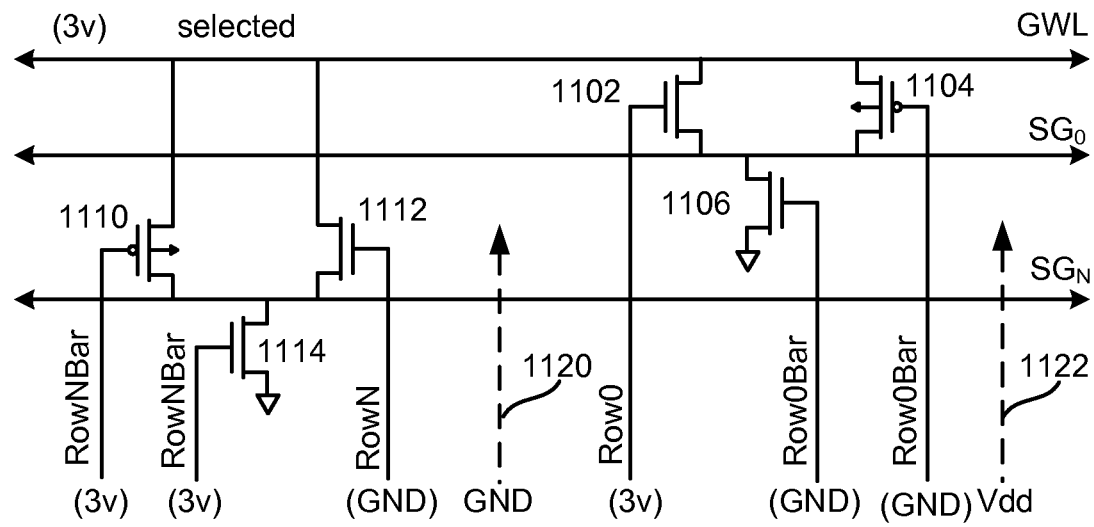
FIGS. 31A and B are schematics that depict row select line drivers.

FIG. 31A depicts a partial schematic that includes one example embodiment of a row select line driver that can be used with the vertical bit line architecture described above (including the vertically oriented select devices, word line combs, and extended row select lines described above). The row select line driver of FIG. 31A includes three metal oxide semiconductor field effect transistors (MOSFET). For example, one row select line driver includes nMOS transistor 1102, pMOS transistor 1104 and nMOS transistor 1106. The source input of nMOS transistor 1102 and the source input of pMOS transistor 1104 are connected to the Global Word Line (GWL). The drain of nMOS transistor 1102 and the drain of pMOS transistor 1104 are connected to the row select line ($SG_0$). The drain of nMOS transistor 1106 is also connected to the row select line $SG_0$. The source of nMOS transistor 1106 is connected to ground. The gate of nMOS transistor 1102 is connected to a selection line Row0. The gate of nMOS transistor 1106 and pMOS transistor 1104 are both connected to selection line Row0Bar.

FIG. 31A also shows a second row select line driver comprising pMOS transistor 1110, and nMOS transistor 1112 and nMOS transistor 1114. The sources of pMOS transistor 1110 and nMOS transistor 1112 are connected to the Global Word Line GWL. The drains of pMOS transistor 1110 and nMOS transistor 1112 are connected to row select line $SG_n$. The gate of pMOS transistor 1110 is connected to the selection line RowNBar. The gate of nMOS transistor 1112 is connected to selection line RowN. The drain of nMOS transistor 1114 is connected to row select line $SG_n$ and the source of nMOS transistor 1114 is connected to ground. The gate of nMOS transistor 1114 is connected to RowNBar. Between the row select line driver comprising transistors 1110, 1112, and 1114 and the row select line driver comprising transistors 1102, 1104 and 1106, is a ground line to provide ground to nearby electric components. On the other side of the row select line driver comprising transistors 1102, 1104 and 1106, is a power line supplying VDD to nearby components.

In parentheses are voltage values applied to the various lines of FIG. 31A to explain one example of operation of the row select line drivers depicted therein. In this example, three volts is applied to the Global Word Line, RowNBar and Row0. Ground is provided to RowN and Row0Bar. In such a configuration, Row0 is selected and RowN is not selected. That is, the row select line driver for Row0 (comprising transistors 1102, 1104 and 1106) is turned on and the row select line driver for RowN (comprising transistor 1110, 1112 and 1114) is turned off. Therefore, a selection signal of three volts will be driven on the row select line for Row0 ($SG_0$) and ground will be provided on the row select line for RowN ($SG_n$). As transistor 1102 receives three volts at its gate and transistor 1104 receives ground at its gate, both transistors turn on and current will flow from the Global Word Line to $SG_0$ through pMOS transistor 1104. $SG_0$ will be driven to 3 volts. Therefore, all of the vertically oriented select devices connected to $SG_0$ will be turned on, thereby connecting respective global bit lines to respective vertical local bit lines (selectively putting the respective vertical local bit lines in communication with respective global bit lines). Since the gate of pMOS transistor 1110 receives three volts and the gate of nMOS transistor 1112 receives ground, both transistors will remain off. Since the gate of transistor 1114 receives three volts, it will turn on and pull the row select line $SG_n$ to ground. Those vertically oriented select devices receiving $SG_n$ will not turn on and the respective vertical local bit lines will not be connected their respective global bit lines.

Figure 31B:
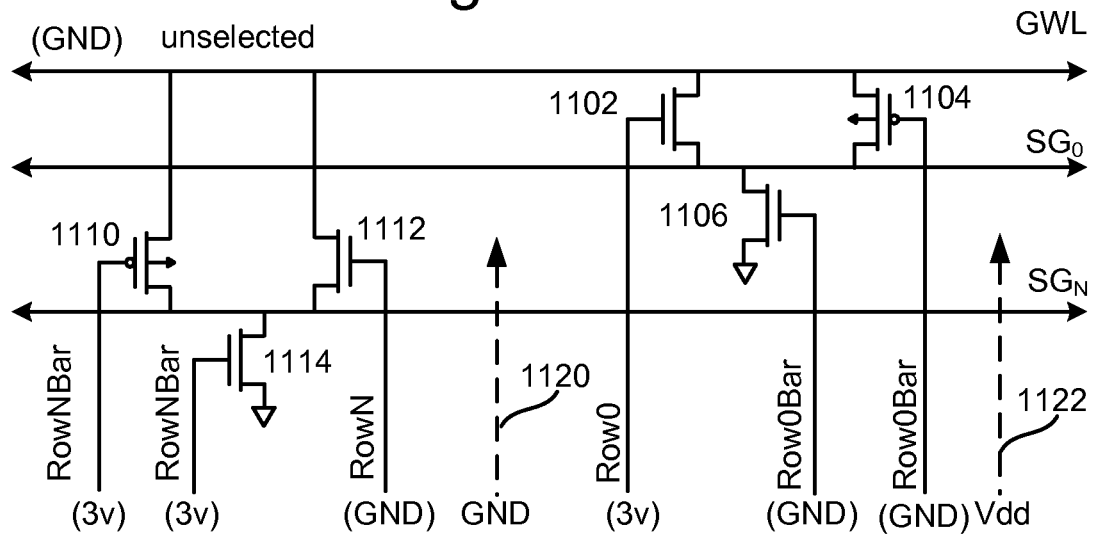

FIG. 31B shows the same circuit as FIG. 31A, but with different biases. The Global Word Line now receives ground indicating that it is unselected. The signal lines RowN and Row0Bar are at ground. The signal lines Row0 and RowNBar receive three volts. So, the difference between FIG. 31A and FIG. 31B is that in FIG. 31A the Global Word Line is selected (receives three volts) and in FIG. 31B the Global Word Line is unselected (at ground). As the gate of nMOS transistor 1102 is at three volts and the gate of pMOS 1104 is at ground, both transistors are turned on. In this case, the Global Word Line (at ground) will pull down the row select line $SG_0$ to ground through nMOS transistor 1102. As the gate of nMOS transistor 1106 receives ground, that transistor is off. Since the pMOS transistor 1110 receives three volts and the gate of nMOS transistor 1112 receives a ground potential, both transistors remain off. Since nMOS transistor 1114 receives three volts at its gate, that transistor is turned on and the row select line $SG_n$ is pulled down to ground via nMOS transistor 1114. In the example of 31B, both row select lines depicted are at ground so that the vertically oriented select devices will not connect their respective vertical bit lines to the respective global bit lines.

Each global word line connects to one word line comb group in a block. SELX signals described above are connected to associated word line combs by the word line driver devices which are turned on by the global word line at 3 volts. A selected SELX bias is passed to the selected word line comb. Therefore, by driving three volts on a particular global word line, one word line comb will be selected for the memory operation and the appropriate sixteen (or a different number) of row select line drivers will also be enabled. The selection signals Row0, Row0Bar, Row1, Ro1Bar, . . . RowN, RowNBar are used to select between the sixteen row select line drivers associated with the particular global word line. As discussed above, in one embodiment, each row select line driver will drive a row select line ($SG_x$) that connects to 128 blocks (or a different number of blocks, depending on the particular implementation).

FIGS. 31A and 31B show the three transistors (components) forming a row select line driver to be adjacent to each other. In other embodiments, the three transistors are distributed throughout the memory array. For example, the transistors can be underneath different blocks or between different blocks (which still qualifies as being under the memory array since the drivers are located within the edges/borders of the array). In one example embodiment, the area between blocks is referred to as the word line break because one or more word lines (e.g., half of the word lines for a block) will end at the edge of a block. Thus, there is a break (at least a partial break) in the word lines between blocks. The word line break can also be thought of as a gap between blocks. In one embodiment, one transistor (of a row select line driver) will be positioned in a word line break. That is, in the gap between adjacent blocks there will be transistor that will form part of a row select line driver. Therefore, the three transistors for a word line driver will be in three different word line breaks. FIGS. 31A and B depict one example of selectively connecting the global bit lines to the vertically oriented bit lines using vertically oriented select devices controlled by row select lines, where the selectively connecting includes driving the row select lines using row select line drivers and using a particular row select line driver includes controlling components that are distributed in different gaps between the blocks.

Figure 32:
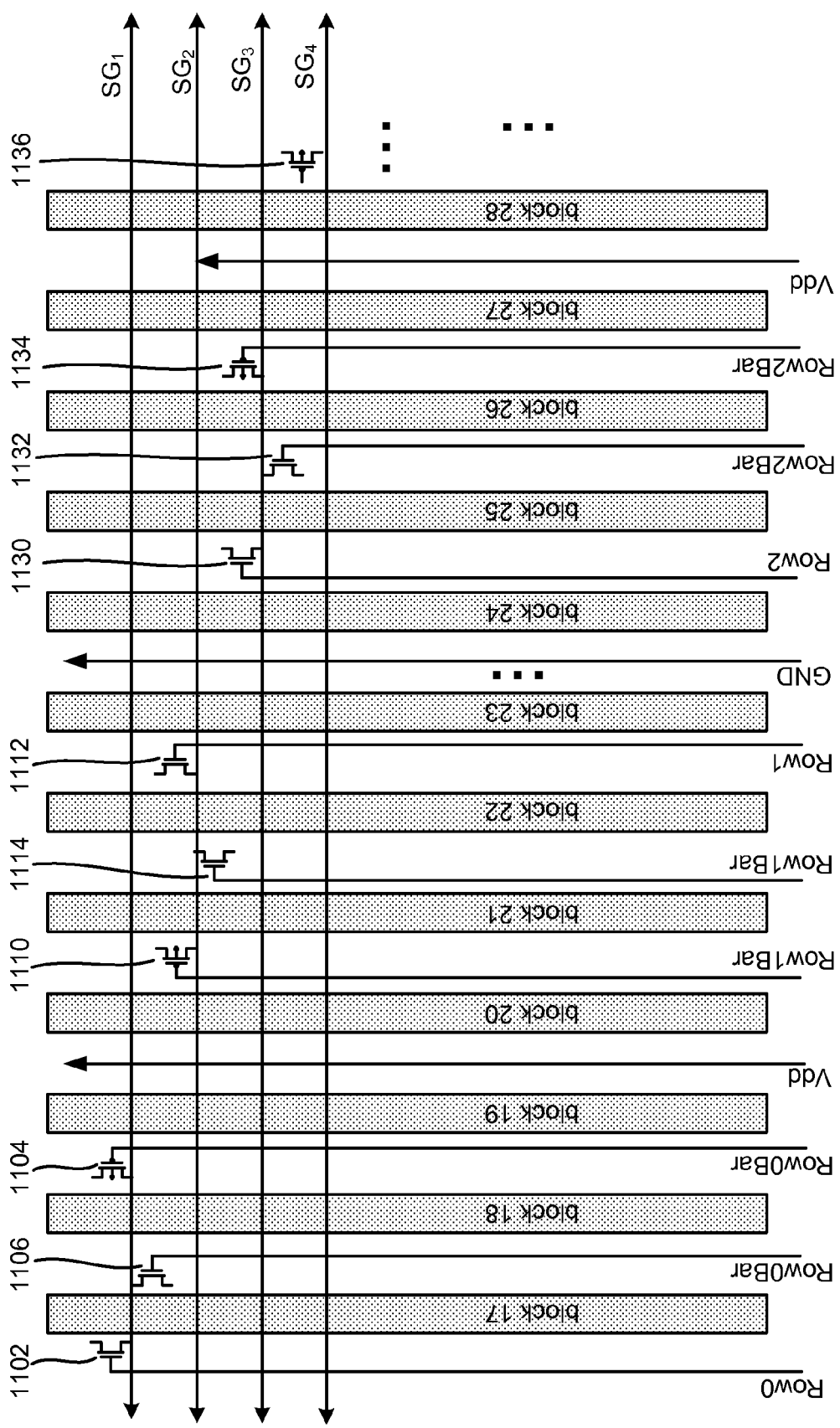
FIG. 32 is a block diagram depicting the distributed placement of the components of the row select line drivers.

FIG. 32 depicts one embodiment where the gap between each block (word line break) will include (with respect to the row select line drivers) only one transistor from a three device row select line driver. Therefore, FIG. 32 shows the components of a row select line driver being distributed to different locations in the memory array. Each of the transistors of a row select line driver will be implemented in the substrate underneath the array in the area between blocks (e.g., the word line break). For example, transistor 1104 (see FIGS. 31A and 32) is positioned in the substrate underneath and between block 18 and block 19. Transistor 1106 is positioned between block 17 and block 18. Transistor 1102 is positioned between block 17 and block 16 (block 16 is not depicted in FIG. 32). Transistor 1110 is positioned between block 20 and block 21. Transistor 1114 is positioned between block 21 and block 22. Transistor 1112 is positioned between block 22 and block 23. As in FIG. 31A, transistors 1102, 1104 and 1106 are used to drive (and connect to) row select line $SG_1$. Transistors 1110, 1112 and 1114 are used to drive (and connect to) row select line $SG_2$.

In one embodiment, there are sixteen row select lines for each comb group in a block and shared by 128 or other number of comb groups horizontally adjacent in 128 blocks. Vertically in each block there are many other comb groups (for example 4086) each requiring an additional set of row select lines. Each set of row select lines is selected by an associated global word line (one of 4086 in this example) passing under the associated comb group. Thus, the set of blocks depicted in FIG. 32 would include sixteen row select lines and sixteen row select line drivers for each comb group arranged vertically along the height of a block. Because of spacing, FIG. 32 only shows four select lines and three complete row select line drivers. The third select line driver includes nMOS transistor 1130, nMOS transistor 1132 and pMOS transistor 1134 driving (and connected to) row select line $SG_3$. FIG. 32 also shows transistor 1136, which is one transistor of the three transistors that will comprise a row select line driver for driving row select line $SG_4$.

FIG. 32 also shows a power line providing Vdd for the circuit components and signal lines providing ground (GND) for the various components. In one embodiment, the signal line for providing Vdd is only provided between pMOS devices. That is, the signal from Vdd will be provided in a word line break that does not include any transistors for row select line drivers. The adjacent word line breaks will include pMOS devices. Alternatively stated, the Vdd power line will be positioned in a gap (e.g., word line break) between blocks such that the other side of each of the adjacent blocks will have a gap (e.g., word line break) occupied by pMOS transistors. In one embodiment, the signal lines providing ground will only be provided between nMOS transistors. For example, FIG. 32 shows a ground line positioned in a word line break (between Block 23 and Block 24) that is between and adjacent to word line breaks containing nMOS transistor 1112 and the word line break containing nMOS transistor 1130. Alternatively said, the ground signal is provided between word line breaks that include only nMOS devices for the row select line drivers.

Note that FIG. 32 shows the transistors for a given row select line driver positioned in consecutive word line breaks (e.g., adjacent gaps). However, in other embodiments, the transistors can be distributed in nonadjacent word line breaks. In some embodiments, transistors for different row select line drivers can be positioned in interleaved word line breaks (e.g., gaps between the blocks). In other embodiments, more than one transistor for one or more row select line drivers can be in the same word line break. However, by only having one transistor in a word line break the spacing between blocks can be made smaller. Also, by having only one transistor in word line breaks, only one signal line (that is orthogonal to the row select lines) needs to be provided between the blocks which also allows the area between blocks to be smaller. If the area between blocks is smaller, the area occupied by the memory system will thereby be smaller.

Dual Gate Selection

Figure 33:
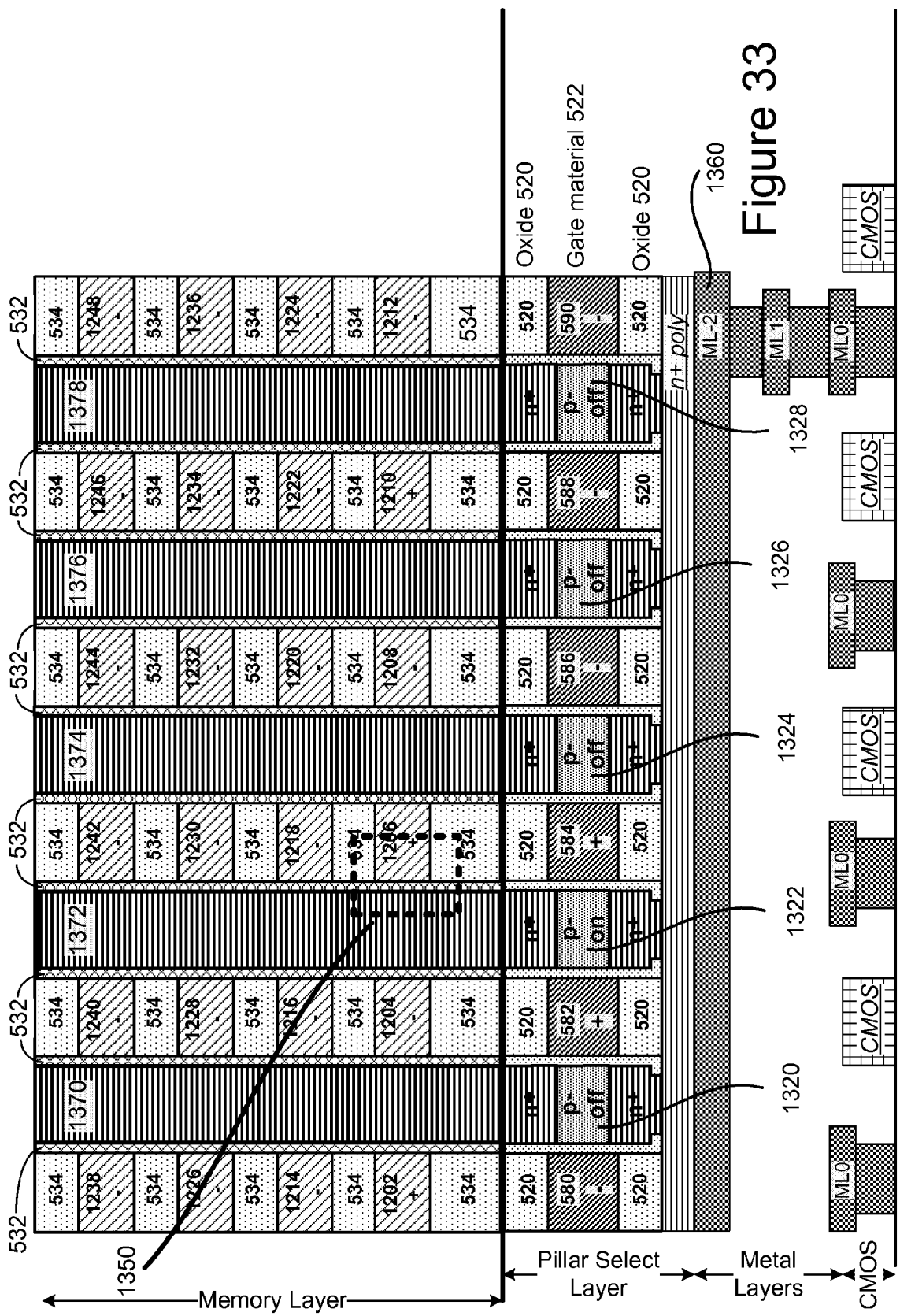
FIG. 33 depicts the structure of FIG. 10, operated by selecting two row select lines.

FIG. 33 depicts one embodiment of the memory system that includes vertical bit lines, the vertically oriented select device, the word line combs and the distributed three device drivers for the rows select lines, as described above. For example, the structure of FIG. 33 (identical to the structure of FIG. 10), includes word lines 1202, 1204, 1206, 1208, 1210, 1212, 1214, 1216, 1218, 1220, 1222, 1224, 1226, 1228, 1230, 1232, 1234, 1236, 1238, 1240, 1242, 1244, 1246 and 1248. In the pillar select layer are vertically oriented select devices 1320, 1322, 1324, 1326, and 1328. These vertically oriented select devices are double gated (have two gate interfaces), as discussed above, and are activated (e.g., turned on) by row select lines 580, 582, 584, 586, 588 and 590. FIG. 33 also shows vertical bit lines 1370, 1372, 1374, 1376 and 1378. For example purposes, it is assumed that memory element 1350 is selected for a memory operation (set, reset, or read). FIG. 33 also shows global bit line 1360 in metal layer 2 (ML-2).

In one embodiment, in order to turn on one of the vertically oriented select devices (1320, 1322, 1324, 1326, and 1328) to select a vertical bit line (1370, 1372, 1374, 1376 and 1378), two of the row select lines (580, 582, 584,

586, 588 and 590) need to be turned on. In one implementation, for a particular vertically oriented select device to be turned on, both of the row select lines connected to the double gated structure of the vertically oriented select device are turned on. That is the row select lines connected to the two gate interfaces for the select device are carrying an "on" signal. For example, to perform a network operation on memory element 1350, word line 1206 must be activated and local bit line 1372 must be activated. To select local bit line 1372, vertically oriented select device 1322 must be turned on. To turn on vertically oriented select device 1322, row select lines 582 and 584 must be turned on. In FIG. 33, row select lines 582 and 584 show a "+" to indicate that those row select lines are turned on, while the other row select lines show a "−" to indicate that they are turned off. Similarly, vertically oriented select device 1322 indicates that it is "on" while the other vertically oriented select devices indicated that they are "off." Word line 1206 also includes a "+" to indicate that it is selected. Because the system of FIG. 33 includes word line combs, all of the word line fingers in the same word line comb will be turned on. Therefore, word lines 1202, 1206 and 1210 (each of which are word line fingers on the same word line comb) are depicted with "+" to indicate that those word lines are selected. The other remaining word lines depict a "−" to indicate that they are unselected. As described above, this embodiment includes applying one or more selection signals to row select lines on two sides of a particular vertically oriented bit line to activate a respective double gated vertically oriented select device connected to the particular vertically oriented bit line in order to put the particular vertically oriented bit line in communication with a respective global bit line;

In one embodiment, the vertically oriented select devices (e.g., 1320, 1322, 1324, 1326, 1328, . . . ) are modified so that two gates are required to provide a sufficient voltage in order to turn on the vertically oriented select device. For example, the doping of the channel of the vertically oriented select device is increased. Therefore, an "on" voltage from both row select lines connected to the dual gate structure is required in order for the threshold voltage of the transistor to be met and current to flow in the channel.

Figure 34:
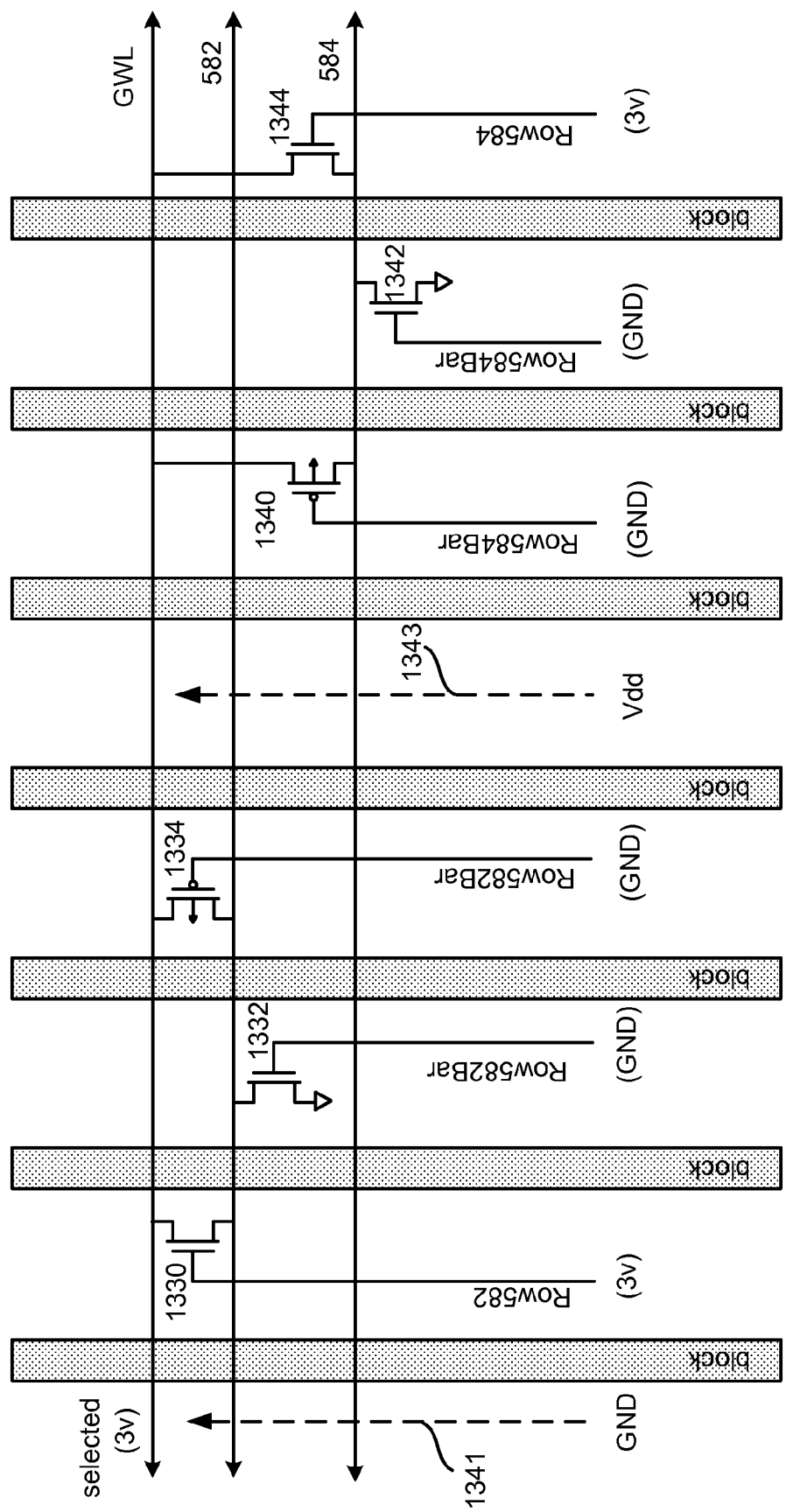
FIG. 34 is a block diagram depicting the distributed placement of the components of the row select line drivers when operating the structure of FIG. 33 by selecting two row select lines.

FIG. 34 depicts the distributed row select line drivers (as described above) utilized to drive row select lines 582 and 584 to turn on vertically oriented select device 1322 in order to select bit line 1372 so that memory element 1350 can be programmed. The row select line driver for driving row select line 582 includes nMOS transistor 1330, nMOS transistor 1332 and pMOS transistor 1334. The source inputs of nMOS transistor 1330 and pMOS transistor 1334 are connected to the global word line (GWL). The drain connections of nMOS transistor 1330 and pMOS transistor 1334 are connected to row select line 582. This drain of nMOS transistor 1332 is connected to row select line 1304. The source of nMOS transistor 1332 is connected to ground. The gate of nMOS transistor 1330 to Row582. The gate of nMOS transistor 1332 and the gate of nMOS transistor 1334 are connected to Row582Bar. In the example discussed above, Row582 receives three volts (or a different value) and Row582Bar is at ground; therefore, pMOS transistor 1334 provides that three volts from the global word line to row select line 582.

The row select line driver for row select line 584 includes pMOS transistor 1340, nMOS transistor 1342 and nMOS transistor 1344. The source of pMOS transistor 1340 and nMOS transistor 1344 connected to the global word line GWL. The drain of pMOS transistor 1340 and the drain of nMOS transistor 1344 are connected to row select line 584. The source of nMOS transistor 1342 is connected to ground and the drain of nMOS transistor 1342 is connected to row select line 584. The gate of nMOS transistor 1344 is connected to Row584. The gates of transistors 1340 and 1342 are connected to Row584Bar. In this case, Row84 receives three volts (or a different value) and Row584Bar receives ground such that pMOS transistor 1340 provides the three volts from the global word line to row select line 584. In some embodiments, Row582 and Row584 can receive different voltages to actuate the select device.

As discussed above with respect to FIG. 32, each of the components of the row select line drivers depicted in FIG. 34 are distributed such that one transistor is located between each pair of blocks (e.g. in the word line break or gap between blocks). Additionally, FIG. 34 shows signal line 1341 providing ground between two blocks (e.g. in the word line break or gap) and signal line 1343 providing Vdd (in the word line break or gap between blocks). The arrangement of FIG. 34 provides the appropriate signal on row select lines 582 and 584 in order to drive vertically oriented select device 1322 (see FIG. 33).

Figure 35:
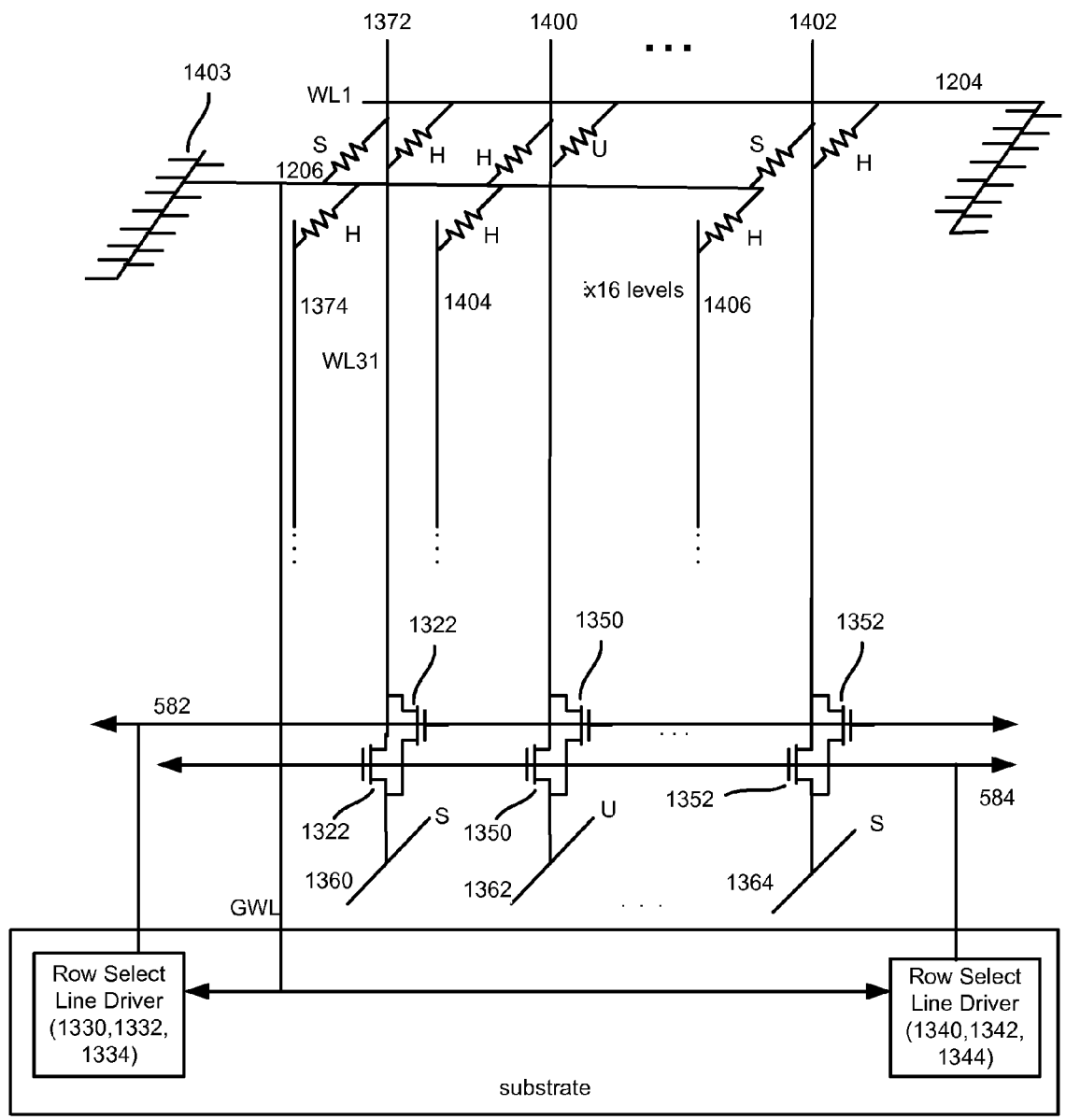
FIG. 35 is a schematic of a portion of the memory system, depicting vertical bit lines, vertically oriented select devices above the substrate, word line combs, row select lines that run across multiple blocks of memory elements, and operating the structure of FIG. 33 by selecting two row select lines.

FIG. 35 is a partial schematic that shows the two row select line drivers from FIG. 34 being implemented in the substrate and driving row select lines 582 and 584 in order to turn on vertically oriented select devices 1322, 1350 and 1352. In the example of FIG. 35, global bit line 1360 is selected for programming. Because of the data pattern being stored, global bit line 1362 is not selected and global bit line 1364 is selected. In one embodiment, there would be 72 global bit lines for the particular block, and some bits will be selected while other bits will not be selected for programming based on the data pattern. FIG. 35 shows two word line combs at one particular level of the sixteen levels of the block. Specifically, FIG. 35 shows word lines 1204 and 1206 interacting with bit lines 1372, 1374, 1400, 1402, 1404 and 1406. In one embodiment, there will be 72 bit lines in each row. By driving row select lines 582 and 584, one row is selected that includes bit lines 1372, 1400, . . . 1402 (e.g., 72 bit lines). Word line comb 1403 is also selected. Word line comb 1403 includes word lines 1202, 1206, and 1210 (see FIGS. 33 and 35). Note that word lines 1202, 1206, and 1210 are word line fingers for word line comb 1403.

Word line 1206 (as well as the entire word line comb 1403) is selected for the memory operation. Word line 1206 includes memory elements connected to two different rows of local bit lines. The first row of local bit lines includes local bit lines 1372, 1400, . . . , 1402. The second row of local bit lines includes local bit lines 1374, 1404, . . . , 1406. Because only one row of local bit lines is selected (due to the selection of row select lines 582 and 584), only the memory elements between word line 1206 and the row of bit lines 1372, 1400, . . . 1402 will potentially be selected for the memory operation. Due to the data patterns on the global bit lines, the memory element between word line 1206 and bit line 1372 and the memory element between word line 1206 and bit line 1402 are fully selected (S) because both their word line and bit line are selected for the memory operation. The memory element between word line 1206 and bit line 1374, the memory element between word line 1206 and bit line 1404, the memory element between word line 1206 and bit line 1406, and the memory element between word line 1206 and bit line 1400 is only half selected (H) because only one of the two control lines are selected for the memory operation. As discussed above, half selected memory elements will not see a large enough voltage differential to undergo the memory operation.

FIG. 36 is a flow chart describing one embodiment for performing a memory operation. In step 1450, the unselected word line voltage is applied to the unselected word lines. In one embodiment, the unselected word line voltage is applied to all word lines. In another embodiment, the unselected word line voltage is applied to all word lines and bit lines in step 1450. In step 1452, an unselected bit line voltage is applied to the global bit lines. In one embodiment the unselected bit line voltage is applied to all global bit lines. Additionally, in some embodiments, step 1452 includes allowing all the local bit lines to float. By floating the local bit lines, they will drift towards the unselected word line voltage. Some memory elements may drift to a voltage just below the unselected word line voltage if the attached memory element is in the low resistance state. At step 1454, a selected bit line voltage is applied to the global bit lines based on the appropriate data pattern being stored. In step 1456, a selection signal is provided to the row select lines on both sides of the vertical bit line for the particular memory element being programmed or read. For example, to perform an operation on memory element 1350, select lines 582 and 584, on both sides of the local bit line 1372 and its associated vertically oriented select device 1322 are driven with three volts. In step 1460, the selected word line voltage is applied to the selected word lines (e.g. applying the appropriate selected word line voltage to the selected word line comb). In step 1462, the memory operation (set, reset, read) is performed. Note that the steps of FIG. 36 can be performed in other orders than that depicted in FIG. 36. Additionally, two or more of the steps can be performed concurrently.

Asymmetrical Switch

With the word line comb arrangement discussed above, there could be a problem with multiple memory elements being selected based on a single vertically oriented select device turning on. That is, with the word line comb arrangement, the entire word line comb is selected. Therefore every other word line along a slice will be selected. FIG. 37 shows the structure of FIG. 33 with one proposed solution. In this solution, the vertically oriented select devices (1520, 1522, 1524, 1526, 1528, . . . ) are fabricated as asymmetrical devices, each having two gate interfaces. Each asymmetrical vertically oriented select device has one of the row select lines connected to a first gate interface for the respective asymmetrical vertically oriented select device and another of the select lines connected to a second gate interface for the respective asymmetrical vertically oriented select device; for example, row select lines 582 and 584 are connected to the two gate interfaces for asymmetrical vertically oriented select device 1522. In some embodiments, the asymmetrical aspect of the select devices is a difference in threshold voltage that is produced by doping level differences (e.g., asymmetrical doped) in the channel (e.g., asymmetrical channel), gate oxide thickness differences (asymmetrical gate oxides such that the left gate oxide has a different thickness than the right gate oxide), a gate material work function difference or a combination of these methods. In one embodiment, the TFT channel receives an angled implant so that the left side of the channel (at a first gate interface) has a lower threshold voltage than the right side of the channel (at a second gate interface). An angled n type channel implant after oxide deposition produces a lower threshold for the channel on the left side of the vertical TFT device as compared to the right side of the TFT. Thus, the left side of the select device (including the left gate interface) will act like a depletion mode transistor and the right side of the select device (including the right gate interface) will act like an enhancement mode transistor. In other words, for the double gated switch, the left gate will be a depletion mode transistor and the right gate will be an enhancement mode transistor. In other embodiments the channel implantation is combined with implantation into the gate material to produce a gate oxide thickness difference and a work function difference of the gate material. The gate material could be doped polysilicon. An high level p type angled implantation before gate oxide growth into the polysilicon gate material on the right side of the TFT raises the work function of the gate material, raises the threshold of the associated channel, and increases the gate oxide thickness. Diffusion of p type dopant through the gate oxide during a high temperature anneal of the TFT in some embodiments increases the p doping in the channel and further raises the enhancement side threshold. In the above described embodiments, the asymmetrical nature of the channel of the select device is asymmetrical with respect to the direction in the channel from the first/left gate interface to the second/right gate interface.

FIG. 37 shows vertically oriented select devices 1520, 1522, 1524, 1526 and 1528, each of which has two gate interfaces (e.g., a first gate interface and a second gate interface). Select device 1522, for example, is depicted to include an enhancement mode side 1522e (at the left gate interface) with a higher threshold voltage and a depletion mode side 1522d (at the right gate interface) with a lower threshold voltage. In one example, the left side of the channel (at the left gate interface) has a threshold voltage of approximately zero volts and the right side of the channel (at the right gate interface) has a threshold voltage of approximately three volts. In other embodiments, other values for the threshold voltage can be used (e.g., one and four volts, respectively). Similarly, the right side of switch 1520 will have a high threshold voltage and the left side of vertically oriented select device 1520 will have a low threshold voltage. Therefore, when row select line 582 is driven to three volts, the depletion mode side (the left side) of switch 1522 will turn on while the enhancements of mode side (the right side) of vertically oriented select device 1520 will not turn on. Therefore, local bit line 1372 will be selected and local bit line 1370 will not be selected. Selecting bit line 1372 will enable memory element 1500 to experience a memory operation, assuming selection of the word line comb that includes word line fingers 1238, 1242 and 1246 (all three of which depict a "+" to indicate that they are selected, while other word lines depict a "−" to indicate that they are not selected). Note that although FIG. 37 does not include the labels, the other vertically oriented select devices will also include an enhancement mode side with a higher threshold voltage and a depletion mode side with a lower threshold voltage. Thus, in the embodiment discussed above, each of a plurality of the select lines are positioned between and in communication with gate interfaces for two neighboring asymmetrical vertically oriented select devices, and applying a selection signal to the select lines only causes one of two neighboring asymmetrical vertically oriented select devices to turn on.

Figure 38B:
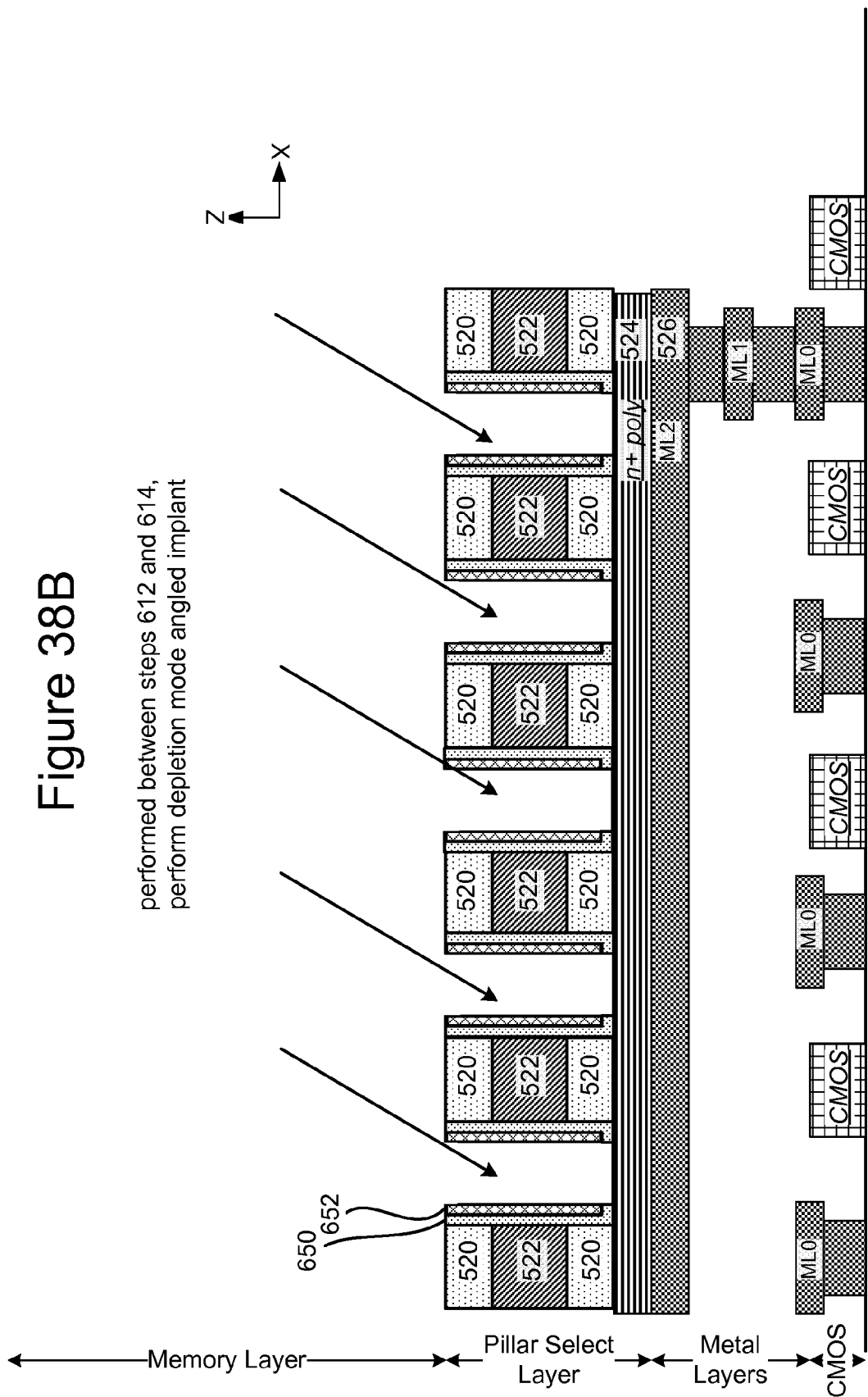
FIGS. 38A and B show two process steps used during fabrication of the asymmetrical vertically oriented select devices.

FIGS. 38A and 38B depict the steps of fabricating in order to accomplish the asymmetrical switch discussed above. FIG. 13, discussed above, provides a process for fabricating the structure of FIG. 10. To make the structure of FIG. 37, the step associated with FIG. 38A and the step associated with FIG. 38B are performed between steps 612 and 614 of the process of FIG. 13. Otherwise, the rest of the process of FIG. 13 is performed as discussed above. In the step associated with FIG. 38A, a high threshold voltage enhancement mode angled implant is performed at an angle toward the right side such that the left side of the stack comprising oxide 520, gate material 522 and oxide 520 receives the implant. In the step associated with FIG. 38B, a depletion mode angled implant angled towards the left will be performed such that the right side of the stack comprising oxide 520, gate material 522 and oxide 520 receives the implant. The process will then continue according to the flowchart of FIG. 13.

Figure 39:
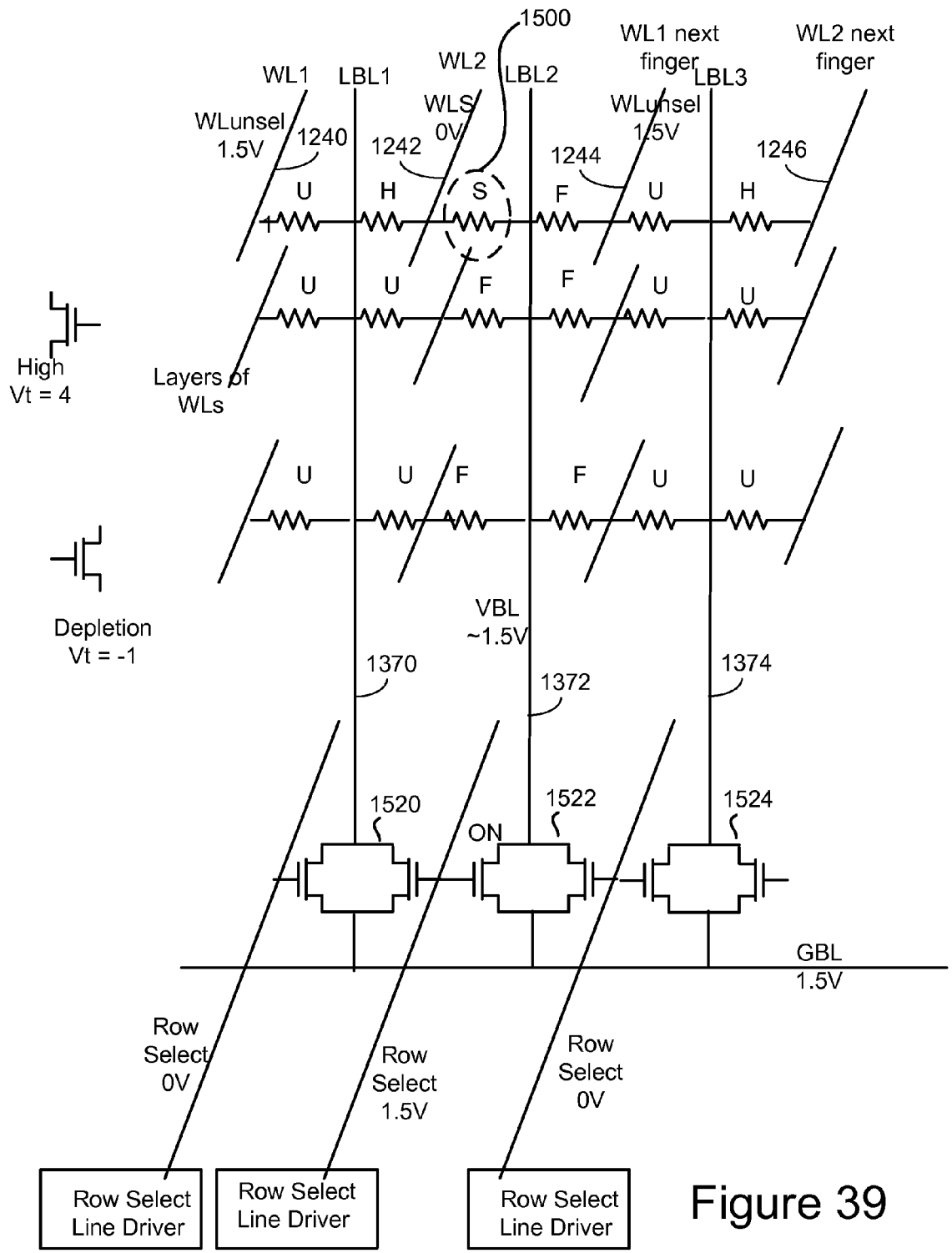
FIGS. 39-41 are schematics that provide examples of operation of the embodiment of FIG. 37.
Figure 40:
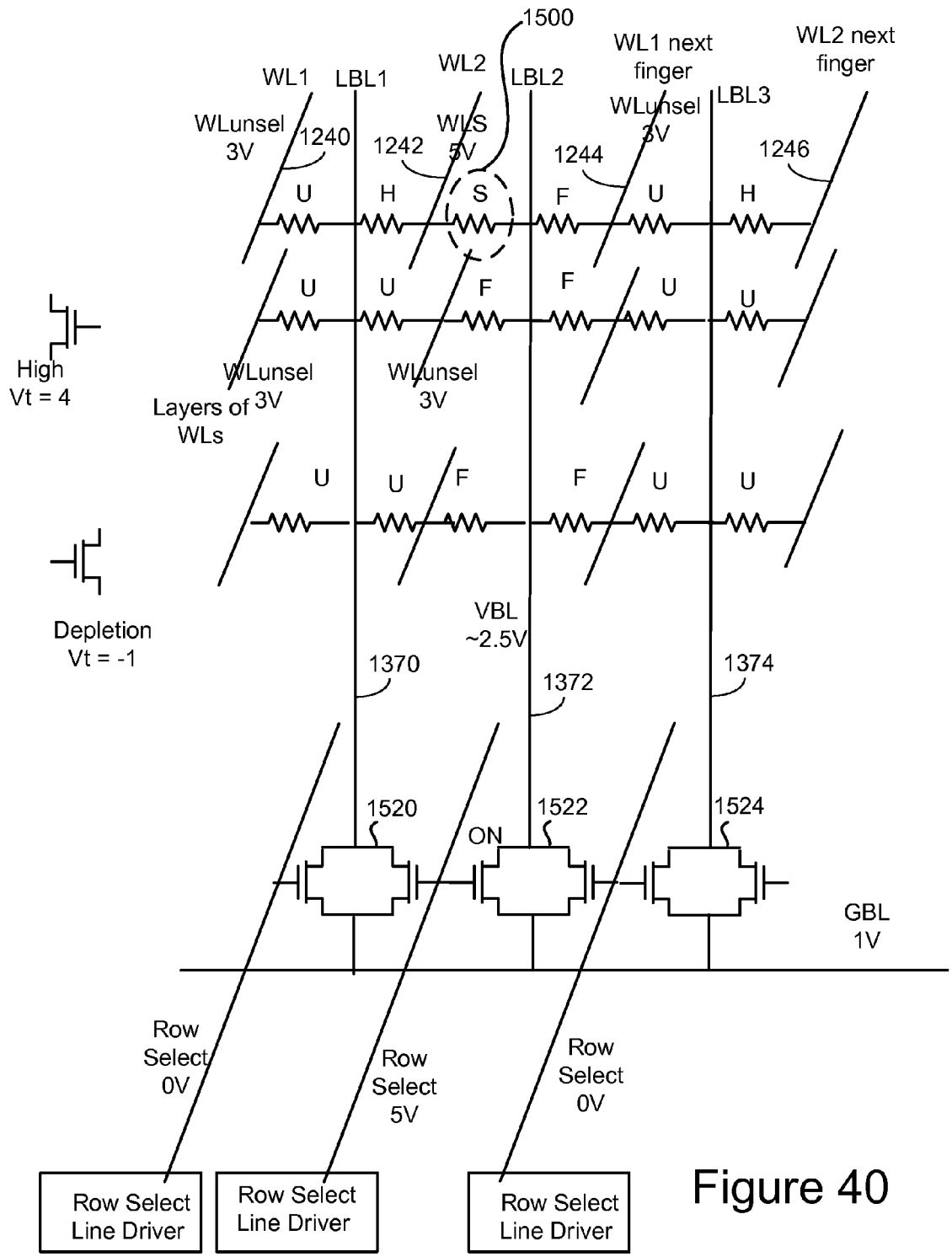
Figure 41:
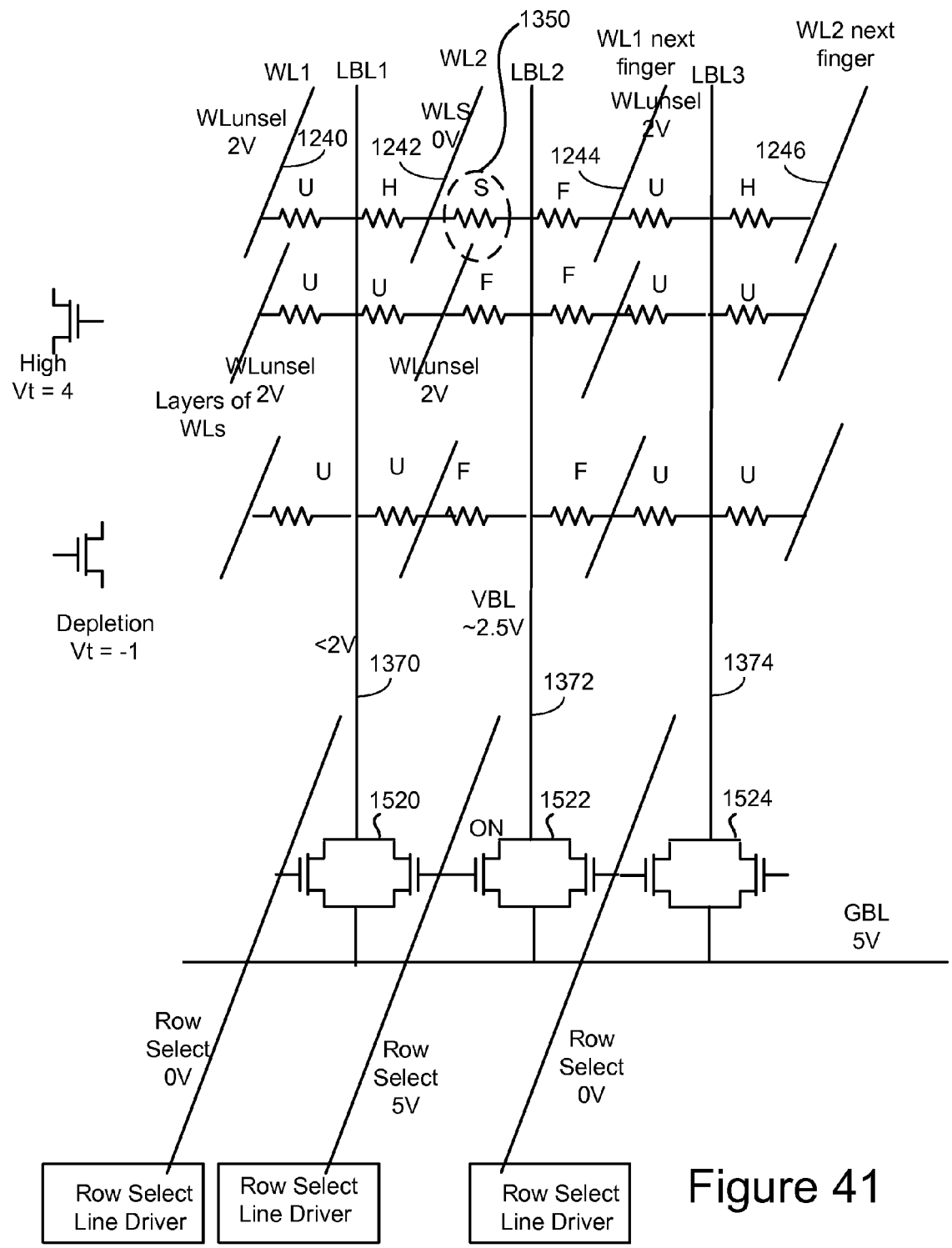

FIGS. 39, 40 and 41 provide examples of operating this structure of FIG. 37 to perform a read operation (FIG. 39), a set operation (FIG. 40) and a reset operation (FIG. 41). In the examples of FIGS. 39-41, the depletion mode side of the switch will have a threshold voltage of negative one volt and the enhancement mode side of the transistor will have a threshold voltage of four volts. In other embodiments, zero volts and three volts can be used as discussed above, as well as other threshold voltage values.

Looking at FIG. 39, the circuit shows three vertical bit lines (LBL1, LBL2, LBL3), which can correspond to bit lines 1370, 1372 and 1374 of FIG. 37. FIG. 39 also shows four word lines WL1, WL2, WL1 next finger, and WL2 next finger. In one embodiment, the word line WL1 corresponds to word line 1240 of FIG. 37 and word line WL2 corresponds to word line 1242. In one embodiment, word line WL1 is on one word line comb that is interleaved with a second word line comb that includes word line WL2. WL1 next finger 1244 is the next word line on the same word line comb as WL1. WL2 next finger 1246 is the next word line finger on the word line comb that includes WL2. FIG. 39 shows that there are multiple levels of word lines. In one embodiment, there are sixteen levels of word lines. FIG. 39 shows three vertically oriented select devices 1520, 1522 and 1524. Each vertically oriented select device is represented by two FET symbols, one side of the physical vertically oriented select is implanted to achieve a depletion mode threshold voltage and the other side is implanted to achieve enhanced mode threshold voltage.

In one embodiment, the global bit line can be biased at about 1.5 volts (or another value) rather than at ground. This will allow the unselected vertically oriented select devices (e.g. 1520 and 1524) to remain off. Biasing the global bit line at 1.5 volts rather than ground provides a suitable Vread relative to the selected word line (WLS), which in this case is WL2, biased at ground. Vread, in this case 1.5 volts, is also applied to unselected word lines. The global bit line will be used for current conveying sensing, for example, the current from the selected memory element is passed along the global bit line to sense amplifier circuits while the global bit line is held at approximately Vread by a clamp circuit. The row select line is at 1.5 volts for the selected row and 0 volts for unselected rows.

In other embodiments for example, where it is desirable to apply a lower voltage across the switching element during read, the selected word line voltage is raised above ground, generally the selected word line voltage is in the range of 0.2 volts to Vread less 0.2 volts. The global bit line voltage (Vread) could be higher or lower than 1.5 volts depending on the magnitude of the depletion mode threshold and other factors to ensure that unselected TFT devices do not conduct any significant leakage to the global bit line.

The selected memory element (S) 1500 is sensed. Memory element with an H are half selected in that one of either the word line or bit line is selected while the other control line is not. Memory elements with a U are unselected, as neither the associated bit line nor word line are selected.

FIG. 40 shows an example of performing a set operation (setting the memory element to a low resistant state). In this example, the global bit line (GBL) is biased at one volt, rather than ground. In such a case, VPP can be raised by one volt also. The row select line is at five volts for the selected row and zero volts for unselected rows. Only the depletion mode side of the selected vertically oriented select device (e.g. TFT 1522) is on. The selected word line is at five volts. The unselected word lines are at three volts. The difference in voltage for the word line is less than or equal to the programming threshold (two volts) for the memory element's reversible resistance switching material. Half selected memory elements H experience less than two volts due to the other memory elements (U) that are unselected on the unselected bit lines. Prior to the SET operation being performed, the bit lines are floating and will drift towards the unselected word line voltage of three volts. Some of the bit lines may not reach three volts due to memory elements already in the low resistance state (as described above). The selected vertical bit line is pulled down by the vertically oriented select device (e.g. TFT 1522) to about 2.5 volts or lower so that the selected memory element sees more than the programming threshold. In this manner, the selected memory element (S) 1500 will be set to the lower resistance state. Note that voltages can vary based on the reversible resistance switching material, IR drops and other circuit particulars.

FIG. 41 shows an example of the reset operation being performed on the structure of FIG. 37. The reset operation example reverses the polarity of the voltage across the selected memory element (S) 1500. The global bit line is now biased at five volts and the row select is five volts for the selected row and zero volts for the unselected row. Only the depletion mode side of the vertically oriented select device 1522 is on. The selected word line is at zero volts. The unselected word lines are at two volts. The difference in voltage for the word lines is less than or equal to the programming threshold (e.g. two volts) for the reversible resistance switching material. The half selected memory elements H see less than two volts drop due to the IR drop of the unselected memory elements (U) in series with the current path to the half selected memory elements H. The selected bit line is pulled up by vertically oriented select device 1522 to about 2.5 volts or higher so that the selected memory element (S) 1500 sees more than the programming threshold. In this manner, the selected memory element (S) 1500 is reprogrammed to the higher resistance state.

Dual Layer Select Lines

Figure 42:
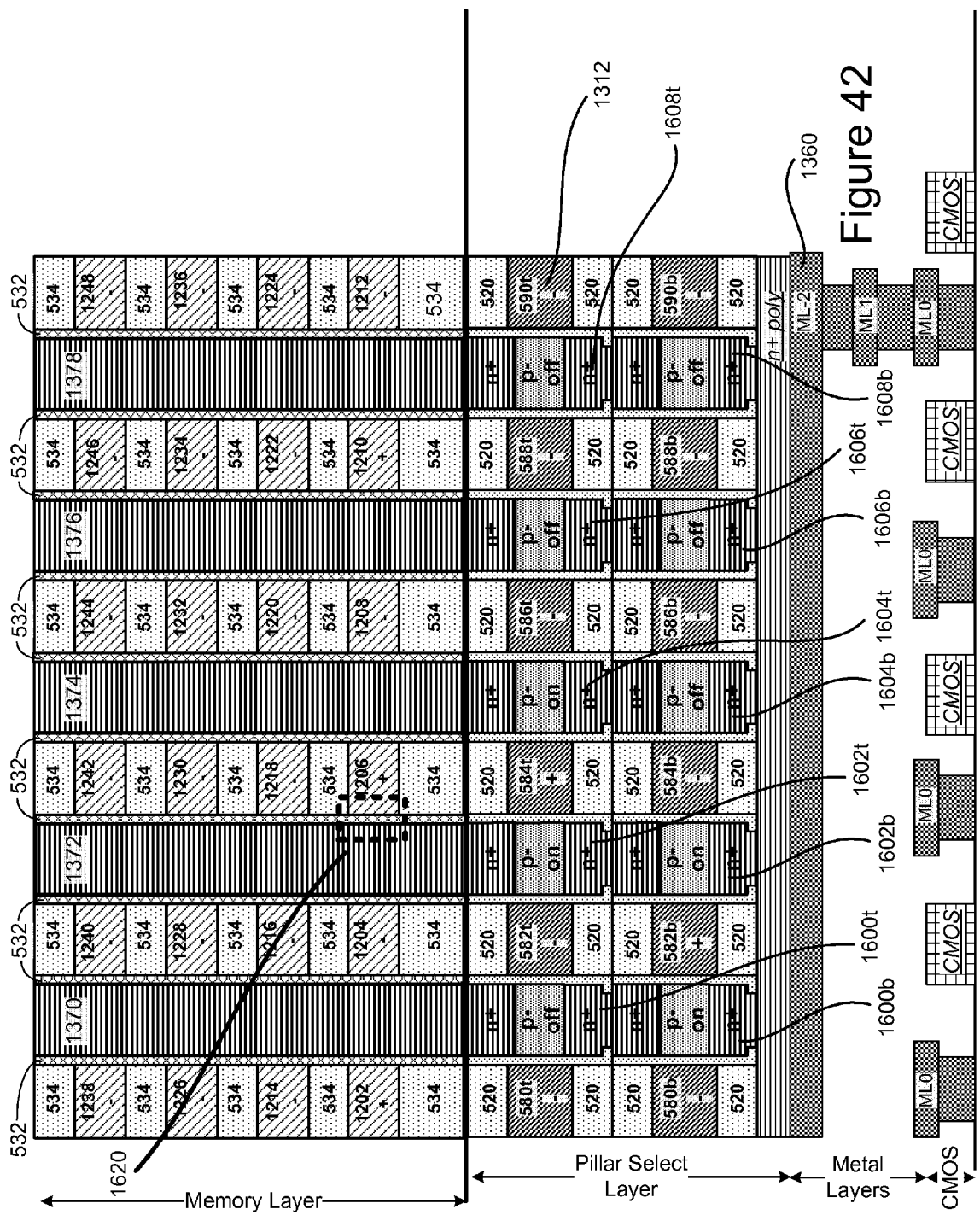
FIG. 42 depicts a cross section of a structure to implement another embodiment of a memory that includes two levels of row select lines and vertically oriented select devices.

FIG. 42 is a cross section of a structure of a memory providing another embodiment that allows for operation of the memory system and proper selection of memory elements where the word line comb structure (or other type of shape) is implemented. In the embodiment of FIG. 42 (which may include word line comb structures or other shapes), as opposed to the embodiment of FIG. 37, the vertically oriented select devices are symmetrical. Thus the oxide layers on each side are symmetrical. However, the embodiment of FIG. 42 includes two layers of vertically oriented select devices and two layers of row select lines. FIG. 42 shows a first layer of vertically oriented select devices including 1600b, 1602b, 1604b, 1606b and 1608b. A top and second layer of vertically oriented select devices includes 1600t, 1602t, 1604t, 1606t and 1608t. The bottom layer of row select lines includes 580b, 582b, 584b, 586b, 588*b*, and 590*b*. The top layer of row select lines includes 580*t*, 582*t*, 584*t*, 586*t*, 588*t*, and 590*t*.

Row select line 580*t* is formed on top of 580*b*. Row select line 582*t* is formed on top of row select line 580*b*. Row select line 584*t* is formed on top of row select line 584*b*. Row select line 586*t* is formed on top of row select line 586*b*. Row select line 588*t* is formed on top of row select line 588*b*. Row select line 590*t* is formed on top of row select line 590*b*.

Vertically oriented select device 1600*t* is formed on top of, connected to and in series with vertically oriented select device 1600*b*. Vertically oriented select device 1602*t* is formed on top of, connected to, and in series with vertically oriented select device 1602*b*. Vertically oriented select device 1604*t* is formed on top of, connected to and in series with vertically oriented select device 1604*b*. Vertically oriented select device 1606*t* is formed on top of, connected to, and in series with vertically oriented select device 1606*b*. Vertically oriented select device 1608*t* is formed on top of, connected to, and in series with vertically oriented select device 1608*b*.

In the embodiment of FIG. 42, in order for global bit line 1360 to be in communication with one of the local bit lines (1370, 1372, 1374, 1376 or 1378), both of the vertically oriented select devices underneath the appropriate local bit lines must be turned on. To turn on both switches (a top switch and a bottom switch), then a top row select line and a bottom row select line must be turned on. FIG. 42 shows row select line 584*t* as being selected ("+") by driving three volts and row select line 582*b* as being selected ("+") and driving three volts. Therefore, vertically oriented select device 1602*t* and vertically oriented select device 1602*b* will both turn on. Because row select line 584*t* is selected, vertically oriented select device 604*t* will also turn on. Because vertically oriented select device 604*b* is off, local bit line 1374 will not be selected and will not be in communication with global bit line 1360. Because row select line 582*b* is selected, vertically oriented select device 1600*b* will also turn on. Since vertically oriented select device 1600*t* is not turned on, local bit line 1370 will not be connected to or in communication with global bit line 1360. In this manner, only local bit line 1372 is selected. Memory element 1620 will undergo a memory operation. Therefore, in the structure of FIG. 42, a local bit line is selected by choosing a top row select line and a bottom row select line on opposite sides of the stack of two vertically oriented select devices. Each of the selected/activated row select lines are also connected to select devices adjacent to the intended target select device, for example, row select line 584*t* is also connected to select device 1604*t* which is adjacent to select device 1602*t*.

Figure 43:
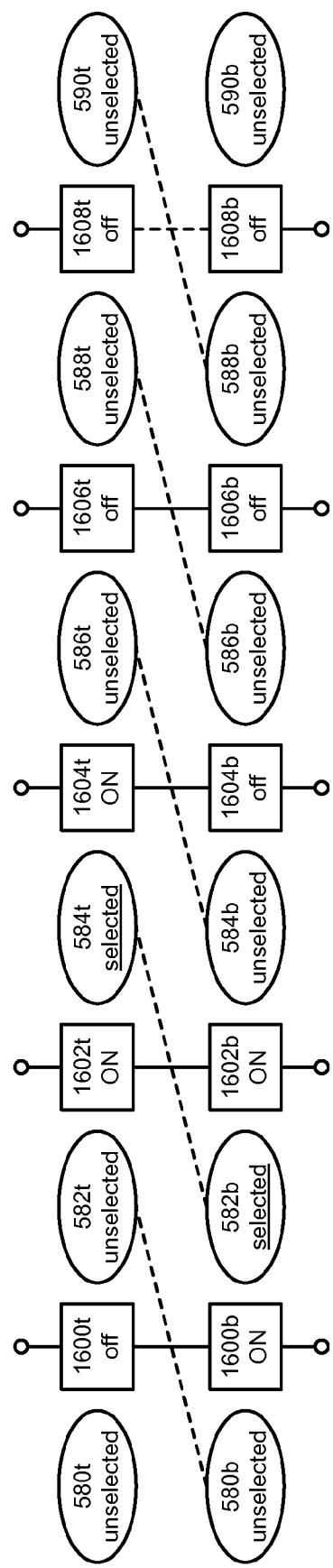
FIG. 43 is a block diagram depicting one example implementation of how to connect various row select lines.

FIG. 43 is a block diagram showing the two rows of row select lines and vertically oriented select devices from FIG. 42. In one embodiment, the structure of FIG. 42 will include double the amount of row select lines in the memory system. This may add a lot more signal lines which occupies valuable space. One proposal, as depicted in FIG. 43, is to connect two row select lines within the block of memory elements. In one embodiment, diagonal row select lines will be connected (e.g., wired) together. For example, FIG. 43 shows row select line 582*b* being wired to row select line 584*t*. FIG. 43 also shows row select line 580*b* being wired to row select line 582*t*, row select line 584*b* being wired to row select line 586*t*, row select line 586*b* being wired to row select line 588*t*, and row select line 588*b* being wired to row select line 590*t*. Other arrangements for wiring the two row select lines together can also be used.

Figure 44:
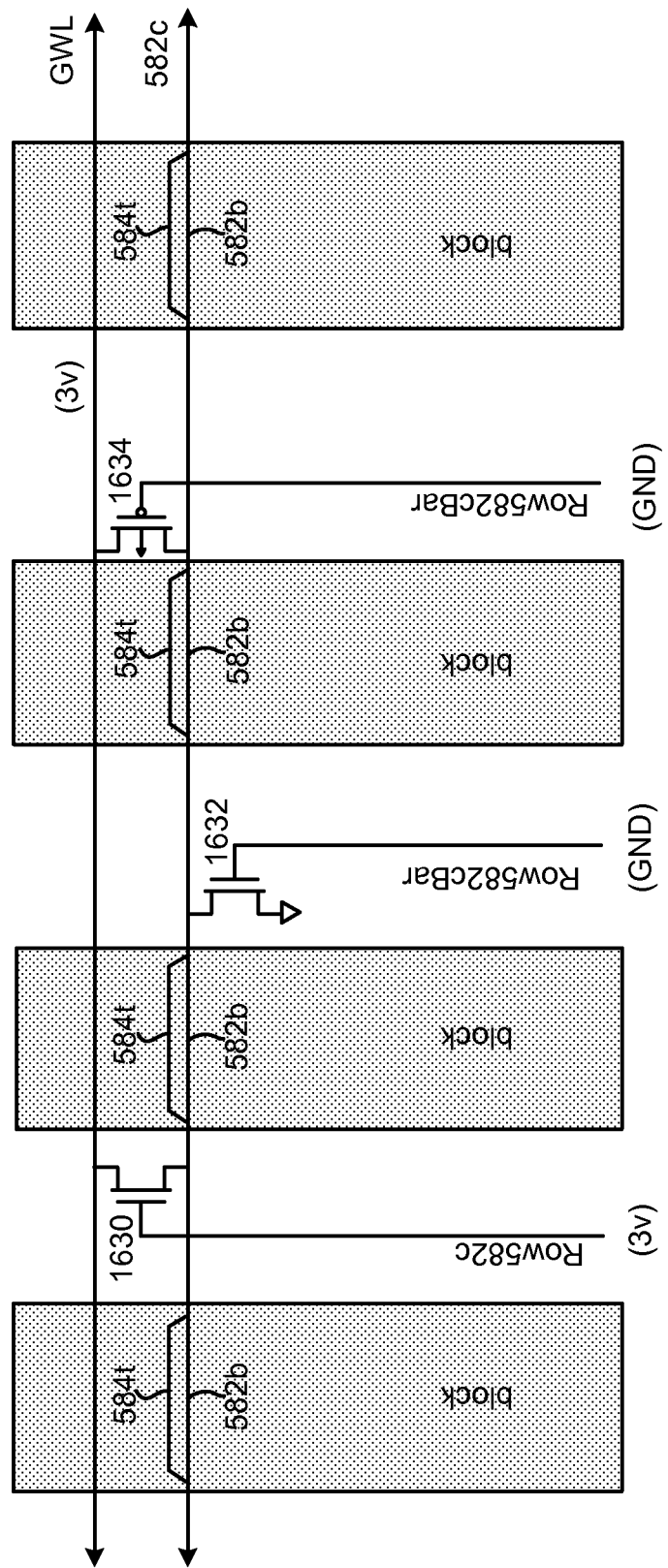
FIG. 44 is a block diagram depicting the distributed placement of the components of the row select line drivers when implementing the structure of FIG. 43.

FIG. 44 shows how a row select line driver is used to implement the embodiment of FIGS. 42 and 43. FIG. 44 shows four blocks of memory elements and a word line driver. The word line driver comprises nMOS transistor 1630, nMOS transistor 1632, and pMOS transistor 1634. The source of nMOS transistor 1630 and the source of pMOS transistor 1634 are connected to the global word line GWL. The drain of nMOS transistor 1630 and the drain of pMOS transistor 1634 are connected to select line 582*c*. The drain of nMOS transistor 1632 is also connected to select line 582*c* and the source of nMOS transistor 1632 is connected to ground. The gate of nMOS transistor 1630 is connected to the signal line Row582*c*. The gates of nMOS transistor 1632 and pMOS transistor 1634 are connected the signal line Row582*c*Bar. As Row582*c* is driving 3 v and Row582*c*Bar is at ground(GND), the composite select line 582C will be pulled to 3v via pMOS transistor 1634.

Between blocks (e.g. word line breaks) line 582*c* is one single row select line. Inside or underneath a block, signal line 582*c* splits into two (or more) signal lines, such as row select lines 582*b* and 584*t*. In this manner, row select line 582*b* is wired to row select line 584*t*. Other arrangements for wiring two select lines can also be made.

The above described technological features allow for a compact continuous mesh array of memory elements. For purposes of this document, a continuous mesh array is a memory array for which there are memory elements connected to both sides of the bit lines and memory elements connected to both sides of the word lines.

One embodiment includes a substrate; a monolithic three dimensional memory array of memory cells positioned above and not in the substrate; a plurality of word lines connected together and connected to a set of the memory cells; a word line driver in the substrate, below the set of the memory cells and in communication with all of the word lines connected together; a plurality of global bit lines; a plurality of vertically oriented bit lines connected to the array of memory cells; a plurality of vertically oriented select devices that are above, but not in the substrate, and that are connected to the vertically oriented bit lines and the global bit lines, when the vertically oriented select devices are actuated the vertically oriented bit lines are in communication with the global bit lines.

Some embodiments include the set of the memory cells are in a common block; the word line driver is positioned underneath the common block; the monolithic three dimensional memory array of memory cells includes memory cells on multiple levels; the word lines connected together are on a common plane and the set of memory cells are on a common level; the word lines connected together form a comb shape; the comb shape includes a spine, fingers on a first side and fingers on a second side; a first set of the word lines connected together are the fingers on the first side; a second set of the word lines connected together are the fingers on the second side; the first set of the word lines that are the fingers on the first side are connected to memory cells in a first block; the second set of the word lines that are the fingers on the second side are connected to memory cells in a second block, the first block is next to the second block; between two adjacent word lines of the first set of word lines are multiple vertically oriented bit lines; the word lines connected together form a first structure; the non-volatile storage system further comprises additional word lines connected together to form a second structure in a comb shape; word lines of the first structure are interleaved with word lines of the second structure; between word lines of the first structure and word lines of the second structure are memory cells connected to vertically oriented bit lines; the word line driver is a same size as an aggregate of the word lines connected together; the memory cells in combination with the vertically oriented bit lines and the word lines form a continuous mesh; a plurality of select lines connected to the vertically oriented select devices, the plurality of vertically oriented bit lines are above and not in the substrate, the plurality of vertically oriented select devices are above and not in the substrate.

One embodiment includes a substrate layer; a select layer positioned above and not in the substrate layer; a memory layer positioned above and not in the substrate layer, the memory layer includes: a monolithic three dimensional array of memory elements, a plurality of word lines connected together and connected to a set of the memory elements, and vertically oriented bit lines connected to the memory elements, the memory elements in combination with the vertically oriented bit lines and the word lines form a continuous mesh, the select layer includes select lines and vertically oriented select devices that are connected to the vertically oriented bit lines and the select lines; and a word line driver in the substrate layer, below the memory cells and in communication with all of the word lines connected together.

One embodiment includes applying a common signal to a plurality of word lines and floating vertically oriented bit lines so that the vertically oriented bit lines drift toward the common signal; applying one or more signals to global bit lines; turning on vertically oriented select devices to connect to selected vertically oriented bit lines to corresponding global bit lines; and applying a new signal to a selected set of the word lines that are connected together and connected to selected memory cells of a monolithic three dimensional array using a common word line driver.

One embodiment includes driving one or more signals on selected word lines connected together and to one common word line driver that is located in the substrate under an associated block, the selected word lines are connected to memory cells in the associated block; driving one or more signals on vertically oriented bit lines using bit line drivers that are vertical switches positioned above and not in the substrate; and floating unselected bit lines so that the unselected bit lines self bias and avoid disturbs.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

What is claimed is:

1. A memory device comprising:
   a three dimensional (3D) memory array comprising memory elements, each memory element having a first side terminal and a second side terminal;
   a plurality of connected together word lines extending horizontally in one of a plurality of horizontal planes of the 3D memory array and connecting to a common word line driver, each of the word lines connected to a respective first side terminal of corresponding ones of the memory elements, the connected together word lines of the one of said horizontal planes include at least three such connected together word lines;
   a plurality of vertically oriented bit lines configured to each extend vertically through the 3D memory array and to be interposed between a pair of word lines, each bit line coupled to the second side terminal of a corresponding memory element;
   bit line switching circuits each connected to a vertically oriented bit line and configured to float the respective bit line while the common word line driver applies a common voltage to the plurality of connected together word lines such that each floated bit line drifts toward the common voltage, the bit line switching circuits each being further configured to drive a selectable one or more of the first plurality of vertically oriented bit lines to an active state;
   a second plurality of connected together word lines extending horizontally in said one of the planes of the 3D memory array and connected to a second common word line driver that is located in the substrate under the 3D memory array, the second plurality of connected together word lines connecting to respective ones of the first side terminals of corresponding ones of the memory elements; and
   a second plurality of vertically oriented bit lines extending vertically through the 3D memory array so as to be interposed between pairs among the second plurality of connected together word lines, the second plurality of bit lines connecting to respective ones of the second side terminals of the corresponding ones of the memory elements to whose first side terminals said second plurality of connected together word lines connect.

2. The memory device of claim 1 wherein word lines of the second plurality of connected together word lines are interleaved between word lines of the first plurality of connected together word lines.

3. The memory device of claim 1 wherein each of the first and second pluralities of connected together word lines includes a respective comb shape having a spine connecting together at least a first set of word lines disposed on one side of the spine and the first sets of spine connected word lines of the respective comb shapes are interleaved one with the other.

4. The memory device of claim 1 wherein at least one of the first and second pluralities of connected together word lines includes a respective second set of word lines disposed on an opposed side of the spine and connected together by the spine.

5. The memory device of claim 1 wherein the common voltage is a level intermediate between a predetermined programming voltage and a ground voltage, the common voltage being insufficient to program a memory element having a bit line activating level coupled to an opposed other of its side terminals.

6. The memory device of claim 1 wherein the connected together word lines of the one of said horizontal planes are not inline with one another.

7. A memory device comprising:
   a three dimensional (3D) memory array comprising memory elements, each memory element having a first side terminal and a second side terminal;
   a plurality of connected together word lines extending horizontally in one of a plurality of horizontal planes of the 3D memory array and connecting to a common word line driver, each of the word lines connected to a respective first side terminal of corresponding ones of the memory elements, the connected together word lines of the one of said horizontal planes include at least three such connected together word lines;

a plurality of vertically oriented bit lines configured to each extend vertically through the 3D memory array and to be interposed between a pair of word lines, each bit line coupled to the second side terminal of a corresponding memory element;

bit line switching circuits each connected to a vertically oriented bit line and configured to float the respective bit line while the common word line driver applies a common voltage to the plurality of connected together word lines such that each floated bit line drifts toward the common voltage, the bit line switching circuits each being further configured to drive a selectable one or more of the first plurality of vertically oriented bit lines to an active state;

a second plurality of connected together word lines extending horizontally in another of said planes of the 3D memory array and connected to a second common word line driver that is located in the substrate under the 3D memory array, the second plurality of connected together word lines connecting to respective ones of the first side terminals of corresponding ones of the memory elements;

a third plurality of connected together word lines extending horizontally in the first said one of the planes of the 3D memory array and connected to a third common word line driver that is located in the substrate under the 3D memory array, the third plurality of connected together word lines connecting to respective ones of the first side terminals of corresponding ones of the memory elements; and a second plurality of vertically oriented bit lines extending vertically through the 3D memory array so as to be interposed between pairs among the third plurality of connected together word lines, the second plurality of bit lines connecting to respective ones of the second side terminals of the corresponding ones of the memory elements to whose first side terminals said third plurality of connected together word lines connect.

8. The memory device of claim 7 wherein the second plurality of vertically oriented bit lines extend vertically so as to be interposed between pairs among the second plurality of connected together word lines.

9. A data processing system comprising:
a controller;
a memory; and
a memory drive circuit operatively coupled to the memory;
wherein the memory drive circuit comprises a first common word line driver and first bit line switching circuits; and
wherein the memory comprises:
a three dimensional (3D) memory array having memory elements disposed to define plural horizontal planes stacked vertically one over a next, each memory element having a respective first side terminal on one side of the memory element and a second side terminal on a horizontally opposed second side of the memory element;
a first plurality of connected together word lines extending horizontally in at least one of the planes and connected to the first common word line driver, the first plurality of connected together word lines connecting to respective ones of the first side terminals of corresponding ones of the memory elements, the connected together word lines of the one of said horizontal planes not being inline with one another;

a first plurality of vertically oriented bit lines extending vertically through the 3D memory array so as to be interposed between pairs among the first plurality of connected together word lines, the first plurality of bit lines connecting to respective ones of the second side terminals of the corresponding ones of the memory elements to whose first side terminals said first plurality of connected together word lines connect;

wherein the first bit line switching circuits are respectively connected to respective ones of the first plurality of vertically oriented bit lines, the bit line switching circuits are configured to float their respective bit lines while the first common word line driver applies a common voltage to the first plurality of connected together word lines, whereby the floated bit lines that are interposed between pairs among the first plurality of connected together word lines drift to the common voltage, the bit line switching circuits being further configured to thereafter drive a selectable one or more of the first plurality of vertically oriented bit lines to an active state to thereby address a corresponding one or more of the memory elements to which the first plurality of connected together word lines connect, the memory drive circuit comprising:

a second common word line driver and second bit line switching circuits; and wherein the memory further comprises:

a second plurality of connected together word lines extending horizontally in said at least one of the planes and connected to the second common word line driver, the second plurality of connected together word lines connecting to respective ones of the first side terminals of corresponding ones of the memory elements; and a second plurality of vertically oriented bit lines extending vertically through the 3D memory array so as to be interposed between pairs among the second plurality of connected together word lines, the second plurality of bit lines connecting to respective ones of the second side terminals of the corresponding ones of the memory elements to whose first side terminals said second plurality of connected together word lines connect;

wherein the second bit line switching circuits are respectively connected to respective ones of the second plurality of vertically oriented bit lines, the second bit line switching circuits being configured to float their respective bit lines while the second common word line driver applies a common voltage to the second plurality of connected together word lines, whereby the floated bit lines that are interposed between pairs among the second plurality of connected together word lines drift to the common voltage, the second bit line switching circuits being further configured to thereafter drive a selectable one or more of the second plurality of vertically oriented bit lines to an active state to thereby address a corresponding one or more of the memory elements to which the second plurality of connected together word lines connect.

10. The data processing system of claim 9 wherein word lines of the second plurality of connected together word lines are interleaved between word lines of the first plurality of connected together word lines.

11. The data processing system of claim 10 wherein each of the first and second pluralities of connected together word lines includes a respective comb shape having a spine connecting together at least a first set of word lines disposed on one side of the spine and the first sets of spine connected word lines of the respective comb shapes are interleaved one with the other.

12. The memory device of claim 11 wherein at least one of the first and second pluralities of connected together word lines includes a respective second set of word lines disposed on an opposed side of the spine and connected together by the spine.

13. The data processing system of claim 9 wherein the common voltage is a level intermediate between a predetermined programming voltage and a ground voltage, the common voltage being insufficient to program a memory element having a bit line activating level coupled to an opposed other of its side terminals.

14. The data processing system of claim 9 wherein the connected together word lines of the one of said horizontal planes include at least three such connected together word lines not inline with one another.

* * * * *

UNITED STATES PATENT AND TRADEMARK OFFICE
CERTIFICATE OF CORRECTION

PATENT NO. : 9,646,688 B2  
APPLICATION NO. : 14/746003  
DATED : May 9, 2017  
INVENTOR(S) : Roy E. Scheuerlein Page 1 of 1

It is certified that error appears in the above-identified patent and that said Letters Patent is hereby corrected as shown below:

In the Claims

Column 50, Line 55 (Claim 6, Line 3) please change "inline with" to -- in line with --  
Column 51, Line 67 (Claim 9, Line 24) please change "inline with" to -- in line with --  
Column 53, Line 18 (Claim 14, Line 4) please change "inline with" to -- in line with --

Signed and Sealed this  
Seventeenth Day of October, 2017

Joseph Matal  
*Performing the Functions and Duties of the*  
*Under Secretary of Commerce for Intellectual Property and*  
*Director of the United States Patent and Trademark Office*